United States Patent
Kim et al.

(10) Patent No.: US 8,050,346 B2
(45) Date of Patent: Nov. 1, 2011

(54) OPTIMAL ENCODER AND ENCODING METHOD FOR DUAL STREAM SYSTEM

(75) Inventors: Sung-Hoon Kim, Daejon (KR); Jae-Young Lee, Seoul (KR); Seung-Won Kim, Fairfax, VA (US); Soo-In Lee, Daejon (KR); Chieteuk Ahn, Daejon (KR); Ho-Kyoung Lee, Gyeonngi-do (KR); Chang-Joong Kim, Seoul (KR)

(73) Assignee: Electronics and Telecommunications Research Institute, Daejon (KR)

( * ) Notice: Subject to any disclaimer, the term of this patent is extended or adjusted under 35 U.S.C. 154(b) by 538 days.

(21) Appl. No.: 11/996,085

(22) PCT Filed: Jul. 19, 2006

(86) PCT No.: PCT/KR2006/002831
§ 371 (c)(1),
(2), (4) Date: Mar. 12, 2009

(87) PCT Pub. No.: WO2007/011161
PCT Pub. Date: Jan. 25, 2007

(65) Prior Publication Data
US 2009/0220020 A1 Sep. 3, 2009

(30) Foreign Application Priority Data

Jul. 19, 2005 (KR) .................. 10-2005-0065396
Jun. 12, 2006 (KR) .................. 10-2006-0052548

(51) Int. Cl.
*H04L 5/12* (2006.01)
*H03M 13/03* (2006.01)

(52) U.S. Cl. ...................... 375/265; 714/792

(58) Field of Classification Search .......... 375/262, 375/265, 340–341; 714/792, 795–796
See application file for complete search history.

(56) References Cited

U.S. PATENT DOCUMENTS

| | | | |
|---|---|---|---|
| 4,755,706 A | 7/1988 | Harnden, Jr. et al. | |
| 5,844,945 A * | 12/1998 | Nam et al. ............. | 375/341 |
| 7,779,327 B2 * | 8/2010 | Lee et al. .............. | 714/755 |
| 2003/0106011 A1 * | 6/2003 | Miyauchi et al. ...... | 714/780 |

(Continued)

FOREIGN PATENT DOCUMENTS

JP 11-163742 A 6/1999
(Continued)

OTHER PUBLICATIONS

International Search Report mailed Oct. 30, 2006; PCT/KR2006/002831.

*Primary Examiner* — Khanh C Tran
(74) *Attorney, Agent, or Firm* — Ladas & Parry LLP

(57) ABSTRACT

Provided are a method of estimating an encoder for dual stream transmission, and an encoder using the same. The method includes the steps of: a) setting up the number of memories required for an encoder, a free distance condition for robust data, and a free distance condition for mixed stream of robust data and normal data; b) obtaining ½ rate encoder combinations that sustain backward compatibility with a typical trellis encoder; c) obtaining encoder combinations H that satisfy the free distance condition for the robust data and the free distance condition for the mixed stream from the ½ rate encoder combinations; d) obtaining relations between memories and input/output signals, which satisfy the encoder combinations H; and e) configuring an encoder according to the obtained relation between the memories and the input/output signals.

15 Claims, 4 Drawing Sheets

U.S. PATENT DOCUMENTS

2004/0199858 A1    10/2004    Becker et al.

FOREIGN PATENT DOCUMENTS

| | | |
|---|---|---|
| KR | 1020030026236 | 3/2003 |
| KR | 1020040055548 | 6/2004 |
| KR | 1020040063779 | 7/2004 |
| KR | 1020050049923 | 5/2005 |
| KR | 1020050097435 | 10/2005 |
| WO | 03/081786 A1 | 10/2003 |

* cited by examiner

FIG. 3
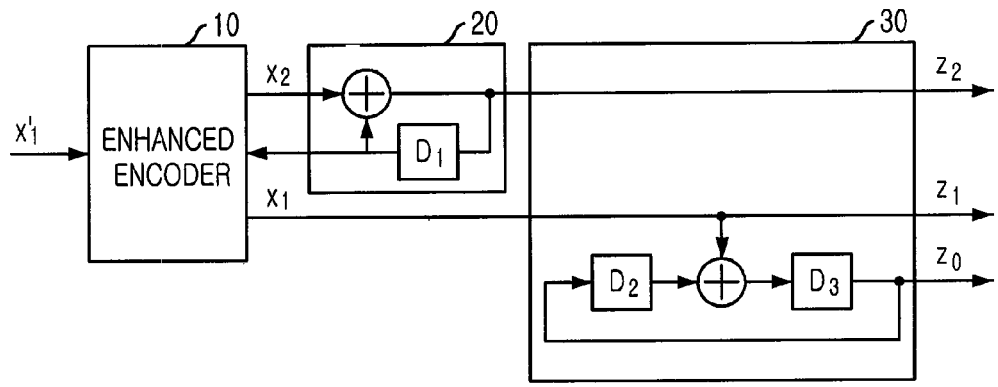
FIG. 4
| | in | $st_4$ | $st_3$ | $st_2$ | $st_1$ |
|---|---|---|---|---|---|
| $h_6 =$ | 0 | 0 | 1 | 0 | 0 |
| | in | $st_4$ | $st_3$ | $st_2$ | $st_1$ |
|---|---|---|---|---|---|
| $h_5 =$ | 1 | 1 | 1 | 0 | 0 |
| | in | $st_4$ | $st_3$ | $st_2$ | $st_1$ |
|---|---|---|---|---|---|
| $h_2 =$ | 1 | 0 | 0 | 0 | 0 |
| | in | $st_4$ | $st_3$ | $st_2$ | $st_1$ |
|---|---|---|---|---|---|
| $h_1 =$ | 0 | 0 | 1 | 0 | 0 |
$h_i$ ARE ALL OCTAL NUMBERS AND EACH OF hi DENOTES CONNECTING RELATION AS FOLLOWS
$st_4 = 0 \text{ in} = 0 \ st_4 + 1 \ st_3 + 0 \ st_2 + 0 \ st_1$
$st_3 = 1 \text{ in} = 1 \ st_4 + 1 \ st_3 + 0 \ st_2 + 0 \ st_1$
$ot_2 = 1 \text{ in} = 0 \ st_4 + 0 \ st_3 + 0 \ st_2 + 0 \ st_1$
$ot_1 = 0 \text{ in} = 0 \ st_4 + 1 \ st_3 + 0 \ st_2 + 0 \ st_1$
FIG. 5
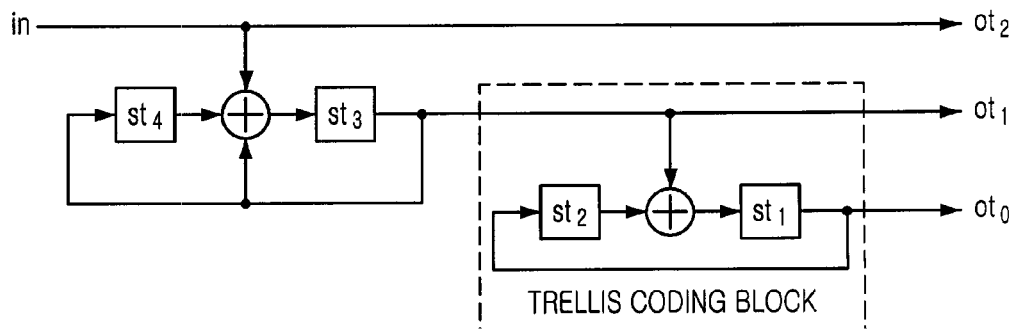

OPTIMAL ENCODER AND ENCODING METHOD FOR DUAL STREAM SYSTEM

TECHNICAL FIELD

The present invention relates to a trellis coded modulation (TCM); and more particularly, to a TCM encoder estimating method for transmitting dual stream and an optimal encoder using the same.

BACKGROUND ART

Trellis coded modulation (TCM) is a modulation scheme designed through combining an encoding scheme and a modulation scheme, which improves transmission efficiency while minimizing the loss of a frequency width. Dual stream transmission scheme is a transmission scheme for improving transmission efficiency while sustaining backward compatibility with a conventional encoding scheme. That is, the dual stream transmission scheme transmit data stream by interposing a stream encoded by a code having a superior code gain compared to a conventional coding scheme.

Although a TCM encoder using a single stream was introduced, a TCM encoder for dual stream is not developed yet.

DISCLOSURE

Technical Problem

It is, therefore, an object of the present invention to provide a method for estimating an optimal ½ rate encoder and an optimal ¼ rate encoder for a dual stream transmission scheme that is introduced to improve a performance for a standard 8-VSB, and an encoder using the same.

Technical Solution

In accordance with one aspect of the present invention, there is provided a method of estimating an encoder for dual stream transmission, including the steps of: a) setting up the number of memories required for an encoder, a free distance condition for robust data, and a free distance condition for mixed stream of robust data and normal data; b) obtaining ½ rate encoder combinations that sustain backward compatibility with a conventional trellis encoder; c) obtaining encoder combinations H that satisfy the free distance condition for the robust data and the free distance condition for the mixed stream from the ½ rate encoder combinations; d) obtaining relations between memories and input/output signals, which satisfy the encoder combinations H; and e) configuring an encoder according to the obtained relation between the memories and the input/output signals.

In accordance with another aspect of the present invention, there is provided an encoder for dual stream transmission including: an input terminal; three output terminals; and four memories connected to the input terminal and the output terminals to satisfy an equation:

$$\begin{bmatrix} st_4 \\ st_3 \\ st_2 \\ st_1 \\ ot_2 \\ ot_1 \\ ot_0 \end{bmatrix} = \begin{bmatrix} h_6^{(4)} & h_6^{(3)} & h_6^{(2)} & h_6^{(1)} & h_6^{(0)} \\ h_5^{(4)} & h_5^{(3)} & h_5^{(2)} & h_5^{(1)} & h_5^{(0)} \\ h_4^{(4)} & h_4^{(3)} & h_4^{(2)} & h_4^{(1)} & h_4^{(0)} \\ h_3^{(4)} & h_3^{(3)} & h_3^{(2)} & h_3^{(1)} & h_3^{(0)} \\ h_2^{(4)} & h_2^{(3)} & h_2^{(2)} & h_2^{(1)} & h_2^{(0)} \\ h_1^{(4)} & h_1^{(3)} & h_1^{(2)} & h_1^{(1)} & h_1^{(0)} \\ h_0^{(4)} & h_0^{(3)} & h_0^{(2)} & h_0^{(1)} & h_0^{(0)} \end{bmatrix} \begin{bmatrix} in \\ st_4 \\ st_3 \\ st_2 \\ st_1 \end{bmatrix}$$

where $st_4$, $st_3$, $st_2$, and $st_1$ denote states of memories, $ot_2$, $ot_1$ and $ot_0$ denote outputs of an encoder, in denotes an input of encoder, and $h_j$ is an octal number.

Advantageous Effects

The method for estimating an encoder for dual stream transmission and an encoder using the same according to the present invention reduce a signal-to-noise ratio (SNR) that satisfies a threshold of visibility (TOV) by improving the receiving performance for normal data as well as robust stream.

DESCRIPTION OF DRAWINGS

The above and other objects and features of the present invention will become apparent from the following description of the preferred embodiments given in conjunction with the accompanying drawings, in which:

FIG. 3 is a block diagram showing an encoder having an enhanced encoding unit;

FIGS. 4 and 5 are views for estimating an encoding structure from encoder combinations H in Table 1;

BEST MODE FOR THE INVENTION

Other objects and aspects of the invention will become apparent from the following description of the embodiments with reference to the accompanying drawings, which is set forth hereinafter.

Figure 1:
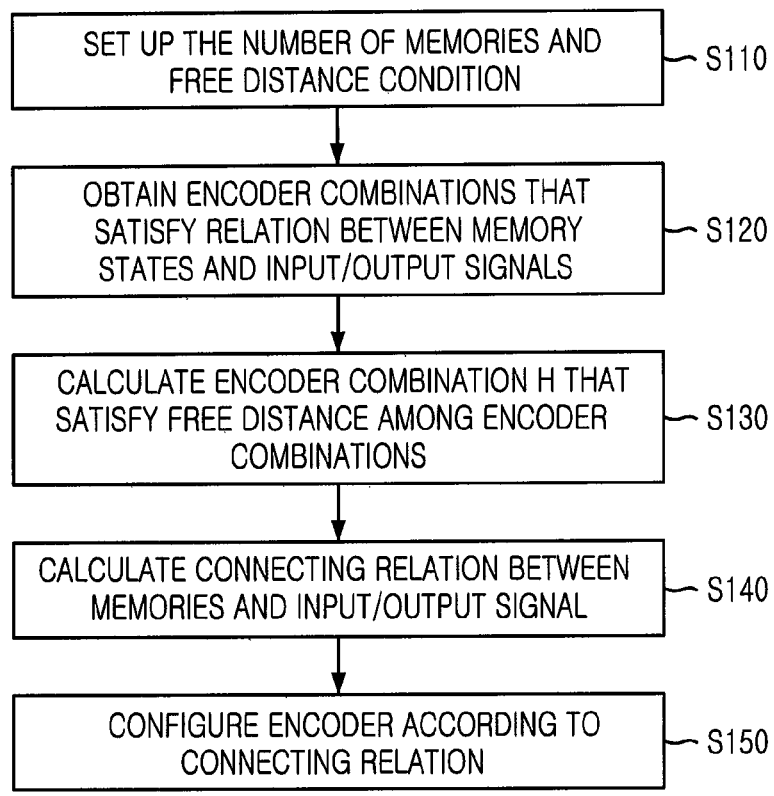
FIG. 1 is a flowchart of a method for estimating a TCM encoder in accordance with the present invention.

FIG. 1 is a flowchart of a TCM encoder estimating method in accordance with the present invention. Herein, encoder estimation is a process for obtaining a relational equation between memories and input/output signals to satisfy a predetermined condition and configuring an encoder to satisfy the obtained relational equation in order to design a TCM encoder for dual stream transmission.

Referring to FIG. 1, in order to estimate an encoder, a free distance condition for robust stream or robust data and a free distance condition for mixed stream composed of normal stream or normal data and robust stream or robust data are set-up at step S100. In the present embodiment, an encoder is configured to have 16 states of a lattice diagram for decoding by including four memories.

At step S120, it obtains a ½ rate encoder combination h that satisfies Eq. 1 and sustains backward compatibility with a conventional encoder. In Eq. 1, $st_4$, $st_3$, $st_2$, and $st_1$ denote the states of the memories, $ot_2$, $ot_1$, and $ot_0$ denote the outputs of the encoder, and the input of the encoder is in.

$$\begin{bmatrix} st_4 \\ st_3 \\ st_2 \\ st_1 \\ ot_2 \\ ot_1 \\ ot_0 \end{bmatrix} = \begin{bmatrix} h_6^{(4)} & h_6^{(3)} & h_6^{(2)} & h_6^{(1)} & h_6^{(0)} \\ h_5^{(4)} & h_5^{(3)} & h_5^{(2)} & h_5^{(1)} & h_5^{(0)} \\ h_4^{(4)} & h_4^{(3)} & h_4^{(2)} & h_4^{(1)} & h_4^{(0)} \\ h_3^{(4)} & h_3^{(3)} & h_3^{(2)} & h_3^{(1)} & h_3^{(0)} \\ h_2^{(4)} & h_2^{(3)} & h_2^{(2)} & h_2^{(1)} & h_2^{(0)} \\ h_1^{(4)} & h_1^{(3)} & h_1^{(2)} & h_1^{(1)} & h_1^{(0)} \\ h_0^{(4)} & h_0^{(3)} & h_0^{(2)} & h_0^{(1)} & h_0^{(0)} \end{bmatrix} \begin{bmatrix} in \\ st_4 \\ st_3 \\ st_2 \\ st_1 \end{bmatrix} \quad \text{Eq. 1}$$

Figure 2:
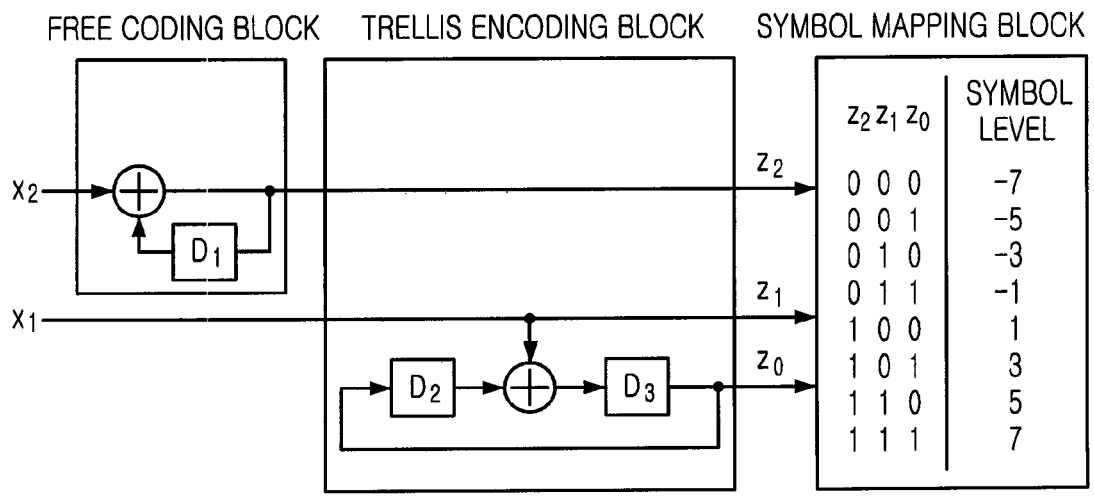
FIG. 2 shows a typical trellis encoder.

Herein, the conventional encoder is a typical trellis encoder shown in FIG. 2. In order to sustain the backward compatibility with the encoder shown in FIG. 2, the encoder according to the present embodiment includes an enhanced encoder 10 disposed front of a free coding block 20 and a trellis encoding block as shown in FIG. 3 with a free coding block and a trellis encoding block shown in FIG. 2 fixed. An encoder in '½ rate encoder' or 'encoding combinations' denotes the enhanced coder 10.

In Eq. 1, all of the operations are a modulo 2 operation, simply, $$h_i = \sum_j h_j^{(j)} 2^j.$$

When $h_j$ is expressed as octal numbers, $h_j$ must be fixed as $h_4=1$, $h_3=6$, and $h_0=1$ in order to sustain the backward compatibility with the conventional encoder. Therefore, a ½ rate encoder that sustains the backward compatibility with the conventional encoder is estimated using $h=[h_6, h_5, h_2, h_0]$ with $h_4$, $h_3$, and $h_1$ cancelled. Herein, the ½ rate encoder means that one symbol transmits one bit data.

After calculating the encoder combinations h at step S120, it obtains encoder combinations H that satisfy a free distance condition for robust data and another free distance condition for mixed stream of robust data and normal data from the encoder combinations h. In the present embodiment, the free distance condition R for the robust stream is setup as 164 and 168, and the free distance condition R+N for the mixed stream of the normal steam and the robust stream is setup as a below Table 1.

Table 1 shows 2688 optimal ½ rate encoders H, where R denotes a free distance for a robust stream and R+N denotes a free distance for a robust stream and a normal stream.

TABLE 1

| h = [2 20 24 15] | R: 164 | R + N: 44 |
|---|---|---|
| h = [2 20 27 14] | R: 164 | R + N: 44 |
| h = [2 20 31 4] | R: 164 | R + N: 44 |
| h = [2 20 31 15] | R: 164 | R + N: 44 |
| h = [2 20 33 5] | R: 164 | R + N: 44 |
| h = [2 20 33 14] | R: 164 | R + N: 44 |
| h = [2 20 35 4] | R: 164 | R + N: 44 |
| h = [2 20 36 5] | R: 164 | R + N: 44 |
| h = [2 21 25 15] | R: 164 | R + N: 44 |
| h = [2 21 26 14] | R: 164 | R + N: 44 |
| h = [2 21 30 4] | R: 164 | R + N: 44 |
| h = [2 21 30 15] | R: 164 | R + N: 44 |

TABLE 1-continued

| h = [2 21 32 5] | R: 164 | R + N: 44 |
|---|---|---|
| h = [2 21 32 14] | R: 164 | R + N: 44 |
| h = [2 21 34 4] | R: 164 | R + N: 44 |
| h = [2 21 37 5] | R: 164 | R + N: 44 |
| h = [2 22 25 14] | R: 164 | R + N: 44 |
| h = [2 22 26 15] | R: 164 | R + N: 44 |
| h = [2 22 31 5] | R: 164 | R + N: 44 |
| h = [2 22 31 14] | R: 164 | R + N: 44 |
| h = [2 22 33 4] | R: 164 | R + N: 44 |
| h = [2 22 33 15] | R: 164 | R + N: 44 |
| h = [2 22 34 5] | R: 164 | R + N: 44 |
| h = [2 22 37 4] | R: 164 | R + N: 44 |
| h = [2 23 24 14] | R: 164 | R + N: 44 |
| h = [2 23 27 15] | R: 164 | R + N: 44 |
| h = [2 23 30 5] | R: 164 | R + N: 44 |
| h = [2 23 30 14] | R: 164 | R + N: 44 |
| h = [2 23 32 4] | R: 164 | R + N: 44 |
| h = [2 23 32 15] | R: 164 | R + N: 44 |
| h = [2 23 35 5] | R: 164 | R + N: 44 |
| h = [2 23 36 4] | R: 164 | R + N: 44 |
| h = [2 24 20 15] | R: 164 | R + N: 44 |
| h = [2 24 23 14] | R: 164 | R + N: 44 |
| h = [2 24 31 4] | R: 164 | R + N: 44 |
| h = [2 24 32 5] | R: 164 | R + N: 44 |
| h = [2 24 35 4] | R: 164 | R + N: 44 |
| h = [2 24 35 15] | R: 164 | R + N: 44 |
| h = [2 24 37 5] | R: 164 | R + N: 44 |
| h = [2 24 37 14] | R: 164 | R + N: 44 |
| h = [2 25 21 15] | R: 164 | R + N: 44 |
| h = [2 25 22 14] | R: 164 | R + N: 44 |
| h = [2 25 30 4] | R: 164 | R + N: 44 |
| h = [2 25 33 5] | R: 164 | R + N: 44 |
| h = [2 25 34 4] | R: 164 | R + N: 44 |
| h = [2 25 34 15] | R: 164 | R + N: 44 |
| h = [2 25 36 5] | R: 164 | R + N: 44 |
| h = [2 25 36 14] | R: 164 | R + N: 44 |
| h = [2 26 21 14] | R: 164 | R + N: 44 |
| h = [2 26 22 15] | R: 164 | R + N: 44 |
| h = [2 26 30 5] | R: 164 | R + N: 44 |
| h = [2 26 33 4] | R: 164 | R + N: 44 |
| h = [2 26 35 5] | R: 164 | R + N: 44 |
| h = [2 26 35 14] | R: 164 | R + N: 44 |
| h = [2 26 37 4] | R: 164 | R + N: 44 |
| h = [2 26 37 15] | R: 164 | R + N: 44 |
| h = [2 27 20 14] | R: 164 | R + N: 44 |
| h = [2 27 23 15] | R: 164 | R + N: 44 |
| h = [2 27 31 5] | R: 164 | R + N: 44 |
| h = [2 27 32 4] | R: 164 | R + N: 44 |
| h = [2 27 34 5] | R: 164 | R + N: 44 |
| h = [2 27 34 14] | R: 164 | R + N: 44 |
| h = [2 27 36 4] | R: 164 | R + N: 44 |
| h = [2 27 36 15] | R: 164 | R + N: 44 |
| h = [2 30 21 4] | R: 164 | R + N: 44 |
| h = [2 30 21 15] | R: 164 | R + N: 44 |
| h = [2 30 23 5] | R: 164 | R + N: 44 |
| h = [2 30 23 14] | R: 164 | R + N: 44 |
| h = [2 30 25 4] | R: 164 | R + N: 44 |
| h = [2 30 26 5] | R: 164 | R + N: 44 |
| h = [2 30 34 15] | R: 164 | R + N: 44 |
| h = [2 30 37 14] | R: 164 | R + N: 44 |
| h = [2 31 20 4] | R: 164 | R + N: 44 |
| h = [2 31 20 15] | R: 164 | R + N: 44 |
| h = [2 31 22 5] | R: 164 | R + N: 44 |
| h = [2 31 22 14] | R: 164 | R + N: 44 |
| h = [2 31 24 4] | R: 164 | R + N: 44 |
| h = [2 31 27 5] | R: 164 | R + N: 44 |
| h = [2 31 35 15] | R: 164 | R + N: 44 |
| h = [2 31 36 14] | R: 164 | R + N: 44 |
| h = [2 32 21 5] | R: 164 | R + N: 44 |
| h = [2 32 21 14] | R: 164 | R + N: 44 |
| h = [2 32 23 4] | R: 164 | R + N: 44 |
| h = [2 32 23 15] | R: 164 | R + N: 44 |
| h = [2 32 24 5] | R: 164 | R + N: 44 |
| h = [2 32 27 4] | R: 164 | R + N: 44 |
| h = [2 32 35 14] | R: 164 | R + N: 44 |
| h = [2 32 36 15] | R: 164 | R + N: 44 |
| h = [2 33 20 5] | R: 164 | R + N: 44 |
| h = [2 33 20 14] | R: 164 | R + N: 44 |
| h = [2 33 22 4] | R: 164 | R + N: 44 |
| h = [2 33 22 15] | R: 164 | R + N: 44 |

TABLE 1-continued

| h | R | R + N |
|---|---|---|
| h = [2 33 25 5] | R: 164 | R + N: 44 |
| h = [2 33 26 4] | R: 164 | R + N: 44 |
| h = [2 33 34 14] | R: 164 | R + N: 44 |
| h = [2 33 37 15] | R: 164 | R + N: 44 |
| h = [2 34 21 4] | R: 164 | R + N: 44 |
| h = [2 34 22 5] | R: 164 | R + N: 44 |
| h = [2 34 25 4] | R: 164 | R + N: 44 |
| h = [2 34 25 15] | R: 164 | R + N: 44 |
| h = [2 34 27 5] | R: 164 | R + N: 44 |
| h = [2 34 27 14] | R: 164 | R + N: 44 |
| h = [2 34 30 15] | R: 164 | R + N: 44 |
| h = [2 34 33 14] | R: 164 | R + N: 44 |
| h = [2 35 20 4] | R: 164 | R + N: 44 |
| h = [2 35 23 5] | R: 164 | R + N: 44 |
| h = [2 35 24 4] | R: 164 | R + N: 44 |
| h = [2 35 24 15] | R: 164 | R + N: 44 |
| h = [2 35 26 5] | R: 164 | R + N: 44 |
| h = [2 35 26 14] | R: 164 | R + N: 44 |
| h = [2 35 31 15] | R: 164 | R + N: 44 |
| h = [2 35 32 14] | R: 164 | R + N: 44 |
| h = [2 36 20 5] | R: 164 | R + N: 44 |
| h = [2 36 23 4] | R: 164 | R + N: 44 |
| h = [2 36 25 5] | R: 164 | R + N: 44 |
| h = [2 36 25 14] | R: 164 | R + N: 44 |
| h = [2 36 27 4] | R: 164 | R + N: 44 |
| h = [2 36 27 15] | R: 164 | R + N: 44 |
| h = [2 36 31 14] | R: 164 | R + N: 44 |
| h = [2 36 32 15] | R: 164 | R + N: 44 |
| h = [2 37 21 5] | R: 164 | R + N: 44 |
| h = [2 37 22 4] | R: 164 | R + N: 44 |
| h = [2 37 24 5] | R: 164 | R + N: 44 |
| h = [2 37 24 14] | R: 164 | R + N: 44 |
| h = [2 37 26 4] | R: 164 | R + N: 44 |
| h = [2 37 26 15] | R: 164 | R + N: 44 |
| h = [2 37 30 14] | R: 164 | R + N: 44 |
| h = [2 37 33 15] | R: 164 | R + N: 44 |
| h = [3 20 24 17] | R: 164 | R + N: 56 |
| h = [3 20 26 16] | R: 168 | R + N: 48 |
| h = [3 20 27 16] | R: 164 | R + N: 48 |
| h = [3 20 27 17] | R: 168 | R + N: 56 |
| h = [3 20 30 7] | R: 164 | R + N: 56 |
| h = [3 20 30 16] | R: 168 | R + N: 48 |
| h = [3 20 30 17] | R: 168 | R + N: 56 |
| h = [3 20 31 16] | R: 164 | R + N: 48 |
| h = [3 20 32 6] | R: 164 | R + N: 48 |
| h = [3 20 33 6] | R: 168 | R + N: 48 |
| h = [3 20 33 7] | R: 168 | R + N: 56 |
| h = [3 20 33 17] | R: 164 | R + N: 56 |
| h = [3 20 34 6] | R: 164 | R + N: 48 |
| h = [3 20 34 7] | R: 168 | R + N: 56 |
| h = [3 20 35 6] | R: 168 | R + N: 48 |
| h = [3 20 37 7] | R: 164 | R + N: 56 |
| h = [3 21 25 17] | R: 164 | R + N: 56 |
| h = [3 21 26 16] | R: 164 | R + N: 48 |
| h = [3 21 26 17] | R: 168 | R + N: 56 |
| h = [3 21 27 16] | R: 168 | R + N: 48 |
| h = [3 21 30 16] | R: 164 | R + N: 48 |
| h = [3 21 31 7] | R: 164 | R + N: 56 |
| h = [3 21 31 16] | R: 168 | R + N: 48 |
| h = [3 21 31 17] | R: 168 | R + N: 56 |
| h = [3 21 32 6] | R: 168 | R + N: 48 |
| h = [3 21 32 7] | R: 168 | R + N: 56 |
| h = [3 21 32 17] | R: 164 | R + N: 56 |
| h = [3 21 33 6] | R: 164 | R + N: 48 |
| h = [3 21 34 6] | R: 168 | R + N: 48 |
| h = [3 21 35 6] | R: 164 | R + N: 48 |
| h = [3 21 35 7] | R: 168 | R + N: 56 |
| h = [3 21 36 7] | R: 164 | R + N: 56 |
| h = [3 22 24 16] | R: 168 | R + N: 48 |
| h = [3 22 25 16] | R: 164 | R + N: 48 |
| h = [3 22 25 17] | R: 168 | R + N: 56 |
| h = [3 22 26 17] | R: 164 | R + N: 56 |
| h = [3 22 30 6] | R: 164 | R + N: 48 |
| h = [3 22 31 6] | R: 168 | R + N: 48 |
| h = [3 22 31 7] | R: 168 | R + N: 56 |
| h = [3 22 31 17] | R: 164 | R + N: 56 |
| h = [3 22 32 7] | R: 164 | R + N: 56 |
| h = [3 22 32 16] | R: 168 | R + N: 48 |
| h = [3 22 32 17] | R: 168 | R + N: 56 |
| h = [3 22 33 16] | R: 164 | R + N: 48 |
| h = [3 22 35 7] | R: 164 | R + N: 56 |
| h = [3 22 36 6] | R: 164 | R + N: 48 |
| h = [3 22 36 7] | R: 168 | R + N: 56 |
| h = [3 22 37 6] | R: 168 | R + N: 48 |
| h = [3 23 24 16] | R: 164 | R + N: 48 |
| h = [3 23 24 17] | R: 168 | R + N: 56 |
| h = [3 23 25 16] | R: 168 | R + N: 48 |
| h = [3 23 27 17] | R: 164 | R + N: 56 |
| h = [3 23 30 6] | R: 164 | R + N: 48 |
| h = [3 23 30 7] | R: 168 | R + N: 56 |
| h = [3 23 30 17] | R: 164 | R + N: 56 |
| h = [3 23 31 6] | R: 164 | R + N: 48 |
| h = [3 23 32 16] | R: 164 | R + N: 48 |
| h = [3 23 33 7] | R: 164 | R + N: 56 |
| h = [3 23 33 16] | R: 168 | R + N: 48 |
| h = [3 23 33 17] | R: 168 | R + N: 56 |
| h = [3 23 34 7] | R: 164 | R + N: 56 |
| h = [3 23 36 6] | R: 168 | R + N: 48 |
| h = [3 23 37 6] | R: 164 | R + N: 48 |
| h = [3 23 37 7] | R: 168 | R + N: 56 |
| h = [3 24 20 17] | R: 164 | R + N: 56 |
| h = [3 24 22 16] | R: 164 | R + N: 48 |
| h = [3 24 23 16] | R: 168 | R + N: 48 |
| h = [3 24 23 17] | R: 168 | R + N: 56 |
| h = [3 24 30 6] | R: 164 | R + N: 48 |
| h = [3 24 30 7] | R: 168 | R + N: 56 |
| h = [3 24 31 6] | R: 168 | R + N: 48 |
| h = [3 24 33 7] | R: 164 | R + N: 56 |
| h = [3 24 34 7] | R: 164 | R + N: 56 |
| h = [3 24 34 16] | R: 168 | R + N: 48 |
| h = [3 24 34 17] | R: 168 | R + N: 56 |
| h = [3 24 35 16] | R: 164 | R + N: 48 |
| h = [3 24 36 6] | R: 164 | R + N: 48 |
| h = [3 24 37 6] | R: 168 | R + N: 48 |
| h = [3 24 37 7] | R: 168 | R + N: 56 |
| h = [3 24 37 17] | R: 164 | R + N: 56 |
| h = [3 25 21 17] | R: 164 | R + N: 56 |
| h = [3 25 22 16] | R: 164 | R + N: 48 |
| h = [3 25 22 17] | R: 168 | R + N: 56 |
| h = [3 25 23 16] | R: 168 | R + N: 48 |
| h = [3 25 30 6] | R: 168 | R + N: 48 |
| h = [3 25 31 6] | R: 164 | R + N: 48 |
| h = [3 25 31 7] | R: 168 | R + N: 56 |
| h = [3 25 32 7] | R: 164 | R + N: 56 |
| h = [3 25 34 16] | R: 164 | R + N: 48 |
| h = [3 25 35 7] | R: 164 | R + N: 56 |
| h = [3 25 35 16] | R: 168 | R + N: 48 |
| h = [3 25 35 17] | R: 168 | R + N: 56 |
| h = [3 25 36 6] | R: 168 | R + N: 48 |
| h = [3 25 36 7] | R: 168 | R + N: 56 |
| h = [3 25 36 17] | R: 164 | R + N: 56 |
| h = [3 25 37 6] | R: 164 | R + N: 48 |
| h = [3 26 20 16] | R: 168 | R + N: 48 |
| h = [3 26 21 16] | R: 164 | R + N: 48 |
| h = [3 26 21 17] | R: 168 | R + N: 56 |
| h = [3 26 22 17] | R: 164 | R + N: 56 |
| h = [3 26 31 7] | R: 164 | R + N: 56 |
| h = [3 26 32 6] | R: 164 | R + N: 48 |
| h = [3 26 32 7] | R: 168 | R + N: 56 |
| h = [3 26 33 6] | R: 168 | R + N: 48 |
| h = [3 26 34 6] | R: 164 | R + N: 48 |
| h = [3 26 35 6] | R: 168 | R + N: 48 |
| h = [3 26 35 7] | R: 168 | R + N: 56 |
| h = [3 26 35 17] | R: 164 | R + N: 56 |
| h = [3 26 36 7] | R: 164 | R + N: 56 |
| h = [3 26 36 16] | R: 168 | R + N: 48 |
| h = [3 26 36 17] | R: 168 | R + N: 56 |
| h = [3 26 37 16] | R: 164 | R + N: 48 |
| h = [3 27 20 16] | R: 164 | R + N: 48 |
| h = [3 27 20 17] | R: 168 | R + N: 56 |
| h = [3 27 21 16] | R: 168 | R + N: 48 |
| h = [3 27 23 17] | R: 164 | R + N: 56 |
| h = [3 27 30 7] | R: 164 | R + N: 56 |
| h = [3 27 32 6] | R: 168 | R + N: 48 |
| h = [3 27 33 6] | R: 164 | R + N: 48 |
| h = [3 27 33 7] | R: 168 | R + N: 56 |
| h = [3 27 34 6] | R: 164 | R + N: 48 |
| h = [3 27 34 7] | R: 168 | R + N: 56 |
| h = [3 27 34 17] | R: 164 | R + N: 56 |
| h = [3 27 35 6] | R: 164 | R + N: 48 |

TABLE 1-continued

| | | |
|---|---|---|
| h = [3 27 36 16] | R: 164 | R + N: 48 |
| h = [3 27 37 7] | R: 164 | R + N: 56 |
| h = [3 27 37 16] | R: 168 | R + N: 48 |
| h = [3 27 37 17] | R: 168 | R + N: 56 |
| h = [3 30 20 7] | R: 164 | R + N: 56 |
| h = [3 30 20 16] | R: 168 | R + N: 48 |
| h = [3 30 20 17] | R: 168 | R + N: 56 |
| h = [3 30 21 16] | R: 164 | R + N: 48 |
| h = [3 30 22 6] | R: 164 | R + N: 48 |
| h = [3 30 23 6] | R: 168 | R + N: 48 |
| h = [3 30 23 7] | R: 168 | R + N: 56 |
| h = [3 30 23 17] | R: 164 | R + N: 56 |
| h = [3 30 24 6] | R: 164 | R + N: 48 |
| h = [3 30 24 7] | R: 168 | R + N: 56 |
| h = [3 30 25 6] | R: 168 | R + N: 48 |
| h = [3 30 27 7] | R: 164 | R + N: 56 |
| h = [3 30 34 17] | R: 164 | R + N: 56 |
| h = [3 30 36 16] | R: 168 | R + N: 48 |
| h = [3 30 37 16] | R: 164 | R + N: 48 |
| h = [3 30 37 17] | R: 168 | R + N: 56 |
| h = [3 31 20 16] | R: 164 | R + N: 48 |
| h = [3 31 21 7] | R: 164 | R + N: 56 |
| h = [3 31 21 16] | R: 168 | R + N: 48 |
| h = [3 31 21 17] | R: 168 | R + N: 56 |
| h = [3 31 22 6] | R: 168 | R + N: 48 |
| h = [3 31 22 7] | R: 168 | R + N: 56 |
| h = [3 31 22 17] | R: 164 | R + N: 56 |
| h = [3 31 23 6] | R: 164 | R + N: 48 |
| h = [3 31 24 6] | R: 168 | R + N: 48 |
| h = [3 31 25 6] | R: 164 | R + N: 48 |
| h = [3 31 25 7] | R: 168 | R + N: 56 |
| h = [3 31 26 7] | R: 164 | R + N: 56 |
| h = [3 31 35 17] | R: 164 | R + N: 56 |
| h = [3 31 36 16] | R: 164 | R + N: 48 |
| h = [3 31 36 17] | R: 168 | R + N: 56 |
| h = [3 31 37 16] | R: 168 | R + N: 48 |
| h = [3 32 20 6] | R: 164 | R + N: 48 |
| h = [3 32 21 6] | R: 168 | R + N: 48 |
| h = [3 32 21 7] | R: 168 | R + N: 56 |
| h = [3 32 21 17] | R: 164 | R + N: 56 |
| h = [3 32 22 7] | R: 164 | R + N: 56 |
| h = [3 32 22 16] | R: 168 | R + N: 48 |
| h = [3 32 22 17] | R: 168 | R + N: 56 |
| h = [3 32 23 16] | R: 164 | R + N: 48 |
| h = [3 32 25 7] | R: 164 | R + N: 56 |
| h = [3 32 26 6] | R: 164 | R + N: 48 |
| h = [3 32 26 7] | R: 168 | R + N: 56 |
| h = [3 32 27 6] | R: 168 | R + N: 48 |
| h = [3 32 34 16] | R: 168 | R + N: 48 |
| h = [3 32 35 16] | R: 164 | R + N: 48 |
| h = [3 32 35 17] | R: 168 | R + N: 56 |
| h = [3 32 36 17] | R: 164 | R + N: 56 |
| h = [3 33 20 6] | R: 168 | R + N: 48 |
| h = [3 33 20 7] | R: 168 | R + N: 56 |
| h = [3 33 20 17] | R: 164 | R + N: 56 |
| h = [3 33 21 6] | R: 164 | R + N: 48 |
| h = [3 33 22 16] | R: 164 | R + N: 48 |
| h = [3 33 23 7] | R: 164 | R + N: 56 |
| h = [3 33 23 16] | R: 168 | R + N: 48 |
| h = [3 33 23 17] | R: 168 | R + N: 56 |
| h = [3 33 24 7] | R: 164 | R + N: 56 |
| h = [3 33 26 6] | R: 168 | R + N: 48 |
| h = [3 33 27 6] | R: 164 | R + N: 48 |
| h = [3 33 27 7] | R: 168 | R + N: 56 |
| h = [3 33 34 16] | R: 164 | R + N: 48 |
| h = [3 33 34 17] | R: 168 | R + N: 56 |
| h = [3 33 35 16] | R: 168 | R + N: 48 |
| h = [3 33 37 17] | R: 164 | R + N: 56 |
| h = [3 34 20 6] | R: 164 | R + N: 48 |
| h = [3 34 20 7] | R: 168 | R + N: 56 |
| h = [3 34 21 6] | R: 168 | R + N: 48 |
| h = [3 34 23 7] | R: 164 | R + N: 56 |
| h = [3 34 24 7] | R: 164 | R + N: 56 |
| h = [3 34 24 16] | R: 168 | R + N: 48 |
| h = [3 34 24 17] | R: 168 | R + N: 56 |
| h = [3 34 25 16] | R: 164 | R + N: 48 |
| h = [3 34 26 6] | R: 164 | R + N: 48 |
| h = [3 34 27 6] | R: 168 | R + N: 48 |
| h = [3 34 27 7] | R: 168 | R + N: 56 |
| h = [3 34 27 17] | R: 164 | R + N: 56 |
| h = [3 34 30 17] | R: 164 | R + N: 56 |
| h = [3 34 32 16] | R: 168 | R + N: 48 |
| h = [3 34 33 16] | R: 164 | R + N: 48 |
| h = [3 34 33 17] | R: 168 | R + N: 56 |
| h = [3 35 20 6] | R: 168 | R + N: 48 |
| h = [3 35 21 6] | R: 164 | R + N: 48 |
| h = [3 35 21 7] | R: 168 | R + N: 56 |
| h = [3 35 22 7] | R: 164 | R + N: 56 |
| h = [3 35 24 16] | R: 164 | R + N: 48 |
| h = [3 35 25 7] | R: 164 | R + N: 56 |
| h = [3 35 25 16] | R: 168 | R + N: 48 |
| h = [3 35 25 17] | R: 168 | R + N: 56 |
| h = [3 35 26 6] | R: 168 | R + N: 48 |
| h = [3 35 26 7] | R: 168 | R + N: 56 |
| h = [3 35 26 17] | R: 164 | R + N: 56 |
| h = [3 35 27 6] | R: 164 | R + N: 48 |
| h = [3 35 31 17] | R: 164 | R + N: 56 |
| h = [3 35 32 16] | R: 164 | R + N: 48 |
| h = [3 35 32 17] | R: 168 | R + N: 56 |
| h = [3 35 33 16] | R: 168 | R + N: 48 |
| h = [3 36 21 7] | R: 164 | R + N: 56 |
| h = [3 36 22 6] | R: 164 | R + N: 48 |
| h = [3 36 22 7] | R: 168 | R + N: 56 |
| h = [3 36 23 6] | R: 168 | R + N: 48 |
| h = [3 36 24 6] | R: 164 | R + N: 48 |
| h = [3 36 25 6] | R: 168 | R + N: 48 |
| h = [3 36 25 7] | R: 168 | R + N: 56 |
| h = [3 36 25 17] | R: 164 | R + N: 56 |
| h = [3 36 26 7] | R: 164 | R + N: 56 |
| h = [3 36 26 16] | R: 168 | R + N: 48 |
| h = [3 36 26 17] | R: 168 | R + N: 56 |
| h = [3 36 27 16] | R: 164 | R + N: 48 |
| h = [3 36 30 16] | R: 168 | R + N: 48 |
| h = [3 36 31 16] | R: 164 | R + N: 48 |
| h = [3 36 31 17] | R: 168 | R + N: 56 |
| h = [3 36 32 17] | R: 164 | R + N: 56 |
| h = [3 37 20 7] | R: 164 | R + N: 56 |
| h = [3 37 22 6] | R: 168 | R + N: 48 |
| h = [3 37 23 6] | R: 164 | R + N: 48 |
| h = [3 37 23 7] | R: 168 | R + N: 56 |
| h = [3 37 24 6] | R: 168 | R + N: 48 |
| h = [3 37 24 7] | R: 168 | R + N: 56 |
| h = [3 37 24 17] | R: 164 | R + N: 56 |
| h = [3 37 25 6] | R: 164 | R + N: 48 |
| h = [3 37 26 16] | R: 164 | R + N: 48 |
| h = [3 37 27 7] | R: 164 | R + N: 56 |
| h = [3 37 27 16] | R: 168 | R + N: 48 |
| h = [3 37 27 17] | R: 168 | R + N: 56 |
| h = [3 37 30 16] | R: 164 | R + N: 48 |
| h = [3 37 30 17] | R: 168 | R + N: 56 |
| h = [3 37 31 16] | R: 168 | R + N: 48 |
| h = [3 37 33 17] | R: 164 | R + N: 56 |
| h = [4 20 30 4] | R: 164 | R + N: 44 |
| h = [4 20 32 5] | R: 164 | R + N: 48 |
| h = [4 20 34 4] | R: 164 | R + N: 44 |
| h = [4 20 37 5] | R: 164 | R + N: 48 |
| h = [4 21 31 4] | R: 164 | R + N: 44 |
| h = [4 21 33 5] | R: 164 | R + N: 48 |
| h = [4 21 35 4] | R: 164 | R + N: 44 |
| h = [4 21 36 5] | R: 164 | R + N: 48 |
| h = [4 22 30 5] | R: 164 | R + N: 48 |
| h = [4 22 32 4] | R: 164 | R + N: 44 |
| h = [4 22 35 5] | R: 164 | R + N: 48 |
| h = [4 22 36 4] | R: 164 | R + N: 44 |
| h = [4 23 31 5] | R: 164 | R + N: 48 |
| h = [4 23 33 4] | R: 164 | R + N: 44 |
| h = [4 23 34 5] | R: 164 | R + N: 48 |
| h = [4 23 37 4] | R: 164 | R + N: 44 |
| h = [4 24 30 4] | R: 164 | R + N: 44 |
| h = [4 24 33 5] | R: 164 | R + N: 48 |
| h = [4 24 34 4] | R: 164 | R + N: 44 |
| h = [4 24 36 5] | R: 164 | R + N: 48 |
| h = [4 25 31 4] | R: 164 | R + N: 44 |
| h = [4 25 32 5] | R: 164 | R + N: 48 |
| h = [4 25 35 4] | R: 164 | R + N: 44 |
| h = [4 25 37 5] | R: 164 | R + N: 48 |
| h = [4 26 31 5] | R: 164 | R + N: 48 |
| h = [4 26 32 4] | R: 164 | R + N: 44 |
| h = [4 26 34 5] | R: 164 | R + N: 48 |
| h = [4 26 36 4] | R: 164 | R + N: 44 |

TABLE 1-continued

| h | R | R + N |
|---|---|---|
| h = [4 27 30 5] | R: 164 | R + N: 48 |
| h = [4 27 33 4] | R: 164 | R + N: 44 |
| h = [4 27 35 5] | R: 164 | R + N: 48 |
| h = [4 27 37 4] | R: 164 | R + N: 44 |
| h = [4 30 20 4] | R: 164 | R + N: 44 |
| h = [4 30 22 5] | R: 164 | R + N: 48 |
| h = [4 30 24 4] | R: 164 | R + N: 44 |
| h = [4 30 27 5] | R: 164 | R + N: 48 |
| h = [4 31 21 4] | R: 164 | R + N: 44 |
| h = [4 31 23 5] | R: 164 | R + N: 48 |
| h = [4 31 25 4] | R: 164 | R + N: 44 |
| h = [4 31 26 5] | R: 164 | R + N: 48 |
| h = [4 32 20 5] | R: 164 | R + N: 48 |
| h = [4 32 22 4] | R: 164 | R + N: 44 |
| h = [4 32 25 5] | R: 164 | R + N: 48 |
| h = [4 32 26 4] | R: 164 | R + N: 44 |
| h = [4 33 21 5] | R: 164 | R + N: 48 |
| h = [4 33 23 4] | R: 164 | R + N: 44 |
| h = [4 33 24 5] | R: 164 | R + N: 48 |
| h = [4 33 27 4] | R: 164 | R + N: 44 |
| h = [4 34 20 4] | R: 164 | R + N: 44 |
| h = [4 34 23 5] | R: 164 | R + N: 48 |
| h = [4 34 24 4] | R: 164 | R + N: 44 |
| h = [4 34 26 5] | R: 164 | R + N: 48 |
| h = [4 35 21 4] | R: 164 | R + N: 44 |
| h = [4 35 22 5] | R: 164 | R + N: 48 |
| h = [4 35 25 4] | R: 164 | R + N: 44 |
| h = [4 35 27 5] | R: 164 | R + N: 48 |
| h = [4 36 21 5] | R: 164 | R + N: 48 |
| h = [4 36 22 4] | R: 164 | R + N: 44 |
| h = [4 36 24 5] | R: 164 | R + N: 48 |
| h = [4 36 26 4] | R: 164 | R + N: 44 |
| h = [4 37 20 5] | R: 164 | R + N: 48 |
| h = [4 37 23 4] | R: 164 | R + N: 44 |
| h = [4 37 25 5] | R: 164 | R + N: 48 |
| h = [4 37 27 4] | R: 164 | R + N: 44 |
| h = [5 20 30 4] | R: 164 | R + N: 48 |
| h = [5 20 32 5] | R: 164 | R + N: 44 |
| h = [5 20 34 4] | R: 164 | R + N: 48 |
| h = [5 20 37 5] | R: 164 | R + N: 44 |
| h = [5 21 31 4] | R: 164 | R + N: 48 |
| h = [5 21 33 5] | R: 164 | R + N: 44 |
| h = [5 21 35 4] | R: 164 | R + N: 48 |
| h = [5 21 36 5] | R: 164 | R + N: 44 |
| h = [5 22 30 5] | R: 164 | R + N: 44 |
| h = [5 22 32 4] | R: 164 | R + N: 48 |
| h = [5 22 35 5] | R: 164 | R + N: 44 |
| h = [5 22 36 4] | R: 164 | R + N: 48 |
| h = [5 23 31 5] | R: 164 | R + N: 44 |
| h = [5 23 33 4] | R: 164 | R + N: 48 |
| h = [5 23 34 5] | R: 164 | R + N: 44 |
| h = [5 23 37 4] | R: 164 | R + N: 48 |
| h = [5 24 30 4] | R: 164 | R + N: 48 |
| h = [5 24 33 5] | R: 164 | R + N: 44 |
| h = [5 24 34 4] | R: 164 | R + N: 48 |
| h = [5 24 36 5] | R: 164 | R + N: 44 |
| h = [5 25 31 4] | R: 164 | R + N: 48 |
| h = [5 25 32 5] | R: 164 | R + N: 44 |
| h = [5 25 35 4] | R: 164 | R + N: 48 |
| h = [5 25 37 5] | R: 164 | R + N: 44 |
| h = [5 26 31 5] | R: 164 | R + N: 44 |
| h = [5 26 32 4] | R: 164 | R + N: 48 |
| h = [5 26 34 5] | R: 164 | R + N: 44 |
| h = [5 26 36 4] | R: 164 | R + N: 48 |
| h = [5 27 30 5] | R: 164 | R + N: 44 |
| h = [5 27 33 4] | R: 164 | R + N: 48 |
| h = [5 27 35 5] | R: 164 | R + N: 44 |
| h = [5 27 37 4] | R: 164 | R + N: 48 |
| h = [5 30 20 4] | R: 164 | R + N: 48 |
| h = [5 30 22 5] | R: 164 | R + N: 44 |
| h = [5 30 24 4] | R: 164 | R + N: 48 |
| h = [5 30 27 5] | R: 164 | R + N: 44 |
| h = [5 31 21 4] | R: 164 | R + N: 48 |
| h = [5 31 23 5] | R: 164 | R + N: 44 |
| h = [5 31 25 4] | R: 164 | R + N: 48 |
| h = [5 31 26 5] | R: 164 | R + N: 44 |
| h = [5 32 20 5] | R: 164 | R + N: 48 |
| h = [5 32 22 4] | R: 164 | R + N: 44 |
| h = [5 32 25 5] | R: 164 | R + N: 44 |
| h = [5 32 26 4] | R: 164 | R + N: 48 |
| h = [5 33 21 5] | R: 164 | R + N: 44 |
| h = [5 33 23 4] | R: 164 | R + N: 48 |
| h = [5 33 24 5] | R: 164 | R + N: 44 |
| h = [5 33 27 4] | R: 164 | R + N: 48 |
| h = [5 34 20 4] | R: 164 | R + N: 48 |
| h = [5 34 23 5] | R: 164 | R + N: 44 |
| h = [5 34 24 4] | R: 164 | R + N: 48 |
| h = [5 34 26 5] | R: 164 | R + N: 44 |
| h = [5 35 21 4] | R: 164 | R + N: 48 |
| h = [5 35 22 5] | R: 164 | R + N: 44 |
| h = [5 35 25 4] | R: 164 | R + N: 48 |
| h = [5 35 27 5] | R: 164 | R + N: 44 |
| h = [5 36 21 5] | R: 164 | R + N: 44 |
| h = [5 36 22 4] | R: 164 | R + N: 48 |
| h = [5 36 24 5] | R: 164 | R + N: 44 |
| h = [5 36 26 4] | R: 164 | R + N: 48 |
| h = [5 37 20 5] | R: 164 | R + N: 44 |
| h = [5 37 23 4] | R: 164 | R + N: 48 |
| h = [5 37 25 5] | R: 164 | R + N: 44 |
| h = [5 37 27 4] | R: 164 | R + N: 48 |
| h = [7 20 30 7] | R: 168 | R + N: 56 |
| h = [7 20 32 6] | R: 164 | R + N: 48 |
| h = [7 20 33 6] | R: 164 | R + N: 48 |
| h = [7 20 33 7] | R: 168 | R + N: 56 |
| h = [7 20 34 6] | R: 164 | R + N: 48 |
| h = [7 20 34 7] | R: 168 | R + N: 56 |
| h = [7 20 35 6] | R: 164 | R + N: 48 |
| h = [7 20 37 7] | R: 168 | R + N: 56 |
| h = [7 21 31 7] | R: 168 | R + N: 56 |
| h = [7 21 32 6] | R: 164 | R + N: 48 |
| h = [7 21 32 7] | R: 168 | R + N: 56 |
| h = [7 21 33 6] | R: 168 | R + N: 48 |
| h = [7 21 34 6] | R: 164 | R + N: 48 |
| h = [7 21 35 6] | R: 168 | R + N: 48 |
| h = [7 21 35 7] | R: 164 | R + N: 56 |
| h = [7 21 36 7] | R: 168 | R + N: 56 |
| h = [7 22 30 6] | R: 168 | R + N: 48 |
| h = [7 22 31 6] | R: 164 | R + N: 48 |
| h = [7 22 31 7] | R: 164 | R + N: 56 |
| h = [7 22 32 7] | R: 168 | R + N: 56 |
| h = [7 22 35 7] | R: 168 | R + N: 56 |
| h = [7 22 36 6] | R: 168 | R + N: 48 |
| h = [7 22 36 7] | R: 164 | R + N: 56 |
| h = [7 22 37 6] | R: 164 | R + N: 48 |
| h = [7 23 30 6] | R: 164 | R + N: 48 |
| h = [7 23 30 7] | R: 164 | R + N: 56 |
| h = [7 23 31 6] | R: 168 | R + N: 48 |
| h = [7 23 33 7] | R: 168 | R + N: 56 |
| h = [7 23 34 7] | R: 168 | R + N: 56 |
| h = [7 23 36 6] | R: 164 | R + N: 48 |
| h = [7 23 37 6] | R: 168 | R + N: 48 |
| h = [7 23 37 7] | R: 164 | R + N: 56 |
| h = [7 24 30 6] | R: 168 | R + N: 48 |
| h = [7 24 30 7] | R: 168 | R + N: 56 |
| h = [7 24 31 6] | R: 164 | R + N: 48 |
| h = [7 24 33 7] | R: 168 | R + N: 56 |
| h = [7 24 34 7] | R: 168 | R + N: 56 |
| h = [7 24 36 6] | R: 168 | R + N: 48 |
| h = [7 24 37 6] | R: 164 | R + N: 48 |
| h = [7 24 37 7] | R: 168 | R + N: 56 |
| h = [7 25 30 6] | R: 168 | R + N: 48 |
| h = [7 25 31 6] | R: 168 | R + N: 48 |
| h = [7 25 31 7] | R: 164 | R + N: 56 |
| h = [7 25 32 7] | R: 168 | R + N: 56 |
| h = [7 25 35 7] | R: 168 | R + N: 56 |
| h = [7 25 36 6] | R: 164 | R + N: 48 |
| h = [7 25 36 7] | R: 164 | R + N: 56 |
| h = [7 25 37 6] | R: 164 | R + N: 48 |
| h = [7 26 31 7] | R: 168 | R + N: 56 |
| h = [7 26 32 6] | R: 164 | R + N: 48 |
| h = [7 26 32 7] | R: 164 | R + N: 56 |
| h = [7 26 33 6] | R: 164 | R + N: 48 |
| h = [7 26 34 6] | R: 164 | R + N: 48 |
| h = [7 26 35 6] | R: 164 | R + N: 48 |
| h = [7 26 35 7] | R: 164 | R + N: 56 |
| h = [7 26 36 6] | R: 168 | R + N: 48 |
| h = [7 26 36 7] | R: 168 | R + N: 56 |
| h = [7 27 30 7] | R: 168 | R + N: 56 |
| h = [7 27 32 6] | R: 164 | R + N: 48 |
| h = [7 27 33 6] | R: 168 | R + N: 48 |
| h = [7 27 33 7] | R: 164 | R + N: 56 |

TABLE 1-continued

| h | R | R + N |
|---|---|---|
| h = [7 27 34 6] | R: 164 | R + N: 48 |
| h = [7 27 34 7] | R: 164 | R + N: 56 |
| h = [7 27 35 6] | R: 168 | R + N: 48 |
| h = [7 27 37 7] | R: 168 | R + N: 56 |
| h = [7 30 20 7] | R: 168 | R + N: 56 |
| h = [7 30 22 6] | R: 168 | R + N: 48 |
| h = [7 30 23 6] | R: 164 | R + N: 48 |
| h = [7 30 23 7] | R: 164 | R + N: 56 |
| h = [7 30 24 6] | R: 168 | R + N: 48 |
| h = [7 30 24 7] | R: 164 | R + N: 56 |
| h = [7 30 25 6] | R: 164 | R + N: 48 |
| h = [7 30 27 7] | R: 168 | R + N: 56 |
| h = [7 31 21 7] | R: 168 | R + N: 48 |
| h = [7 31 22 6] | R: 164 | R + N: 48 |
| h = [7 31 22 7] | R: 164 | R + N: 56 |
| h = [7 31 23 6] | R: 168 | R + N: 48 |
| h = [7 31 24 6] | R: 164 | R + N: 48 |
| h = [7 31 25 6] | R: 168 | R + N: 48 |
| h = [7 31 25 7] | R: 164 | R + N: 56 |
| h = [7 31 26 7] | R: 168 | R + N: 56 |
| h = [7 32 20 6] | R: 168 | R + N: 48 |
| h = [7 32 21 6] | R: 164 | R + N: 48 |
| h = [7 32 21 7] | R: 164 | R + N: 56 |
| h = [7 32 22 7] | R: 168 | R + N: 56 |
| h = [7 32 25 7] | R: 168 | R + N: 56 |
| h = [7 32 26 6] | R: 168 | R + N: 48 |
| h = [7 32 26 7] | R: 164 | R + N: 56 |
| h = [7 32 27 6] | R: 164 | R + N: 48 |
| h = [7 33 20 6] | R: 164 | R + N: 48 |
| h = [7 33 20 7] | R: 164 | R + N: 56 |
| h = [7 33 21 6] | R: 168 | R + N: 48 |
| h = [7 33 23 7] | R: 168 | R + N: 56 |
| h = [7 33 24 7] | R: 168 | R + N: 56 |
| h = [7 33 26 6] | R: 164 | R + N: 48 |
| h = [7 33 27 6] | R: 168 | R + N: 48 |
| h = [7 33 27 7] | R: 164 | R + N: 56 |
| h = [7 34 20 6] | R: 168 | R + N: 48 |
| h = [7 34 20 7] | R: 164 | R + N: 56 |
| h = [7 34 21 6] | R: 164 | R + N: 48 |
| h = [7 34 23 7] | R: 168 | R + N: 56 |
| h = [7 34 24 7] | R: 168 | R + N: 56 |
| h = [7 34 26 6] | R: 168 | R + N: 48 |
| h = [7 34 27 6] | R: 164 | R + N: 48 |
| h = [7 34 27 7] | R: 164 | R + N: 56 |
| h = [7 35 20 6] | R: 164 | R + N: 48 |
| h = [7 35 21 6] | R: 168 | R + N: 48 |
| h = [7 35 21 7] | R: 164 | R + N: 56 |
| h = [7 35 22 7] | R: 168 | R + N: 56 |
| h = [7 35 25 7] | R: 168 | R + N: 56 |
| h = [7 35 26 6] | R: 164 | R + N: 48 |
| h = [7 35 26 7] | R: 164 | R + N: 56 |
| h = [7 35 27 6] | R: 168 | R + N: 48 |
| h = [7 36 21 7] | R: 168 | R + N: 56 |
| h = [7 36 22 6] | R: 168 | R + N: 48 |
| h = [7 36 22 7] | R: 164 | R + N: 56 |
| h = [7 36 23 6] | R: 164 | R + N: 48 |
| h = [7 36 24 6] | R: 168 | R + N: 48 |
| h = [7 36 25 6] | R: 164 | R + N: 48 |
| h = [7 36 25 7] | R: 164 | R + N: 56 |
| h = [7 36 26 7] | R: 168 | R + N: 56 |
| h = [7 37 20 7] | R: 168 | R + N: 56 |
| h = [7 37 22 6] | R: 164 | R + N: 48 |
| h = [7 37 23 6] | R: 168 | R + N: 48 |
| h = [7 37 23 7] | R: 164 | R + N: 56 |
| h = [7 37 24 6] | R: 164 | R + N: 48 |
| h = [7 37 24 7] | R: 164 | R + N: 56 |
| h = [7 37 25 6] | R: 168 | R + N: 56 |
| h = [7 37 27 7] | R: 168 | R + N: 56 |
| h = [14 20 24 14] | R: 164 | R + N: 44 |
| h = [14 20 26 15] | R: 164 | R + N: 48 |
| h = [14 20 30 14] | R: 164 | R + N: 44 |
| h = [14 20 33 15] | R: 164 | R + N: 48 |
| h = [14 21 25 14] | R: 164 | R + N: 44 |
| h = [14 21 27 15] | R: 164 | R + N: 48 |
| h = [14 21 31 14] | R: 164 | R + N: 44 |
| h = [14 21 32 15] | R: 164 | R + N: 48 |
| h = [14 22 24 15] | R: 164 | R + N: 48 |
| h = [14 22 26 14] | R: 164 | R + N: 44 |
| h = [14 22 31 15] | R: 164 | R + N: 48 |
| h = [14 22 32 14] | R: 164 | R + N: 44 |
| h = [14 23 25 15] | R: 164 | R + N: 48 |
| h = [14 23 27 14] | R: 164 | R + N: 44 |
| h = [14 23 30 15] | R: 164 | R + N: 48 |
| h = [14 23 33 14] | R: 164 | R + N: 44 |
| h = [14 24 20 14] | R: 164 | R + N: 44 |
| h = [14 24 22 15] | R: 164 | R + N: 48 |
| h = [14 24 34 14] | R: 164 | R + N: 44 |
| h = [14 24 37 15] | R: 164 | R + N: 48 |
| h = [14 25 21 14] | R: 164 | R + N: 44 |
| h = [14 25 23 15] | R: 164 | R + N: 48 |
| h = [14 25 35 14] | R: 164 | R + N: 44 |
| h = [14 25 36 15] | R: 164 | R + N: 48 |
| h = [14 26 20 15] | R: 164 | R + N: 48 |
| h = [14 26 22 14] | R: 164 | R + N: 44 |
| h = [14 26 35 15] | R: 164 | R + N: 48 |
| h = [14 26 36 14] | R: 164 | R + N: 44 |
| h = [14 27 21 15] | R: 164 | R + N: 48 |
| h = [14 27 23 14] | R: 164 | R + N: 44 |
| h = [14 27 34 15] | R: 164 | R + N: 48 |
| h = [14 27 37 14] | R: 164 | R + N: 44 |
| h = [14 30 20 14] | R: 164 | R + N: 44 |
| h = [14 30 23 15] | R: 164 | R + N: 48 |
| h = [14 30 34 14] | R: 164 | R + N: 44 |
| h = [14 30 36 15] | R: 164 | R + N: 48 |
| h = [14 31 21 14] | R: 164 | R + N: 44 |
| h = [14 31 22 15] | R: 164 | R + N: 48 |
| h = [14 31 35 14] | R: 164 | R + N: 44 |
| h = [14 31 37 15] | R: 164 | R + N: 48 |
| h = [14 32 21 15] | R: 164 | R + N: 48 |
| h = [14 32 22 14] | R: 164 | R + N: 44 |
| h = [14 32 34 15] | R: 164 | R + N: 48 |
| h = [14 32 36 14] | R: 164 | R + N: 44 |
| h = [14 33 20 15] | R: 164 | R + N: 48 |
| h = [14 33 23 14] | R: 164 | R + N: 44 |
| h = [14 33 35 15] | R: 164 | R + N: 48 |
| h = [14 33 37 14] | R: 164 | R + N: 44 |
| h = [14 34 24 14] | R: 164 | R + N: 44 |
| h = [14 34 27 15] | R: 164 | R + N: 48 |
| h = [14 34 30 14] | R: 164 | R + N: 44 |
| h = [14 34 32 15] | R: 164 | R + N: 48 |
| h = [14 35 25 14] | R: 164 | R + N: 44 |
| h = [14 35 26 15] | R: 164 | R + N: 48 |
| h = [14 35 31 14] | R: 164 | R + N: 44 |
| h = [14 35 33 15] | R: 164 | R + N: 48 |
| h = [14 36 25 15] | R: 164 | R + N: 48 |
| h = [14 36 26 14] | R: 164 | R + N: 44 |
| h = [14 36 30 15] | R: 164 | R + N: 48 |
| h = [14 36 32 14] | R: 164 | R + N: 44 |
| h = [14 37 24 15] | R: 164 | R + N: 48 |
| h = [14 37 27 14] | R: 164 | R + N: 44 |
| h = [14 37 31 15] | R: 164 | R + N: 48 |
| h = [14 37 33 14] | R: 164 | R + N: 44 |
| h = [15 20 25 14] | R: 164 | R + N: 48 |
| h = [15 20 27 15] | R: 164 | R + N: 48 |
| h = [15 20 31 14] | R: 164 | R + N: 44 |
| h = [15 20 32 15] | R: 164 | R + N: 48 |
| h = [15 21 24 14] | R: 164 | R + N: 44 |
| h = [15 21 26 15] | R: 164 | R + N: 48 |
| h = [15 21 30 14] | R: 164 | R + N: 44 |
| h = [15 21 33 15] | R: 164 | R + N: 48 |
| h = [15 22 25 15] | R: 164 | R + N: 48 |
| h = [15 22 27 14] | R: 164 | R + N: 44 |
| h = [15 22 30 15] | R: 164 | R + N: 48 |
| h = [15 22 33 14] | R: 164 | R + N: 44 |
| h = [15 23 24 15] | R: 164 | R + N: 48 |
| h = [15 23 26 14] | R: 164 | R + N: 44 |
| h = [15 23 31 15] | R: 164 | R + N: 48 |
| h = [15 23 32 14] | R: 164 | R + N: 44 |
| h = [15 24 21 14] | R: 164 | R + N: 48 |
| h = [15 24 23 15] | R: 164 | R + N: 44 |
| h = [15 24 35 14] | R: 164 | R + N: 48 |
| h = [15 24 36 15] | R: 164 | R + N: 44 |
| h = [15 25 20 14] | R: 164 | R + N: 48 |
| h = [15 25 22 15] | R: 164 | R + N: 44 |
| h = [15 25 34 14] | R: 164 | R + N: 48 |
| h = [15 25 37 15] | R: 164 | R + N: 44 |
| h = [15 26 21 15] | R: 164 | R + N: 44 |
| h = [15 26 23 14] | R: 164 | R + N: 48 |
| h = [15 26 34 15] | R: 164 | R + N: 44 |
| h = [15 26 37 14] | R: 164 | R + N: 48 |

TABLE 1-continued

| | | |
|---|---|---|
| h = [15 27 20 15] | R: 164 | R + N: 44 |
| h = [15 27 22 14] | R: 164 | R + N: 48 |
| h = [15 27 35 15] | R: 164 | R + N: 44 |
| h = [15 27 36 14] | R: 164 | R + N: 48 |
| h = [15 30 21 14] | R: 164 | R + N: 48 |
| h = [15 30 22 15] | R: 164 | R + N: 44 |
| h = [15 30 35 14] | R: 164 | R + N: 48 |
| h = [15 30 37 15] | R: 164 | R + N: 44 |
| h = [15 31 20 14] | R: 164 | R + N: 48 |
| h = [15 31 23 15] | R: 164 | R + N: 44 |
| h = [15 31 34 14] | R: 164 | R + N: 48 |
| h = [15 31 36 15] | R: 164 | R + N: 44 |
| h = [15 32 20 15] | R: 164 | R + N: 44 |
| h = [15 32 23 14] | R: 164 | R + N: 48 |
| h = [15 32 35 15] | R: 164 | R + N: 44 |
| h = [15 32 37 14] | R: 164 | R + N: 48 |
| h = [15 33 21 15] | R: 164 | R + N: 44 |
| h = [15 33 22 14] | R: 164 | R + N: 48 |
| h = [15 33 34 15] | R: 164 | R + N: 44 |
| h = [15 33 36 14] | R: 164 | R + N: 48 |
| h = [15 34 25 14] | R: 164 | R + N: 48 |
| h = [15 34 26 15] | R: 164 | R + N: 44 |
| h = [15 34 31 14] | R: 164 | R + N: 48 |
| h = [15 34 33 15] | R: 164 | R + N: 44 |
| h = [15 35 24 14] | R: 164 | R + N: 48 |
| h = [15 35 27 15] | R: 164 | R + N: 44 |
| h = [15 35 30 14] | R: 164 | R + N: 48 |
| h = [15 35 32 15] | R: 164 | R + N: 44 |
| h = [15 36 24 15] | R: 164 | R + N: 44 |
| h = [15 36 27 14] | R: 164 | R + N: 48 |
| h = [15 36 31 15] | R: 164 | R + N: 44 |
| h = [15 36 33 14] | R: 164 | R + N: 48 |
| h = [15 37 25 15] | R: 164 | R + N: 44 |
| h = [15 37 26 14] | R: 164 | R + N: 48 |
| h = [15 37 30 15] | R: 164 | R + N: 44 |
| h = [15 37 32 14] | R: 164 | R + N: 48 |
| h = [17 20 24 16] | R: 164 | R + N: 48 |
| h = [17 20 24 17] | R: 164 | R + N: 56 |
| h = [17 20 25 16] | R: 168 | R + N: 48 |
| h = [17 20 27 17] | R: 168 | R + N: 56 |
| h = [17 20 30 17] | R: 168 | R + N: 56 |
| h = [17 20 32 16] | R: 164 | R + N: 48 |
| h = [17 20 33 16] | R: 168 | R + N: 48 |
| h = [17 20 33 17] | R: 164 | R + N: 56 |
| h = [17 21 24 16] | R: 168 | R + N: 48 |
| h = [17 21 25 16] | R: 164 | R + N: 48 |
| h = [17 21 25 17] | R: 164 | R + N: 56 |
| h = [17 21 26 17] | R: 168 | R + N: 56 |
| h = [17 21 31 17] | R: 168 | R + N: 56 |
| h = [17 21 32 16] | R: 168 | R + N: 48 |
| h = [17 21 32 17] | R: 164 | R + N: 56 |
| h = [17 21 33 16] | R: 164 | R + N: 48 |
| h = [17 22 25 17] | R: 168 | R + N: 56 |
| h = [17 22 26 16] | R: 164 | R + N: 48 |
| h = [17 22 26 17] | R: 164 | R + N: 56 |
| h = [17 22 27 16] | R: 168 | R + N: 48 |
| h = [17 22 30 16] | R: 164 | R + N: 48 |
| h = [17 22 31 16] | R: 168 | R + N: 48 |
| h = [17 22 31 17] | R: 164 | R + N: 56 |
| h = [17 22 32 17] | R: 168 | R + N: 56 |
| h = [17 23 24 17] | R: 168 | R + N: 56 |
| h = [17 23 26 16] | R: 168 | R + N: 48 |
| h = [17 23 27 16] | R: 164 | R + N: 48 |
| h = [17 23 27 17] | R: 164 | R + N: 56 |
| h = [17 23 30 16] | R: 168 | R + N: 48 |
| h = [17 23 30 17] | R: 164 | R + N: 56 |
| h = [17 23 31 16] | R: 164 | R + N: 48 |
| h = [17 23 33 17] | R: 168 | R + N: 56 |
| h = [17 24 20 16] | R: 164 | R + N: 48 |
| h = [17 24 20 17] | R: 164 | R + N: 56 |
| h = [17 24 21 16] | R: 168 | R + N: 48 |
| h = [17 24 23 17] | R: 168 | R + N: 56 |
| h = [17 24 34 17] | R: 168 | R + N: 56 |
| h = [17 24 36 16] | R: 164 | R + N: 48 |
| h = [17 24 37 16] | R: 168 | R + N: 48 |
| h = [17 24 37 17] | R: 164 | R + N: 56 |
| h = [17 25 20 16] | R: 168 | R + N: 48 |
| h = [17 25 21 16] | R: 164 | R + N: 48 |
| h = [17 25 21 17] | R: 164 | R + N: 56 |
| h = [17 25 22 17] | R: 168 | R + N: 56 |
| h = [17 25 35 17] | R: 168 | R + N: 56 |
| h = [17 25 36 16] | R: 168 | R + N: 48 |
| h = [17 25 36 17] | R: 164 | R + N: 56 |
| h = [17 25 37 16] | R: 168 | R + N: 48 |
| h = [17 26 21 17] | R: 168 | R + N: 56 |
| h = [17 26 22 16] | R: 164 | R + N: 48 |
| h = [17 26 22 17] | R: 164 | R + N: 56 |
| h = [17 26 23 16] | R: 168 | R + N: 48 |
| h = [17 26 34 16] | R: 164 | R + N: 48 |
| h = [17 26 35 16] | R: 168 | R + N: 48 |
| h = [17 26 35 17] | R: 164 | R + N: 56 |
| h = [17 26 36 17] | R: 168 | R + N: 56 |
| h = [17 27 20 16] | R: 168 | R + N: 48 |
| h = [17 27 22 16] | R: 164 | R + N: 48 |
| h = [17 27 23 16] | R: 164 | R + N: 48 |
| h = [17 27 23 17] | R: 164 | R + N: 56 |
| h = [17 27 34 16] | R: 168 | R + N: 48 |
| h = [17 27 34 17] | R: 164 | R + N: 56 |
| h = [17 27 35 16] | R: 164 | R + N: 48 |
| h = [17 27 37 17] | R: 168 | R + N: 56 |
| h = [17 30 20 17] | R: 168 | R + N: 56 |
| h = [17 30 22 16] | R: 164 | R + N: 48 |
| h = [17 30 23 16] | R: 168 | R + N: 48 |
| h = [17 30 23 17] | R: 164 | R + N: 56 |
| h = [17 30 34 16] | R: 164 | R + N: 48 |
| h = [17 30 34 17] | R: 164 | R + N: 56 |
| h = [17 30 35 16] | R: 168 | R + N: 48 |
| h = [17 30 37 17] | R: 168 | R + N: 56 |
| h = [17 31 21 17] | R: 168 | R + N: 56 |
| h = [17 31 22 16] | R: 164 | R + N: 48 |
| h = [17 31 22 17] | R: 164 | R + N: 56 |
| h = [17 31 23 16] | R: 168 | R + N: 48 |
| h = [17 31 34 16] | R: 164 | R + N: 48 |
| h = [17 31 35 16] | R: 168 | R + N: 48 |
| h = [17 31 35 17] | R: 164 | R + N: 56 |
| h = [17 31 36 17] | R: 168 | R + N: 56 |
| h = [17 32 20 16] | R: 164 | R + N: 48 |
| h = [17 32 21 16] | R: 168 | R + N: 48 |
| h = [17 32 21 17] | R: 164 | R + N: 56 |
| h = [17 32 22 17] | R: 168 | R + N: 56 |
| h = [17 32 35 17] | R: 168 | R + N: 56 |
| h = [17 32 36 16] | R: 164 | R + N: 48 |
| h = [17 32 36 17] | R: 164 | R + N: 56 |
| h = [17 32 37 16] | R: 168 | R + N: 48 |
| h = [17 33 20 16] | R: 168 | R + N: 48 |
| h = [17 33 20 17] | R: 164 | R + N: 56 |
| h = [17 33 21 16] | R: 164 | R + N: 48 |
| h = [17 33 23 17] | R: 168 | R + N: 56 |
| h = [17 33 34 17] | R: 168 | R + N: 56 |
| h = [17 33 36 16] | R: 168 | R + N: 48 |
| h = [17 33 37 16] | R: 164 | R + N: 48 |
| h = [17 33 37 17] | R: 164 | R + N: 56 |
| h = [17 34 24 17] | R: 168 | R + N: 56 |
| h = [17 34 26 16] | R: 164 | R + N: 48 |
| h = [17 34 27 16] | R: 164 | R + N: 48 |
| h = [17 34 27 17] | R: 164 | R + N: 56 |
| h = [17 34 30 16] | R: 164 | R + N: 48 |
| h = [17 34 30 17] | R: 164 | R + N: 56 |
| h = [17 34 31 16] | R: 168 | R + N: 48 |
| h = [17 34 33 17] | R: 168 | R + N: 56 |
| h = [17 35 25 17] | R: 168 | R + N: 56 |
| h = [17 35 26 16] | R: 168 | R + N: 48 |
| h = [17 35 26 17] | R: 164 | R + N: 56 |
| h = [17 35 27 16] | R: 164 | R + N: 48 |
| h = [17 35 30 16] | R: 168 | R + N: 48 |
| h = [17 35 31 16] | R: 164 | R + N: 48 |
| h = [17 35 31 17] | R: 164 | R + N: 56 |
| h = [17 35 32 17] | R: 168 | R + N: 56 |
| h = [17 36 24 16] | R: 164 | R + N: 48 |
| h = [17 36 25 16] | R: 168 | R + N: 48 |
| h = [17 36 25 17] | R: 164 | R + N: 56 |
| h = [17 36 26 17] | R: 168 | R + N: 56 |
| h = [17 36 31 17] | R: 168 | R + N: 56 |
| h = [17 36 32 16] | R: 164 | R + N: 48 |
| h = [17 36 32 17] | R: 164 | R + N: 56 |
| h = [17 36 33 16] | R: 168 | R + N: 48 |
| h = [17 37 24 16] | R: 168 | R + N: 48 |
| h = [17 37 24 17] | R: 164 | R + N: 56 |
| h = [17 37 25 16] | R: 164 | R + N: 48 |
| h = [17 37 27 17] | R: 168 | R + N: 56 |

TABLE 1-continued

| | | |
|---|---|---|
| h = [17 37 30 17] | R: 168 | R + N: 56 |
| h = [17 37 32 16] | R: 168 | R + N: 48 |
| h = [17 37 33 16] | R: 164 | R + N: 48 |
| h = [17 37 33 17] | R: 164 | R + N: 56 |
| h = [20 2 25 10] | R: 164 | R + N: 44 |
| h = [20 2 25 15] | R: 164 | R + N: 44 |
| h = [20 2 27 11] | R: 164 | R + N: 44 |
| h = [20 2 27 14] | R: 164 | R + N: 44 |
| h = [20 2 30 15] | R: 164 | R + N: 44 |
| h = [20 2 33 14] | R: 164 | R + N: 44 |
| h = [20 2 35 10] | R: 164 | R + N: 44 |
| h = [20 2 36 11] | R: 164 | R + N: 44 |
| h = [20 3 24 13] | R: 164 | R + N: 56 |
| h = [20 3 24 16] | R: 168 | R + N: 48 |
| h = [20 3 24 17] | R: 168 | R + N: 56 |
| h = [20 3 25 16] | R: 164 | R + N: 48 |
| h = [20 3 26 12] | R: 164 | R + N: 56 |
| h = [20 3 27 12] | R: 168 | R + N: 48 |
| h = [20 3 27 13] | R: 168 | R + N: 56 |
| h = [20 3 27 17] | R: 164 | R + N: 56 |
| h = [20 3 30 17] | R: 164 | R + N: 56 |
| h = [20 3 32 16] | R: 168 | R + N: 48 |
| h = [20 3 33 16] | R: 164 | R + N: 48 |
| h = [20 3 33 17] | R: 168 | R + N: 56 |
| h = [20 3 34 12] | R: 164 | R + N: 48 |
| h = [20 3 34 13] | R: 168 | R + N: 56 |
| h = [20 3 35 12] | R: 168 | R + N: 48 |
| h = [20 3 37 13] | R: 164 | R + N: 56 |
| h = [20 10 24 10] | R: 164 | R + N: 44 |
| h = [20 10 26 11] | R: 164 | R + N: 48 |
| h = [20 10 34 10] | R: 164 | R + N: 44 |
| h = [20 10 37 11] | R: 164 | R + N: 48 |
| h = [20 11 24 10] | R: 164 | R + N: 48 |
| h = [20 11 26 11] | R: 164 | R + N: 44 |
| h = [20 11 34 10] | R: 164 | R + N: 48 |
| h = [20 11 37 11] | R: 164 | R + N: 44 |
| h = [20 13 24 13] | R: 168 | R + N: 56 |
| h = [20 13 26 12] | R: 168 | R + N: 48 |
| h = [20 13 27 12] | R: 164 | R + N: 48 |
| h = [20 13 27 13] | R: 164 | R + N: 56 |
| h = [20 13 34 12] | R: 168 | R + N: 48 |
| h = [20 13 34 13] | R: 164 | R + N: 56 |
| h = [20 13 35 12] | R: 164 | R + N: 48 |
| h = [20 13 37 13] | R: 168 | R + N: 56 |
| h = [20 14 24 14] | R: 164 | R + N: 44 |
| h = [20 14 27 15] | R: 164 | R + N: 48 |
| h = [20 14 30 14] | R: 164 | R + N: 44 |
| h = [20 14 32 15] | R: 164 | R + N: 48 |
| h = [20 15 25 14] | R: 164 | R + N: 48 |
| h = [20 15 26 15] | R: 164 | R + N: 44 |
| h = [20 15 31 14] | R: 164 | R + N: 48 |
| h = [20 15 33 15] | R: 164 | R + N: 44 |
| h = [20 17 24 17] | R: 168 | R + N: 56 |
| h = [20 17 26 16] | R: 164 | R + N: 48 |
| h = [20 17 27 16] | R: 168 | R + N: 48 |
| h = [20 17 27 17] | R: 164 | R + N: 56 |
| h = [20 17 30 16] | R: 164 | R + N: 48 |
| h = [20 17 30 17] | R: 164 | R + N: 56 |
| h = [20 17 31 16] | R: 168 | R + N: 48 |
| h = [20 17 33 17] | R: 168 | R + N: 56 |
| h = [20 22 25 10] | R: 164 | R + N: 44 |
| h = [20 22 26 11] | R: 164 | R + N: 44 |
| h = [20 22 30 5] | R: 164 | R + N: 44 |
| h = [20 22 33 4] | R: 164 | R + N: 44 |
| h = [20 22 35 5] | R: 164 | R + N: 44 |
| h = [20 22 35 10] | R: 164 | R + N: 44 |
| h = [20 22 37 4] | R: 164 | R + N: 44 |
| h = [20 22 37 11] | R: 164 | R + N: 44 |
| h = [20 23 24 12] | R: 164 | R + N: 48 |
| h = [20 23 24 13] | R: 164 | R + N: 56 |
| h = [20 23 25 12] | R: 168 | R + N: 48 |
| h = [20 23 27 13] | R: 164 | R + N: 56 |
| h = [20 23 30 7] | R: 164 | R + N: 56 |
| h = [20 23 32 6] | R: 168 | R + N: 48 |
| h = [20 23 33 6] | R: 164 | R + N: 48 |
| h = [20 23 33 7] | R: 168 | R + N: 56 |
| h = [20 23 34 6] | R: 168 | R + N: 48 |
| h = [20 23 34 7] | R: 168 | R + N: 56 |
| h = [20 23 34 13] | R: 164 | R + N: 56 |
| h = [20 23 35 6] | R: 164 | R + N: 48 |
| h = [20 23 36 12] | R: 164 | R + N: 48 |
| h = [20 23 37 7] | R: 164 | R + N: 56 |
| h = [20 23 37 12] | R: 168 | R + N: 48 |
| h = [20 23 37 13] | R: 168 | R + N: 56 |
| h = [20 24 30 4] | R: 164 | R + N: 44 |
| h = [20 24 32 5] | R: 164 | R + N: 48 |
| h = [20 24 34 4] | R: 164 | R + N: 44 |
| h = [20 24 37 5] | R: 164 | R + N: 48 |
| h = [20 25 31 4] | R: 164 | R + N: 48 |
| h = [20 25 33 5] | R: 164 | R + N: 44 |
| h = [20 25 35 4] | R: 164 | R + N: 48 |
| h = [20 25 36 5] | R: 164 | R + N: 44 |
| h = [20 27 30 6] | R: 164 | R + N: 48 |
| h = [20 27 30 7] | R: 164 | R + N: 56 |
| h = [20 27 31 6] | R: 168 | R + N: 48 |
| h = [20 27 33 7] | R: 168 | R + N: 56 |
| h = [20 27 34 7] | R: 168 | R + N: 56 |
| h = [20 27 36 6] | R: 164 | R + N: 48 |
| h = [20 27 37 6] | R: 168 | R + N: 48 |
| h = [20 27 37 7] | R: 164 | R + N: 56 |
| h = [20 30 24 10] | R: 164 | R + N: 44 |
| h = [20 30 27 11] | R: 164 | R + N: 48 |
| h = [20 30 34 10] | R: 164 | R + N: 44 |
| h = [20 30 36 11] | R: 164 | R + N: 48 |
| h = [20 31 24 10] | R: 164 | R + N: 48 |
| h = [20 31 27 11] | R: 164 | R + N: 44 |
| h = [20 30 34 10] | R: 164 | R + N: 48 |
| h = [20 31 36 11] | R: 164 | R + N: 44 |
| h = [20 33 24 12] | R: 168 | R + N: 48 |
| h = [20 33 24 13] | R: 164 | R + N: 56 |
| h = [20 33 25 12] | R: 164 | R + N: 48 |
| h = [20 33 27 13] | R: 168 | R + N: 56 |
| h = [20 33 34 13] | R: 168 | R + N: 56 |
| h = [20 33 36 12] | R: 164 | R + N: 48 |
| h = [20 33 37 12] | R: 168 | R + N: 48 |
| h = [20 33 37 13] | R: 164 | R + N: 56 |
| h = [21 2 24 10] | R: 164 | R + N: 44 |
| h = [21 2 24 15] | R: 164 | R + N: 44 |
| h = [21 2 26 11] | R: 164 | R + N: 44 |
| h = [21 2 26 14] | R: 164 | R + N: 44 |
| h = [21 2 31 15] | R: 164 | R + N: 44 |
| h = [21 2 32 14] | R: 164 | R + N: 44 |
| h = [21 2 34 10] | R: 164 | R + N: 44 |
| h = [21 2 37 11] | R: 164 | R + N: 44 |
| h = [21 3 24 16] | R: 164 | R + N: 48 |
| h = [21 3 25 13] | R: 164 | R + N: 56 |
| h = [21 3 25 16] | R: 168 | R + N: 48 |
| h = [21 3 25 17] | R: 168 | R + N: 56 |
| h = [21 3 26 12] | R: 168 | R + N: 48 |
| h = [21 3 26 13] | R: 168 | R + N: 56 |
| h = [21 3 26 17] | R: 164 | R + N: 56 |
| h = [21 3 27 12] | R: 164 | R + N: 48 |
| h = [21 3 31 17] | R: 164 | R + N: 56 |
| h = [21 3 32 16] | R: 168 | R + N: 48 |
| h = [21 3 32 17] | R: 168 | R + N: 56 |
| h = [21 3 33 16] | R: 168 | R + N: 48 |
| h = [21 3 34 12] | R: 168 | R + N: 48 |
| h = [21 3 35 12] | R: 164 | R + N: 48 |
| h = [21 3 35 13] | R: 168 | R + N: 56 |
| h = [21 3 36 13] | R: 164 | R + N: 56 |
| h = [21 10 25 10] | R: 164 | R + N: 44 |
| h = [21 10 27 11] | R: 164 | R + N: 48 |
| h = [21 10 35 10] | R: 164 | R + N: 44 |
| h = [21 10 36 11] | R: 164 | R + N: 48 |
| h = [21 11 25 10] | R: 164 | R + N: 48 |
| h = [21 11 27 11] | R: 164 | R + N: 44 |
| h = [21 11 35 10] | R: 164 | R + N: 48 |
| h = [21 11 36 11] | R: 164 | R + N: 44 |
| h = [21 13 25 13] | R: 168 | R + N: 56 |
| h = [21 13 26 12] | R: 164 | R + N: 48 |
| h = [21 13 26 13] | R: 164 | R + N: 56 |
| h = [21 13 27 12] | R: 168 | R + N: 48 |
| h = [21 13 34 12] | R: 164 | R + N: 48 |
| h = [21 13 35 12] | R: 168 | R + N: 48 |
| h = [21 13 35 13] | R: 164 | R + N: 56 |
| h = [21 13 36 13] | R: 168 | R + N: 56 |
| h = [21 14 25 14] | R: 164 | R + N: 44 |
| h = [21 14 26 15] | R: 164 | R + N: 48 |
| h = [21 14 31 14] | R: 164 | R + N: 44 |
| h = [21 14 33 15] | R: 164 | R + N: 48 |

TABLE 1-continued

| h | R | R + N |
|---|---|---|
| h = [21 15 24 14] | R: 164 | R + N: 48 |
| h = [21 15 27 15] | R: 164 | R + N: 44 |
| h = [21 15 30 14] | R: 164 | R + N: 48 |
| h = [21 15 32 15] | R: 164 | R + N: 44 |
| h = [21 17 25 17] | R: 168 | R + N: 56 |
| h = [21 17 26 16] | R: 168 | R + N: 48 |
| h = [21 17 26 17] | R: 164 | R + N: 56 |
| h = [21 17 27 16] | R: 164 | R + N: 48 |
| h = [21 17 30 16] | R: 168 | R + N: 48 |
| h = [21 17 31 16] | R: 164 | R + N: 48 |
| h = [21 17 31 17] | R: 164 | R + N: 56 |
| h = [21 17 32 17] | R: 168 | R + N: 56 |
| h = [21 22 24 12] | R: 168 | R + N: 48 |
| h = [21 22 25 12] | R: 164 | R + N: 48 |
| h = [21 22 25 13] | R: 168 | R + N: 56 |
| h = [21 22 26 13] | R: 164 | R + N: 56 |
| h = [21 22 31 7] | R: 164 | R + N: 56 |
| h = [21 22 32 6] | R: 164 | R + N: 48 |
| h = [21 22 32 7] | R: 168 | R + N: 56 |
| h = [21 22 33 6] | R: 168 | R + N: 48 |
| h = [21 22 34 6] | R: 164 | R + N: 48 |
| h = [21 22 35 6] | R: 168 | R + N: 48 |
| h = [21 22 35 7] | R: 168 | R + N: 56 |
| h = [21 22 35 13] | R: 164 | R + N: 56 |
| h = [21 22 36 7] | R: 164 | R + N: 56 |
| h = [21 22 36 12] | R: 168 | R + N: 48 |
| h = [21 22 36 13] | R: 168 | R + N: 56 |
| h = [21 22 37 12] | R: 164 | R + N: 48 |
| h = [21 23 24 10] | R: 164 | R + N: 44 |
| h = [21 23 27 11] | R: 164 | R + N: 44 |
| h = [21 23 31 5] | R: 164 | R + N: 44 |
| h = [21 23 32 4] | R: 164 | R + N: 44 |
| h = [21 23 34 5] | R: 164 | R + N: 44 |
| h = [21 23 34 10] | R: 164 | R + N: 44 |
| h = [21 23 36 4] | R: 164 | R + N: 44 |
| h = [21 23 36 11] | R: 164 | R + N: 44 |
| h = [21 24 30 4] | R: 164 | R + N: 48 |
| h = [21 24 32 5] | R: 164 | R + N: 44 |
| h = [21 24 34 4] | R: 164 | R + N: 48 |
| h = [21 24 37 5] | R: 164 | R + N: 44 |
| h = [21 25 31 4] | R: 164 | R + N: 44 |
| h = [21 25 33 5] | R: 164 | R + N: 48 |
| h = [21 25 35 4] | R: 164 | R + N: 44 |
| h = [21 25 36 5] | R: 164 | R + N: 48 |
| h = [21 26 30 6] | R: 168 | R + N: 48 |
| h = [21 26 31 6] | R: 164 | R + N: 48 |
| h = [21 26 31 7] | R: 164 | R + N: 56 |
| h = [21 26 32 7] | R: 168 | R + N: 56 |
| h = [21 26 35 7] | R: 168 | R + N: 56 |
| h = [21 26 36 6] | R: 168 | R + N: 48 |
| h = [21 26 36 7] | R: 164 | R + N: 56 |
| h = [21 26 37 6] | R: 164 | R + N: 48 |
| h = [21 30 25 10] | R: 164 | R + N: 48 |
| h = [21 30 26 11] | R: 164 | R + N: 44 |
| h = [21 30 35 10] | R: 164 | R + N: 48 |
| h = [21 30 37 11] | R: 164 | R + N: 44 |
| h = [21 31 25 10] | R: 164 | R + N: 44 |
| h = [21 31 26 11] | R: 164 | R + N: 48 |
| h = [21 31 35 10] | R: 164 | R + N: 44 |
| h = [21 31 37 11] | R: 164 | R + N: 48 |
| h = [21 32 24 12] | R: 164 | R + N: 48 |
| h = [21 32 25 12] | R: 168 | R + N: 48 |
| h = [21 32 25 13] | R: 164 | R + N: 56 |
| h = [21 32 26 13] | R: 168 | R + N: 56 |
| h = [21 32 35 13] | R: 168 | R + N: 56 |
| h = [21 32 36 12] | R: 164 | R + N: 48 |
| h = [21 32 36 13] | R: 164 | R + N: 56 |
| h = [21 32 37 12] | R: 168 | R + N: 48 |
| h = [22 2 25 11] | R: 164 | R + N: 44 |
| h = [22 2 25 14] | R: 164 | R + N: 44 |
| h = [22 2 27 10] | R: 164 | R + N: 44 |
| h = [22 2 27 15] | R: 164 | R + N: 44 |
| h = [22 2 31 14] | R: 164 | R + N: 44 |
| h = [22 2 32 15] | R: 164 | R + N: 44 |
| h = [22 2 34 11] | R: 164 | R + N: 44 |
| h = [22 2 37 10] | R: 164 | R + N: 44 |
| h = [22 3 24 12] | R: 164 | R + N: 48 |
| h = [22 3 25 12] | R: 168 | R + N: 48 |
| h = [22 3 25 13] | R: 168 | R + N: 56 |
| h = [22 3 25 17] | R: 164 | R + N: 56 |
| h = [22 3 26 13] | R: 164 | R + N: 56 |
| h = [22 3 26 16] | R: 168 | R + N: 48 |
| h = [22 3 26 17] | R: 168 | R + N: 56 |
| h = [22 3 27 16] | R: 164 | R + N: 48 |
| h = [22 3 30 16] | R: 168 | R + N: 48 |
| h = [22 3 31 16] | R: 164 | R + N: 48 |
| h = [22 3 31 17] | R: 168 | R + N: 56 |
| h = [22 3 32 17] | R: 164 | R + N: 56 |
| h = [22 3 35 13] | R: 164 | R + N: 56 |
| h = [22 3 36 12] | R: 164 | R + N: 48 |
| h = [22 3 36 13] | R: 168 | R + N: 56 |
| h = [22 3 37 12] | R: 168 | R + N: 48 |
| h = [22 10 24 11] | R: 164 | R + N: 48 |
| h = [22 10 26 10] | R: 164 | R + N: 44 |
| h = [22 10 35 11] | R: 164 | R + N: 48 |
| h = [22 10 36 10] | R: 164 | R + N: 44 |
| h = [22 11 24 11] | R: 164 | R + N: 44 |
| h = [22 11 26 10] | R: 164 | R + N: 48 |
| h = [22 11 35 11] | R: 164 | R + N: 44 |
| h = [22 11 36 10] | R: 164 | R + N: 48 |
| h = [22 13 24 12] | R: 168 | R + N: 48 |
| h = [22 13 25 12] | R: 164 | R + N: 48 |
| h = [22 13 25 13] | R: 164 | R + N: 56 |
| h = [22 13 26 13] | R: 168 | R + N: 56 |
| h = [22 13 35 13] | R: 168 | R + N: 56 |
| h = [22 13 36 12] | R: 168 | R + N: 48 |
| h = [22 13 36 13] | R: 164 | R + N: 56 |
| h = [22 13 37 12] | R: 164 | R + N: 48 |
| h = [22 14 25 15] | R: 164 | R + N: 48 |
| h = [22 14 26 14] | R: 164 | R + N: 44 |
| h = [22 14 30 15] | R: 164 | R + N: 48 |
| h = [22 14 32 14] | R: 164 | R + N: 44 |
| h = [22 15 24 15] | R: 164 | R + N: 48 |
| h = [22 15 27 14] | R: 164 | R + N: 48 |
| h = [22 15 31 15] | R: 164 | R + N: 44 |
| h = [22 15 33 14] | R: 164 | R + N: 48 |
| h = [22 17 24 16] | R: 164 | R + N: 48 |
| h = [22 17 25 16] | R: 168 | R + N: 48 |
| h = [22 17 25 17] | R: 164 | R + N: 56 |
| h = [22 17 26 17] | R: 168 | R + N: 56 |
| h = [22 17 31 17] | R: 168 | R + N: 56 |
| h = [22 17 32 16] | R: 164 | R + N: 48 |
| h = [22 17 32 17] | R: 164 | R + N: 56 |
| h = [22 17 33 16] | R: 168 | R + N: 48 |
| h = [22 20 24 11] | R: 164 | R + N: 44 |
| h = [22 20 27 10] | R: 164 | R + N: 44 |
| h = [22 20 31 4] | R: 164 | R + N: 44 |
| h = [22 20 32 5] | R: 164 | R + N: 44 |
| h = [22 20 35 4] | R: 164 | R + N: 44 |
| h = [22 20 35 11] | R: 164 | R + N: 44 |
| h = [22 20 37 5] | R: 164 | R + N: 44 |
| h = [22 20 37 10] | R: 164 | R + N: 44 |
| h = [22 21 25 13] | R: 164 | R + N: 56 |
| h = [22 21 26 12] | R: 164 | R + N: 48 |
| h = [22 21 26 13] | R: 168 | R + N: 56 |
| h = [22 21 27 12] | R: 168 | R + N: 48 |
| h = [22 21 30 6] | R: 168 | R + N: 48 |
| h = [22 21 31 6] | R: 164 | R + N: 48 |
| h = [22 21 31 7] | R: 168 | R + N: 56 |
| h = [22 21 32 7] | R: 164 | R + N: 56 |
| h = [22 21 34 12] | R: 164 | R + N: 48 |
| h = [22 21 35 7] | R: 164 | R + N: 56 |
| h = [22 21 35 12] | R: 168 | R + N: 48 |
| h = [22 21 35 13] | R: 168 | R + N: 56 |
| h = [22 21 36 6] | R: 168 | R + N: 48 |
| h = [22 21 36 7] | R: 168 | R + N: 56 |
| h = [22 21 36 13] | R: 168 | R + N: 56 |
| h = [22 21 37 6] | R: 164 | R + N: 48 |
| h = [22 25 31 7] | R: 168 | R + N: 56 |
| h = [22 25 32 6] | R: 164 | R + N: 48 |
| h = [22 25 32 7] | R: 168 | R + N: 56 |
| h = [22 25 33 6] | R: 168 | R + N: 48 |
| h = [22 25 34 6] | R: 164 | R + N: 48 |
| h = [22 25 35 6] | R: 168 | R + N: 48 |
| h = [22 25 35 7] | R: 164 | R + N: 56 |
| h = [22 25 36 7] | R: 168 | R + N: 56 |
| h = [22 25 30 5] | R: 164 | R + N: 48 |
| h = [22 26 32 4] | R: 164 | R + N: 44 |
| h = [22 26 35 5] | R: 164 | R + N: 48 |
| h = [22 26 36 4] | R: 164 | R + N: 44 |

TABLE 1-continued

| h | R | R + N |
|---|---|---|
| h = [22 27 31 5] | R: 164 | R + N: 44 |
| h = [22 27 33 4] | R: 164 | R + N: 48 |
| h = [22 27 34 5] | R: 164 | R + N: 44 |
| h = [22 27 37 4] | R: 164 | R + N: 48 |
| h = [22 31 25 13] | R: 168 | R + N: 56 |
| h = [22 31 26 12] | R: 168 | R + N: 48 |
| h = [22 31 26 13] | R: 164 | R + N: 56 |
| h = [22 31 27 12] | R: 164 | R + N: 48 |
| h = [22 31 34 12] | R: 168 | R + N: 48 |
| h = [22 31 35 12] | R: 164 | R + N: 48 |
| h = [22 31 35 13] | R: 164 | R + N: 56 |
| h = [22 31 36 13] | R: 168 | R + N: 56 |
| h = [22 32 25 11] | R: 164 | R + N: 48 |
| h = [22 32 26 10] | R: 164 | R + N: 44 |
| h = [22 32 34 11] | R: 164 | R + N: 48 |
| h = [22 32 36 10] | R: 164 | R + N: 44 |
| h = [22 33 25 11] | R: 164 | R + N: 44 |
| h = [22 33 26 10] | R: 164 | R + N: 48 |
| h = [22 33 34 11] | R: 164 | R + N: 44 |
| h = [22 33 36 10] | R: 164 | R + N: 48 |
| h = [23 2 24 11] | R: 164 | R + N: 44 |
| h = [23 2 24 14] | R: 164 | R + N: 44 |
| h = [23 2 26 10] | R: 164 | R + N: 44 |
| h = [23 2 26 15] | R: 164 | R + N: 44 |
| h = [23 2 30 14] | R: 164 | R + N: 44 |
| h = [23 2 33 15] | R: 164 | R + N: 44 |
| h = [23 2 35 11] | R: 164 | R + N: 44 |
| h = [23 2 36 10] | R: 164 | R + N: 44 |
| h = [23 3 24 12] | R: 168 | R + N: 48 |
| h = [23 3 24 13] | R: 168 | R + N: 56 |
| h = [23 3 24 17] | R: 164 | R + N: 56 |
| h = [23 3 25 12] | R: 164 | R + N: 48 |
| h = [23 3 26 16] | R: 164 | R + N: 48 |
| h = [23 3 27 13] | R: 164 | R + N: 56 |
| h = [23 3 27 16] | R: 168 | R + N: 48 |
| h = [23 3 27 17] | R: 168 | R + N: 56 |
| h = [23 3 30 16] | R: 164 | R + N: 48 |
| h = [23 3 30 17] | R: 168 | R + N: 48 |
| h = [23 3 31 16] | R: 168 | R + N: 48 |
| h = [23 3 33 17] | R: 164 | R + N: 56 |
| h = [23 3 34 13] | R: 164 | R + N: 56 |
| h = [23 3 36 12] | R: 168 | R + N: 48 |
| h = [23 3 37 12] | R: 164 | R + N: 48 |
| h = [23 3 37 13] | R: 168 | R + N: 56 |
| h = [23 10 25 11] | R: 164 | R + N: 48 |
| h = [23 10 27 10] | R: 164 | R + N: 44 |
| h = [23 10 34 11] | R: 164 | R + N: 48 |
| h = [23 10 37 10] | R: 164 | R + N: 44 |
| h = [23 11 25 11] | R: 164 | R + N: 44 |
| h = [23 11 27 10] | R: 164 | R + N: 48 |
| h = [23 11 34 11] | R: 164 | R + N: 44 |
| h = [23 11 37 10] | R: 164 | R + N: 48 |
| h = [23 13 24 12] | R: 164 | R + N: 48 |
| h = [23 13 24 13] | R: 164 | R + N: 56 |
| h = [23 13 25 12] | R: 168 | R + N: 48 |
| h = [23 13 27 13] | R: 168 | R + N: 56 |
| h = [23 13 34 13] | R: 168 | R + N: 56 |
| h = [23 13 36 12] | R: 164 | R + N: 48 |
| h = [23 13 37 12] | R: 168 | R + N: 48 |
| h = [23 13 37 13] | R: 164 | R + N: 56 |
| h = [23 14 24 15] | R: 164 | R + N: 48 |
| h = [23 14 27 14] | R: 164 | R + N: 44 |
| h = [23 14 31 15] | R: 164 | R + N: 48 |
| h = [23 14 33 14] | R: 164 | R + N: 44 |
| h = [23 15 25 15] | R: 164 | R + N: 44 |
| h = [23 15 26 14] | R: 164 | R + N: 48 |
| h = [23 15 30 15] | R: 164 | R + N: 44 |
| h = [23 15 32 14] | R: 164 | R + N: 48 |
| h = [23 17 24 16] | R: 168 | R + N: 48 |
| h = [23 17 24 17] | R: 164 | R + N: 56 |
| h = [23 17 25 16] | R: 164 | R + N: 48 |
| h = [23 17 27 17] | R: 168 | R + N: 56 |
| h = [23 17 30 17] | R: 168 | R + N: 56 |
| h = [23 17 32 16] | R: 168 | R + N: 48 |
| h = [23 17 33 16] | R: 164 | R + N: 48 |
| h = [23 17 33 17] | R: 164 | R + N: 56 |
| h = [23 20 24 13] | R: 164 | R + N: 56 |
| h = [23 20 26 12] | R: 168 | R + N: 48 |
| h = [23 20 27 12] | R: 164 | R + N: 48 |
| h = [23 20 27 13] | R: 168 | R + N: 56 |
| h = [23 20 30 6] | R: 164 | R + N: 48 |
| h = [23 20 30 7] | R: 168 | R + N: 56 |
| h = [23 20 31 6] | R: 168 | R + N: 48 |
| h = [23 20 33 7] | R: 164 | R + N: 56 |
| h = [23 20 34 7] | R: 164 | R + N: 56 |
| h = [23 20 34 12] | R: 168 | R + N: 48 |
| h = [23 20 34 13] | R: 168 | R + N: 56 |
| h = [23 20 35 12] | R: 164 | R + N: 48 |
| h = [23 20 36 6] | R: 164 | R + N: 48 |
| h = [23 20 37 6] | R: 168 | R + N: 48 |
| h = [23 20 37 7] | R: 168 | R + N: 56 |
| h = [23 20 37 13] | R: 164 | R + N: 56 |
| h = [23 21 25 11] | R: 164 | R + N: 44 |
| h = [23 21 26 10] | R: 164 | R + N: 44 |
| h = [23 21 30 4] | R: 164 | R + N: 44 |
| h = [23 21 33 5] | R: 164 | R + N: 44 |
| h = [23 21 34 4] | R: 164 | R + N: 44 |
| h = [23 21 34 11] | R: 164 | R + N: 44 |
| h = [23 21 36 5] | R: 164 | R + N: 44 |
| h = [23 21 36 10] | R: 164 | R + N: 44 |
| h = [23 24 30 7] | R: 168 | R + N: 56 |
| h = [23 24 32 6] | R: 168 | R + N: 48 |
| h = [23 24 33 6] | R: 164 | R + N: 48 |
| h = [23 24 33 7] | R: 164 | R + N: 56 |
| h = [23 24 34 6] | R: 168 | R + N: 48 |
| h = [23 24 34 7] | R: 164 | R + N: 56 |
| h = [23 24 35 6] | R: 164 | R + N: 48 |
| h = [23 24 37 7] | R: 168 | R + N: 56 |
| h = [23 26 30 5] | R: 164 | R + N: 44 |
| h = [23 26 32 4] | R: 164 | R + N: 48 |
| h = [23 26 35 5] | R: 164 | R + N: 44 |
| h = [23 26 36 4] | R: 164 | R + N: 48 |
| h = [23 27 31 5] | R: 164 | R + N: 48 |
| h = [23 27 33 4] | R: 164 | R + N: 44 |
| h = [23 27 34 5] | R: 164 | R + N: 48 |
| h = [23 27 37 4] | R: 164 | R + N: 44 |
| h = [23 30 24 13] | R: 168 | R + N: 56 |
| h = [23 30 26 12] | R: 168 | R + N: 48 |
| h = [23 30 27 12] | R: 168 | R + N: 48 |
| h = [23 30 27 13] | R: 164 | R + N: 56 |
| h = [23 30 34 12] | R: 164 | R + N: 48 |
| h = [23 30 34 13] | R: 164 | R + N: 56 |
| h = [23 30 35 12] | R: 168 | R + N: 48 |
| h = [23 30 37 13] | R: 168 | R + N: 56 |
| h = [23 32 24 11] | R: 164 | R + N: 44 |
| h = [23 32 27 10] | R: 164 | R + N: 48 |
| h = [23 32 35 11] | R: 164 | R + N: 44 |
| h = [23 32 37 10] | R: 164 | R + N: 48 |
| h = [23 33 24 11] | R: 164 | R + N: 48 |
| h = [23 33 27 10] | R: 164 | R + N: 44 |
| h = [23 33 35 11] | R: 164 | R + N: 48 |
| h = [23 33 37 10] | R: 164 | R + N: 44 |
| h = [24 2 21 10] | R: 164 | R + N: 44 |
| h = [24 2 21 15] | R: 164 | R + N: 44 |
| h = [24 2 23 11] | R: 164 | R + N: 44 |
| h = [24 2 23 14] | R: 164 | R + N: 44 |
| h = [24 2 31 10] | R: 164 | R + N: 44 |
| h = [24 2 32 11] | R: 164 | R + N: 44 |
| h = [24 2 34 15] | R: 164 | R + N: 44 |
| h = [24 2 37 14] | R: 164 | R + N: 44 |
| h = [24 3 20 13] | R: 164 | R + N: 56 |
| h = [24 3 20 16] | R: 168 | R + N: 48 |
| h = [24 3 20 17] | R: 168 | R + N: 56 |
| h = [24 3 21 16] | R: 164 | R + N: 48 |
| h = [24 3 22 12] | R: 164 | R + N: 48 |
| h = [24 3 23 12] | R: 168 | R + N: 48 |
| h = [24 3 23 13] | R: 168 | R + N: 56 |
| h = [24 3 23 17] | R: 164 | R + N: 56 |
| h = [24 3 30 12] | R: 164 | R + N: 48 |
| h = [24 3 30 13] | R: 168 | R + N: 56 |
| h = [24 3 31 12] | R: 168 | R + N: 48 |
| h = [24 3 33 13] | R: 164 | R + N: 56 |
| h = [24 3 34 17] | R: 164 | R + N: 56 |
| h = [24 3 36 16] | R: 168 | R + N: 48 |
| h = [24 3 37 16] | R: 164 | R + N: 48 |
| h = [24 3 37 17] | R: 168 | R + N: 56 |
| h = [24 10 20 10] | R: 164 | R + N: 44 |
| h = [24 10 22 11] | R: 164 | R + N: 48 |
| h = [24 10 30 10] | R: 164 | R + N: 44 |
| h = [24 10 33 11] | R: 164 | R + N: 48 |

TABLE 1-continued

| h | R | R + N |
|---|---|---|
| h = [24 11 20 10] | R: 164 | R + N: 48 |
| h = [24 11 22 11] | R: 164 | R + N: 44 |
| h = [24 11 30 10] | R: 164 | R + N: 48 |
| h = [24 11 33 11] | R: 164 | R + N: 44 |
| h = [24 13 20 13] | R: 168 | R + N: 56 |
| h = [24 13 22 12] | R: 168 | R + N: 48 |
| h = [24 13 23 12] | R: 164 | R + N: 48 |
| h = [24 13 23 13] | R: 164 | R + N: 56 |
| h = [24 13 30 12] | R: 168 | R + N: 48 |
| h = [24 13 30 13] | R: 164 | R + N: 56 |
| h = [24 13 31 12] | R: 164 | R + N: 48 |
| h = [24 13 33 13] | R: 168 | R + N: 56 |
| h = [24 14 20 14] | R: 164 | R + N: 44 |
| h = [24 14 23 15] | R: 164 | R + N: 48 |
| h = [24 14 34 14] | R: 164 | R + N: 44 |
| h = [24 14 36 15] | R: 164 | R + N: 48 |
| h = [24 15 21 14] | R: 164 | R + N: 48 |
| h = [24 15 22 15] | R: 164 | R + N: 44 |
| h = [24 15 35 14] | R: 164 | R + N: 48 |
| h = [24 15 37 15] | R: 164 | R + N: 44 |
| h = [24 17 20 17] | R: 168 | R + N: 56 |
| h = [24 17 22 16] | R: 164 | R + N: 48 |
| h = [24 17 23 16] | R: 168 | R + N: 48 |
| h = [24 17 23 17] | R: 164 | R + N: 56 |
| h = [24 17 34 16] | R: 164 | R + N: 48 |
| h = [24 17 34 17] | R: 164 | R + N: 56 |
| h = [24 17 35 16] | R: 168 | R + N: 48 |
| h = [24 17 37 17] | R: 168 | R + N: 56 |
| h = [24 20 30 4] | R: 164 | R + N: 44 |
| h = [24 20 33 5] | R: 164 | R + N: 48 |
| h = [24 20 34 4] | R: 164 | R + N: 44 |
| h = [24 20 36 5] | R: 164 | R + N: 48 |
| h = [24 21 31 4] | R: 164 | R + N: 48 |
| h = [24 21 32 5] | R: 164 | R + N: 44 |
| h = [24 21 35 4] | R: 164 | R + N: 48 |
| h = [24 21 37 5] | R: 164 | R + N: 44 |
| h = [24 23 30 7] | R: 168 | R + N: 56 |
| h = [24 23 32 6] | R: 164 | R + N: 48 |
| h = [24 23 33 6] | R: 168 | R + N: 48 |
| h = [24 23 33 7] | R: 164 | R + N: 56 |
| h = [24 23 34 6] | R: 164 | R + N: 48 |
| h = [24 23 34 7] | R: 164 | R + N: 56 |
| h = [24 23 35 6] | R: 168 | R + N: 48 |
| h = [24 23 37 7] | R: 168 | R + N: 56 |
| h = [24 26 21 10] | R: 164 | R + N: 44 |
| h = [24 26 22 11] | R: 164 | R + N: 44 |
| h = [24 26 31 5] | R: 164 | R + N: 44 |
| h = [24 26 31 10] | R: 164 | R + N: 44 |
| h = [24 26 33 4] | R: 164 | R + N: 44 |
| h = [24 26 33 11] | R: 164 | R + N: 44 |
| h = [24 26 34 5] | R: 164 | R + N: 44 |
| h = [24 26 37 4] | R: 164 | R + N: 44 |
| h = [24 27 20 12] | R: 164 | R + N: 48 |
| h = [24 27 20 13] | R: 168 | R + N: 56 |
| h = [24 27 21 12] | R: 168 | R + N: 48 |
| h = [24 27 23 13] | R: 164 | R + N: 56 |
| h = [24 27 30 6] | R: 168 | R + N: 48 |
| h = [24 27 30 7] | R: 168 | R + N: 56 |
| h = [24 27 30 13] | R: 164 | R + N: 56 |
| h = [24 27 31 6] | R: 164 | R + N: 48 |
| h = [24 27 32 12] | R: 164 | R + N: 48 |
| h = [24 27 33 7] | R: 164 | R + N: 56 |
| h = [24 27 33 12] | R: 168 | R + N: 48 |
| h = [24 27 33 13] | R: 168 | R + N: 56 |
| h = [24 27 34 7] | R: 164 | R + N: 56 |
| h = [24 27 36 6] | R: 168 | R + N: 48 |
| h = [24 27 37 6] | R: 164 | R + N: 48 |
| h = [24 27 37 7] | R: 168 | R + N: 56 |
| h = [24 34 20 10] | R: 164 | R + N: 44 |
| h = [24 34 23 11] | R: 164 | R + N: 48 |
| h = [24 34 30 10] | R: 164 | R + N: 44 |
| h = [24 34 32 11] | R: 164 | R + N: 48 |
| h = [24 35 20 10] | R: 164 | R + N: 48 |
| h = [24 35 23 11] | R: 164 | R + N: 44 |
| h = [24 35 30 10] | R: 164 | R + N: 48 |
| h = [24 35 32 11] | R: 164 | R + N: 44 |
| h = [24 37 20 12] | R: 168 | R + N: 48 |
| h = [24 37 20 13] | R: 164 | R + N: 56 |
| h = [24 37 21 12] | R: 164 | R + N: 48 |
| h = [24 37 23 13] | R: 168 | R + N: 56 |
| h = [24 37 30 13] | R: 168 | R + N: 56 |
| h = [24 37 32 12] | R: 168 | R + N: 48 |
| h = [24 37 33 12] | R: 164 | R + N: 48 |
| h = [24 37 33 13] | R: 164 | R + N: 56 |
| h = [25 2 20 10] | R: 164 | R + N: 44 |
| h = [25 2 20 15] | R: 164 | R + N: 44 |
| h = [25 2 22 11] | R: 164 | R + N: 44 |
| h = [25 2 22 14] | R: 164 | R + N: 44 |
| h = [25 2 30 10] | R: 164 | R + N: 44 |
| h = [25 2 33 11] | R: 164 | R + N: 44 |
| h = [25 2 35 15] | R: 164 | R + N: 44 |
| h = [25 2 36 14] | R: 164 | R + N: 44 |
| h = [25 3 20 16] | R: 164 | R + N: 48 |
| h = [25 3 21 13] | R: 164 | R + N: 56 |
| h = [25 3 21 16] | R: 168 | R + N: 48 |
| h = [25 3 21 17] | R: 168 | R + N: 56 |
| h = [25 3 22 12] | R: 168 | R + N: 48 |
| h = [25 3 22 13] | R: 164 | R + N: 56 |
| h = [25 3 22 17] | R: 164 | R + N: 56 |
| h = [25 3 23 12] | R: 164 | R + N: 48 |
| h = [25 3 30 12] | R: 168 | R + N: 48 |
| h = [25 3 31 12] | R: 164 | R + N: 48 |
| h = [25 3 31 13] | R: 168 | R + N: 56 |
| h = [25 3 32 13] | R: 164 | R + N: 56 |
| h = [25 3 35 17] | R: 164 | R + N: 56 |
| h = [25 3 36 16] | R: 164 | R + N: 48 |
| h = [25 3 36 17] | R: 168 | R + N: 56 |
| h = [25 3 37 16] | R: 168 | R + N: 48 |
| h = [25 10 21 10] | R: 164 | R + N: 44 |
| h = [25 10 23 11] | R: 164 | R + N: 48 |
| h = [25 10 31 10] | R: 164 | R + N: 44 |
| h = [25 10 32 11] | R: 164 | R + N: 48 |
| h = [25 11 21 10] | R: 164 | R + N: 48 |
| h = [25 11 23 11] | R: 164 | R + N: 44 |
| h = [25 11 31 10] | R: 164 | R + N: 48 |
| h = [25 11 32 11] | R: 164 | R + N: 44 |
| h = [25 13 21 13] | R: 168 | R + N: 56 |
| h = [25 13 22 12] | R: 164 | R + N: 48 |
| h = [25 13 22 13] | R: 164 | R + N: 56 |
| h = [25 13 23 12] | R: 168 | R + N: 48 |
| h = [25 13 30 12] | R: 164 | R + N: 48 |
| h = [25 13 31 12] | R: 168 | R + N: 48 |
| h = [25 13 31 13] | R: 164 | R + N: 56 |
| h = [25 13 32 13] | R: 168 | R + N: 56 |
| h = [25 14 21 14] | R: 164 | R + N: 44 |
| h = [25 14 22 15] | R: 164 | R + N: 48 |
| h = [25 14 35 14] | R: 164 | R + N: 44 |
| h = [25 14 37 15] | R: 164 | R + N: 48 |
| h = [25 15 20 14] | R: 164 | R + N: 48 |
| h = [25 15 23 15] | R: 164 | R + N: 44 |
| h = [25 15 34 14] | R: 164 | R + N: 48 |
| h = [25 15 36 15] | R: 164 | R + N: 44 |
| h = [25 17 21 17] | R: 168 | R + N: 56 |
| h = [25 17 22 16] | R: 168 | R + N: 48 |
| h = [25 17 22 17] | R: 164 | R + N: 56 |
| h = [25 17 23 16] | R: 164 | R + N: 48 |
| h = [25 17 34 16] | R: 168 | R + N: 48 |
| h = [25 17 35 16] | R: 164 | R + N: 48 |
| h = [25 17 35 17] | R: 164 | R + N: 56 |
| h = [25 17 36 17] | R: 168 | R + N: 56 |
| h = [25 20 30 4] | R: 164 | R + N: 48 |
| h = [25 20 33 5] | R: 164 | R + N: 44 |
| h = [25 20 34 4] | R: 164 | R + N: 48 |
| h = [25 20 36 5] | R: 164 | R + N: 44 |
| h = [25 21 31 4] | R: 164 | R + N: 44 |
| h = [25 21 32 5] | R: 164 | R + N: 48 |
| h = [25 21 35 4] | R: 164 | R + N: 44 |
| h = [25 21 37 5] | R: 164 | R + N: 48 |
| h = [25 22 31 7] | R: 168 | R + N: 56 |
| h = [25 22 32 6] | R: 164 | R + N: 48 |
| h = [25 22 32 7] | R: 164 | R + N: 56 |
| h = [25 22 33 6] | R: 164 | R + N: 48 |
| h = [25 22 34 6] | R: 168 | R + N: 48 |
| h = [25 22 35 6] | R: 164 | R + N: 48 |
| h = [25 22 35 7] | R: 168 | R + N: 56 |
| h = [25 22 36 7] | R: 164 | R + N: 56 |
| h = [25 26 20 12] | R: 168 | R + N: 48 |
| h = [25 26 21 12] | R: 164 | R + N: 48 |
| h = [25 26 21 13] | R: 168 | R + N: 56 |
| h = [25 26 22 13] | R: 164 | R + N: 56 |

TABLE 1-continued

| h | R | R + N |
|---|---|---|
| h = [25 26 30 6] | R: 164 | R + N: 48 |
| h = [25 26 31 6] | R: 168 | R + N: 48 |
| h = [25 26 31 7] | R: 168 | R + N: 56 |
| h = [25 26 31 13] | R: 164 | R + N: 56 |
| h = [25 26 32 7] | R: 164 | R + N: 56 |
| h = [25 26 32 12] | R: 168 | R + N: 48 |
| h = [25 26 32 13] | R: 168 | R + N: 56 |
| h = [25 26 33 12] | R: 164 | R + N: 48 |
| h = [25 26 35 7] | R: 164 | R + N: 56 |
| h = [25 26 36 6] | R: 164 | R + N: 48 |
| h = [25 26 36 7] | R: 168 | R + N: 56 |
| h = [25 26 37 6] | R: 168 | R + N: 48 |
| h = [25 27 20 10] | R: 164 | R + N: 44 |
| h = [25 27 23 11] | R: 164 | R + N: 44 |
| h = [25 27 30 5] | R: 164 | R + N: 44 |
| h = [25 27 30 10] | R: 164 | R + N: 44 |
| h = [25 27 32 4] | R: 164 | R + N: 44 |
| h = [25 27 32 11] | R: 164 | R + N: 44 |
| h = [25 27 35 5] | R: 164 | R + N: 44 |
| h = [25 27 36 4] | R: 164 | R + N: 44 |
| h = [25 34 21 10] | R: 164 | R + N: 48 |
| h = [25 34 22 11] | R: 164 | R + N: 44 |
| h = [25 34 31 10] | R: 164 | R + N: 48 |
| h = [25 34 33 11] | R: 164 | R + N: 44 |
| h = [25 35 21 10] | R: 164 | R + N: 44 |
| h = [25 35 22 11] | R: 164 | R + N: 48 |
| h = [25 35 31 10] | R: 164 | R + N: 44 |
| h = [25 35 33 11] | R: 164 | R + N: 48 |
| h = [25 36 20 12] | R: 164 | R + N: 48 |
| h = [25 36 21 12] | R: 168 | R + N: 48 |
| h = [25 36 21 13] | R: 164 | R + N: 56 |
| h = [25 36 22 13] | R: 168 | R + N: 56 |
| h = [25 36 31 13] | R: 168 | R + N: 56 |
| h = [25 36 32 12] | R: 164 | R + N: 48 |
| h = [25 36 32 13] | R: 164 | R + N: 56 |
| h = [25 36 33 12] | R: 168 | R + N: 48 |
| h = [26 2 21 11] | R: 164 | R + N: 44 |
| h = [26 2 21 14] | R: 164 | R + N: 44 |
| h = [26 2 23 10] | R: 164 | R + N: 44 |
| h = [26 2 23 15] | R: 164 | R + N: 44 |
| h = [26 2 30 11] | R: 164 | R + N: 44 |
| h = [26 2 33 10] | R: 164 | R + N: 44 |
| h = [26 2 35 14] | R: 164 | R + N: 44 |
| h = [26 2 36 15] | R: 164 | R + N: 44 |
| h = [26 3 20 12] | R: 164 | R + N: 48 |
| h = [26 3 21 12] | R: 168 | R + N: 48 |
| h = [26 3 21 13] | R: 168 | R + N: 56 |
| h = [26 3 21 17] | R: 164 | R + N: 56 |
| h = [26 3 22 13] | R: 164 | R + N: 56 |
| h = [26 3 22 16] | R: 168 | R + N: 48 |
| h = [26 3 22 17] | R: 168 | R + N: 56 |
| h = [26 3 23 16] | R: 164 | R + N: 48 |
| h = [26 3 31 13] | R: 164 | R + N: 56 |
| h = [26 3 32 12] | R: 164 | R + N: 48 |
| h = [26 3 32 13] | R: 168 | R + N: 56 |
| h = [26 3 33 12] | R: 168 | R + N: 48 |
| h = [26 3 34 16] | R: 168 | R + N: 48 |
| h = [26 3 35 16] | R: 164 | R + N: 48 |
| h = [26 3 35 17] | R: 168 | R + N: 56 |
| h = [26 3 36 17] | R: 164 | R + N: 56 |
| h = [26 10 20 11] | R: 164 | R + N: 48 |
| h = [26 10 22 10] | R: 164 | R + N: 44 |
| h = [26 10 31 11] | R: 164 | R + N: 48 |
| h = [26 10 32 10] | R: 164 | R + N: 44 |
| h = [26 11 20 11] | R: 164 | R + N: 44 |
| h = [26 11 22 10] | R: 164 | R + N: 48 |
| h = [26 11 31 11] | R: 164 | R + N: 44 |
| h = [26 11 32 10] | R: 164 | R + N: 48 |
| h = [26 13 20 12] | R: 168 | R + N: 48 |
| h = [26 13 21 12] | R: 164 | R + N: 48 |
| h = [26 13 21 13] | R: 164 | R + N: 56 |
| h = [26 13 22 13] | R: 168 | R + N: 56 |
| h = [26 13 31 13] | R: 168 | R + N: 56 |
| h = [26 13 32 12] | R: 168 | R + N: 48 |
| h = [26 13 32 13] | R: 168 | R + N: 56 |
| h = [26 13 33 12] | R: 164 | R + N: 48 |
| h = [26 14 21 15] | R: 164 | R + N: 48 |
| h = [26 14 22 14] | R: 164 | R + N: 44 |
| h = [26 14 34 15] | R: 164 | R + N: 48 |
| h = [26 14 36 14] | R: 164 | R + N: 44 |
| h = [26 15 20 15] | R: 164 | R + N: 44 |
| h = [26 15 23 14] | R: 164 | R + N: 48 |
| h = [26 15 35 15] | R: 164 | R + N: 44 |
| h = [26 15 37 14] | R: 164 | R + N: 48 |
| h = [26 17 20 16] | R: 164 | R + N: 48 |
| h = [26 17 21 16] | R: 168 | R + N: 48 |
| h = [26 17 21 17] | R: 164 | R + N: 56 |
| h = [26 17 22 17] | R: 168 | R + N: 56 |
| h = [26 17 35 17] | R: 168 | R + N: 56 |
| h = [26 17 36 16] | R: 164 | R + N: 48 |
| h = [26 17 36 17] | R: 164 | R + N: 56 |
| h = [26 17 37 16] | R: 168 | R + N: 48 |
| h = [26 21 30 6] | R: 164 | R + N: 48 |
| h = [26 21 31 6] | R: 168 | R + N: 48 |
| h = [26 21 31 7] | R: 164 | R + N: 56 |
| h = [26 21 32 7] | R: 168 | R + N: 56 |
| h = [26 21 35 7] | R: 168 | R + N: 56 |
| h = [26 21 36 6] | R: 164 | R + N: 48 |
| h = [26 21 36 7] | R: 164 | R + N: 56 |
| h = [26 21 37 6] | R: 168 | R + N: 48 |
| h = [26 22 31 5] | R: 164 | R + N: 48 |
| h = [26 22 32 4] | R: 164 | R + N: 44 |
| h = [26 22 34 5] | R: 164 | R + N: 48 |
| h = [26 22 36 4] | R: 164 | R + N: 44 |
| h = [26 23 30 5] | R: 164 | R + N: 44 |
| h = [26 23 33 4] | R: 164 | R + N: 48 |
| h = [26 23 35 5] | R: 164 | R + N: 44 |
| h = [26 23 37 4] | R: 164 | R + N: 48 |
| h = [26 24 20 11] | R: 164 | R + N: 44 |
| h = [26 24 23 10] | R: 164 | R + N: 44 |
| h = [26 24 31 4] | R: 164 | R + N: 44 |
| h = [26 24 31 11] | R: 164 | R + N: 44 |
| h = [26 24 33 5] | R: 164 | R + N: 44 |
| h = [26 24 33 10] | R: 164 | R + N: 44 |
| h = [26 24 35 4] | R: 164 | R + N: 44 |
| h = [26 24 36 5] | R: 164 | R + N: 44 |
| h = [26 25 21 13] | R: 164 | R + N: 56 |
| h = [26 25 22 12] | R: 164 | R + N: 48 |
| h = [26 25 22 13] | R: 168 | R + N: 56 |
| h = [26 25 23 12] | R: 168 | R + N: 48 |
| h = [26 25 30 12] | R: 164 | R + N: 48 |
| h = [26 25 31 7] | R: 164 | R + N: 56 |
| h = [26 25 31 12] | R: 168 | R + N: 48 |
| h = [26 25 31 13] | R: 168 | R + N: 56 |
| h = [26 25 32 6] | R: 164 | R + N: 48 |
| h = [26 25 32 7] | R: 168 | R + N: 56 |
| h = [26 25 32 13] | R: 164 | R + N: 56 |
| h = [26 25 33 6] | R: 164 | R + N: 48 |
| h = [26 25 34 6] | R: 168 | R + N: 48 |
| h = [26 25 35 6] | R: 164 | R + N: 48 |
| h = [26 25 35 7] | R: 168 | R + N: 56 |
| h = [26 25 36 7] | R: 164 | R + N: 56 |
| h = [26 35 21 13] | R: 168 | R + N: 56 |
| h = [26 35 22 12] | R: 168 | R + N: 48 |
| h = [26 35 22 13] | R: 164 | R + N: 56 |
| h = [26 35 23 12] | R: 164 | R + N: 48 |
| h = [26 35 30 12] | R: 168 | R + N: 48 |
| h = [26 35 31 12] | R: 164 | R + N: 48 |
| h = [26 35 31 13] | R: 164 | R + N: 56 |
| h = [26 35 32 13] | R: 168 | R + N: 56 |
| h = [26 36 21 11] | R: 164 | R + N: 48 |
| h = [26 36 22 10] | R: 164 | R + N: 44 |
| h = [26 36 30 11] | R: 164 | R + N: 48 |
| h = [26 36 32 10] | R: 164 | R + N: 44 |
| h = [26 37 21 11] | R: 164 | R + N: 44 |
| h = [26 37 22 10] | R: 164 | R + N: 48 |
| h = [26 37 30 11] | R: 164 | R + N: 44 |
| h = [26 37 32 10] | R: 164 | R + N: 48 |
| h = [27 2 20 11] | R: 164 | R + N: 44 |
| h = [27 2 20 14] | R: 164 | R + N: 44 |
| h = [27 2 22 10] | R: 164 | R + N: 44 |
| h = [27 2 22 15] | R: 164 | R + N: 44 |
| h = [27 2 31 11] | R: 164 | R + N: 44 |
| h = [27 2 32 10] | R: 164 | R + N: 44 |
| h = [26 2 34 14] | R: 164 | R + N: 44 |
| h = [26 2 37 15] | R: 164 | R + N: 44 |
| h = [27 3 20 12] | R: 168 | R + N: 48 |
| h = [27 3 20 13] | R: 168 | R + N: 56 |
| h = [27 3 20 17] | R: 164 | R + N: 56 |
| h = [27 3 21 12] | R: 164 | R + N: 48 |

TABLE 1-continued

| | | |
|---|---|---|
| h = [27 3 22 16] | R: 164 | R + N: 48 |
| h = [27 3 23 13] | R: 164 | R + N: 56 |
| h = [27 3 23 16] | R: 168 | R + N: 48 |
| h = [27 3 23 17] | R: 168 | R + N: 56 |
| h = [27 3 30 13] | R: 164 | R + N: 56 |
| h = [27 3 32 12] | R: 168 | R + N: 48 |
| h = [27 3 33 12] | R: 168 | R + N: 48 |
| h = [27 3 33 13] | R: 168 | R + N: 56 |
| h = [27 3 34 16] | R: 164 | R + N: 48 |
| h = [27 3 34 17] | R: 168 | R + N: 56 |
| h = [27 3 35 16] | R: 168 | R + N: 48 |
| h = [27 3 37 17] | R: 164 | R + N: 56 |
| h = [27 10 21 11] | R: 164 | R + N: 48 |
| h = [27 10 23 10] | R: 164 | R + N: 44 |
| h = [27 10 30 11] | R: 164 | R + N: 48 |
| h = [27 10 33 10] | R: 164 | R + N: 44 |
| h = [27 11 21 11] | R: 164 | R + N: 44 |
| h = [27 11 23 10] | R: 164 | R + N: 48 |
| h = [27 11 30 11] | R: 164 | R + N: 44 |
| h = [27 11 33 10] | R: 164 | R + N: 48 |
| h = [27 13 20 12] | R: 164 | R + N: 48 |
| h = [27 13 20 13] | R: 164 | R + N: 56 |
| h = [27 13 21 12] | R: 168 | R + N: 48 |
| h = [27 13 23 13] | R: 168 | R + N: 56 |
| h = [27 13 30 13] | R: 168 | R + N: 56 |
| h = [27 13 32 12] | R: 164 | R + N: 48 |
| h = [27 13 33 12] | R: 168 | R + N: 48 |
| h = [27 13 33 13] | R: 164 | R + N: 56 |
| h = [27 14 20 15] | R: 164 | R + N: 48 |
| h = [27 14 23 14] | R: 164 | R + N: 44 |
| h = [27 14 35 15] | R: 164 | R + N: 48 |
| h = [27 14 37 14] | R: 164 | R + N: 44 |
| h = [27 15 21 15] | R: 164 | R + N: 44 |
| h = [27 15 22 14] | R: 164 | R + N: 48 |
| h = [27 15 34 15] | R: 164 | R + N: 44 |
| h = [27 15 36 14] | R: 164 | R + N: 48 |
| h = [27 17 20 16] | R: 168 | R + N: 48 |
| h = [27 17 20 17] | R: 164 | R + N: 56 |
| h = [27 17 21 16] | R: 164 | R + N: 48 |
| h = [27 17 23 17] | R: 168 | R + N: 56 |
| h = [27 17 34 17] | R: 168 | R + N: 56 |
| h = [27 17 36 16] | R: 168 | R + N: 48 |
| h = [27 17 37 16] | R: 164 | R + N: 48 |
| h = [27 17 37 17] | R: 164 | R + N: 56 |
| h = [27 20 30 6] | R: 168 | R + N: 48 |
| h = [27 20 30 7] | R: 164 | R + N: 56 |
| h = [27 20 31 6] | R: 164 | R + N: 48 |
| h = [27 20 33 7] | R: 168 | R + N: 56 |
| h = [27 20 34 7] | R: 168 | R + N: 56 |
| h = [27 20 36 6] | R: 168 | R + N: 48 |
| h = [27 20 37 6] | R: 164 | R + N: 48 |
| h = [27 20 37 7] | R: 164 | R + N: 56 |
| h = [27 22 31 5] | R: 164 | R + N: 44 |
| h = [27 22 32 4] | R: 164 | R + N: 48 |
| h = [27 22 34 5] | R: 164 | R + N: 44 |
| h = [27 22 36 4] | R: 164 | R + N: 48 |
| h = [27 23 30 5] | R: 164 | R + N: 48 |
| h = [27 23 33 4] | R: 164 | R + N: 48 |
| h = [27 23 35 5] | R: 164 | R + N: 48 |
| h = [27 23 37 4] | R: 164 | R + N: 44 |
| h = [27 24 20 13] | R: 164 | R + N: 56 |
| h = [27 24 22 12] | R: 168 | R + N: 48 |
| h = [27 24 23 12] | R: 164 | R + N: 48 |
| h = [27 24 23 13] | R: 168 | R + N: 56 |
| h = [27 24 30 7] | R: 164 | R + N: 56 |
| h = [27 24 30 12] | R: 168 | R + N: 48 |
| h = [27 24 30 13] | R: 168 | R + N: 56 |
| h = [27 24 31 12] | R: 164 | R + N: 48 |
| h = [27 24 32 6] | R: 164 | R + N: 48 |
| h = [27 24 33 6] | R: 168 | R + N: 48 |
| h = [27 24 33 7] | R: 168 | R + N: 56 |
| h = [27 24 33 13] | R: 164 | R + N: 56 |
| h = [27 24 34 6] | R: 164 | R + N: 48 |
| h = [27 24 34 7] | R: 164 | R + N: 56 |
| h = [27 24 35 6] | R: 168 | R + N: 48 |
| h = [27 24 37 7] | R: 164 | R + N: 56 |
| h = [27 25 21 11] | R: 164 | R + N: 44 |
| h = [27 25 22 10] | R: 164 | R + N: 44 |
| h = [27 25 30 4] | R: 164 | R + N: 44 |
| h = [27 25 30 11] | R: 164 | R + N: 44 |
| h = [27 25 32 5] | R: 164 | R + N: 44 |
| h = [27 25 32 10] | R: 164 | R + N: 44 |
| h = [27 25 34 4] | R: 164 | R + N: 44 |
| h = [27 25 37 5] | R: 164 | R + N: 44 |
| h = [27 34 20 13] | R: 168 | R + N: 56 |
| h = [27 34 22 12] | R: 164 | R + N: 48 |
| h = [27 34 23 12] | R: 168 | R + N: 48 |
| h = [27 34 23 13] | R: 164 | R + N: 56 |
| h = [27 34 30 12] | R: 164 | R + N: 48 |
| h = [27 34 30 13] | R: 164 | R + N: 56 |
| h = [27 34 31 12] | R: 168 | R + N: 48 |
| h = [27 34 33 13] | R: 168 | R + N: 56 |
| h = [27 36 20 11] | R: 164 | R + N: 44 |
| h = [27 36 23 10] | R: 164 | R + N: 48 |
| h = [27 36 31 11] | R: 164 | R + N: 44 |
| h = [27 36 33 10] | R: 164 | R + N: 48 |
| h = [27 37 20 11] | R: 164 | R + N: 48 |
| h = [27 37 23 10] | R: 164 | R + N: 44 |
| h = [27 37 31 11] | R: 164 | R + N: 48 |
| h = [27 37 33 10] | R: 164 | R + N: 44 |
| h = [30 2 20 15] | R: 164 | R + N: 44 |
| h = [30 2 23 14] | R: 164 | R + N: 44 |
| h = [30 2 25 10] | R: 164 | R + N: 44 |
| h = [30 2 26 11] | R: 164 | R + N: 48 |
| h = [30 2 35 10] | R: 164 | R + N: 44 |
| h = [30 2 35 15] | R: 164 | R + N: 44 |
| h = [30 2 37 11] | R: 164 | R + N: 44 |
| h = [30 2 37 14] | R: 164 | R + N: 44 |
| h = [30 3 20 17] | R: 164 | R + N: 56 |
| h = [30 3 22 16] | R: 168 | R + N: 48 |
| h = [30 3 23 16] | R: 164 | R + N: 48 |
| h = [30 3 23 17] | R: 168 | R + N: 56 |
| h = [30 3 24 12] | R: 164 | R + N: 48 |
| h = [30 3 24 13] | R: 168 | R + N: 56 |
| h = [30 3 25 12] | R: 168 | R + N: 48 |
| h = [30 3 27 13] | R: 164 | R + N: 56 |
| h = [30 3 34 13] | R: 164 | R + N: 56 |
| h = [30 3 34 16] | R: 168 | R + N: 48 |
| h = [30 3 34 17] | R: 168 | R + N: 56 |
| h = [30 3 35 16] | R: 164 | R + N: 48 |
| h = [30 3 36 12] | R: 164 | R + N: 48 |
| h = [30 3 37 12] | R: 168 | R + N: 48 |
| h = [30 3 37 13] | R: 168 | R + N: 56 |
| h = [30 10 24 10] | R: 164 | R + N: 44 |
| h = [30 10 27 11] | R: 164 | R + N: 48 |
| h = [30 10 34 10] | R: 164 | R + N: 44 |
| h = [30 10 36 11] | R: 164 | R + N: 48 |
| h = [30 11 24 10] | R: 164 | R + N: 48 |
| h = [30 11 27 11] | R: 164 | R + N: 44 |
| h = [30 11 34 10] | R: 164 | R + N: 48 |
| h = [30 11 36 11] | R: 164 | R + N: 44 |
| h = [30 13 24 12] | R: 168 | R + N: 48 |
| h = [30 13 24 13] | R: 164 | R + N: 56 |
| h = [30 13 25 12] | R: 168 | R + N: 48 |
| h = [30 13 27 13] | R: 168 | R + N: 56 |
| h = [30 13 34 13] | R: 168 | R + N: 56 |
| h = [30 13 36 12] | R: 168 | R + N: 48 |
| h = [30 13 37 12] | R: 164 | R + N: 48 |
| h = [30 13 37 13] | R: 164 | R + N: 56 |
| h = [30 14 20 14] | R: 164 | R + N: 44 |
| h = [30 14 22 15] | R: 164 | R + N: 48 |
| h = [30 14 34 14] | R: 164 | R + N: 44 |
| h = [30 14 37 15] | R: 164 | R + N: 48 |
| h = [30 15 21 14] | R: 164 | R + N: 48 |
| h = [30 15 23 15] | R: 164 | R + N: 44 |
| h = [30 15 35 14] | R: 164 | R + N: 48 |
| h = [30 15 36 15] | R: 164 | R + N: 44 |
| h = [30 17 20 16] | R: 164 | R + N: 48 |
| h = [30 17 20 17] | R: 164 | R + N: 56 |
| h = [30 17 21 16] | R: 168 | R + N: 48 |
| h = [30 17 23 17] | R: 168 | R + N: 56 |
| h = [30 17 34 17] | R: 168 | R + N: 56 |
| h = [30 17 36 16] | R: 164 | R + N: 48 |
| h = [30 17 37 16] | R: 168 | R + N: 48 |
| h = [30 17 37 17] | R: 164 | R + N: 56 |
| h = [30 20 24 10] | R: 164 | R + N: 44 |
| h = [30 20 26 11] | R: 164 | R + N: 48 |
| h = [30 20 34 10] | R: 164 | R + N: 44 |
| h = [30 20 37 11] | R: 164 | R + N: 48 |
| h = [30 21 24 10] | R: 164 | R + N: 48 |

TABLE 1-continued

| h | R | R + N |
|---|---|---|
| h = [30 21 26 11] | R: 164 | R + N: 44 |
| h = [30 21 34 10] | R: 164 | R + N: 48 |
| h = [30 21 37 11] | R: 164 | R + N: 44 |
| h = [30 23 24 13] | R: 168 | R + N: 56 |
| h = [30 23 26 12] | R: 168 | R + N: 48 |
| h = [30 23 27 12] | R: 164 | R + N: 48 |
| h = [30 23 27 13] | R: 164 | R + N: 56 |
| h = [30 23 34 12] | R: 168 | R + N: 48 |
| h = [30 23 34 13] | R: 164 | R + N: 56 |
| h = [30 23 35 12] | R: 164 | R + N: 48 |
| h = [30 23 37 13] | R: 168 | R + N: 56 |
| h = [30 32 20 5] | R: 164 | R + N: 44 |
| h = [30 32 23 4] | R: 164 | R + N: 44 |
| h = [30 32 25 5] | R: 164 | R + N: 44 |
| h = [30 32 25 10] | R: 164 | R + N: 44 |
| h = [30 32 27 4] | R: 164 | R + N: 44 |
| h = [30 32 27 11] | R: 164 | R + N: 44 |
| h = [30 32 35 10] | R: 164 | R + N: 44 |
| h = [30 32 36 11] | R: 164 | R + N: 44 |
| h = [30 33 20 7] | R: 164 | R + N: 56 |
| h = [30 33 22 6] | R: 168 | R + N: 48 |
| h = [30 33 23 6] | R: 164 | R + N: 48 |
| h = [30 33 23 7] | R: 168 | R + N: 56 |
| h = [30 33 24 6] | R: 168 | R + N: 48 |
| h = [30 33 24 7] | R: 168 | R + N: 56 |
| h = [30 33 24 13] | R: 164 | R + N: 56 |
| h = [30 33 25 6] | R: 164 | R + N: 48 |
| h = [30 33 26 12] | R: 164 | R + N: 48 |
| h = [30 33 27 7] | R: 164 | R + N: 56 |
| h = [30 33 27 12] | R: 168 | R + N: 48 |
| h = [30 33 27 13] | R: 168 | R + N: 56 |
| h = [30 33 34 12] | R: 164 | R + N: 48 |
| h = [30 33 34 13] | R: 168 | R + N: 56 |
| h = [30 33 35 12] | R: 168 | R + N: 48 |
| h = [30 33 37 13] | R: 164 | R + N: 56 |
| h = [30 34 20 4] | R: 164 | R + N: 44 |
| h = [30 34 22 5] | R: 164 | R + N: 48 |
| h = [30 34 24 4] | R: 164 | R + N: 44 |
| h = [30 34 27 5] | R: 164 | R + N: 48 |
| h = [30 35 21 4] | R: 164 | R + N: 48 |
| h = [30 35 23 5] | R: 164 | R + N: 44 |
| h = [30 35 25 4] | R: 164 | R + N: 48 |
| h = [30 35 26 5] | R: 164 | R + N: 44 |
| h = [30 37 20 6] | R: 164 | R + N: 48 |
| h = [30 37 20 7] | R: 164 | R + N: 56 |
| h = [30 37 21 6] | R: 168 | R + N: 48 |
| h = [30 37 23 7] | R: 168 | R + N: 56 |
| h = [30 37 24 7] | R: 168 | R + N: 56 |
| h = [30 37 26 6] | R: 164 | R + N: 48 |
| h = [30 37 27 6] | R: 168 | R + N: 48 |
| h = [30 37 27 7] | R: 164 | R + N: 56 |
| h = [31 2 21 15] | R: 164 | R + N: 44 |
| h = [31 2 22 14] | R: 164 | R + N: 44 |
| h = [31 2 24 10] | R: 164 | R + N: 44 |
| h = [31 2 27 11] | R: 164 | R + N: 44 |
| h = [31 2 34 10] | R: 164 | R + N: 44 |
| h = [31 2 34 15] | R: 164 | R + N: 44 |
| h = [31 2 36 11] | R: 164 | R + N: 44 |
| h = [31 2 36 14] | R: 164 | R + N: 44 |
| h = [31 3 21 17] | R: 164 | R + N: 56 |
| h = [31 3 22 16] | R: 164 | R + N: 48 |
| h = [31 3 22 17] | R: 168 | R + N: 56 |
| h = [31 3 23 16] | R: 168 | R + N: 48 |
| h = [31 3 24 12] | R: 168 | R + N: 48 |
| h = [31 3 25 12] | R: 164 | R + N: 48 |
| h = [31 3 25 13] | R: 168 | R + N: 56 |
| h = [31 3 26 13] | R: 164 | R + N: 56 |
| h = [31 3 34 16] | R: 164 | R + N: 48 |
| h = [31 3 35 13] | R: 164 | R + N: 56 |
| h = [31 3 35 16] | R: 168 | R + N: 48 |
| h = [31 3 35 17] | R: 168 | R + N: 56 |
| h = [31 3 36 12] | R: 168 | R + N: 48 |
| h = [31 3 36 13] | R: 168 | R + N: 56 |
| h = [31 3 36 17] | R: 164 | R + N: 56 |
| h = [31 3 37 12] | R: 164 | R + N: 48 |
| h = [31 10 25 10] | R: 164 | R + N: 44 |
| h = [31 10 26 11] | R: 164 | R + N: 48 |
| h = [31 10 35 10] | R: 164 | R + N: 44 |
| h = [31 10 37 11] | R: 164 | R + N: 48 |
| h = [31 11 25 10] | R: 164 | R + N: 48 |
| h = [31 11 26 11] | R: 164 | R + N: 44 |
| h = [31 11 35 10] | R: 164 | R + N: 48 |
| h = [31 11 37 11] | R: 164 | R + N: 44 |
| h = [31 13 24 12] | R: 164 | R + N: 48 |
| h = [31 13 25 12] | R: 168 | R + N: 48 |
| h = [31 13 25 13] | R: 164 | R + N: 56 |
| h = [31 13 26 13] | R: 168 | R + N: 56 |
| h = [31 13 35 13] | R: 168 | R + N: 56 |
| h = [31 13 36 12] | R: 164 | R + N: 48 |
| h = [31 13 36 13] | R: 164 | R + N: 56 |
| h = [31 13 37 12] | R: 168 | R + N: 48 |
| h = [31 14 21 14] | R: 164 | R + N: 44 |
| h = [31 14 23 15] | R: 164 | R + N: 48 |
| h = [31 14 35 14] | R: 164 | R + N: 44 |
| h = [31 14 36 15] | R: 164 | R + N: 48 |
| h = [31 15 20 14] | R: 164 | R + N: 48 |
| h = [31 15 22 15] | R: 164 | R + N: 44 |
| h = [31 15 34 14] | R: 164 | R + N: 48 |
| h = [31 15 37 15] | R: 164 | R + N: 44 |
| h = [31 17 20 16] | R: 168 | R + N: 48 |
| h = [31 17 21 16] | R: 164 | R + N: 48 |
| h = [31 17 21 17] | R: 164 | R + N: 56 |
| h = [31 17 22 17] | R: 168 | R + N: 56 |
| h = [31 17 35 17] | R: 168 | R + N: 56 |
| h = [31 17 36 16] | R: 168 | R + N: 48 |
| h = [31 17 36 17] | R: 164 | R + N: 56 |
| h = [31 17 37 16] | R: 164 | R + N: 48 |
| h = [31 20 25 10] | R: 164 | R + N: 48 |
| h = [31 20 27 11] | R: 164 | R + N: 44 |
| h = [31 20 35 10] | R: 164 | R + N: 48 |
| h = [31 20 36 11] | R: 164 | R + N: 44 |
| h = [31 21 25 10] | R: 164 | R + N: 44 |
| h = [31 21 27 11] | R: 164 | R + N: 48 |
| h = [31 21 35 10] | R: 164 | R + N: 44 |
| h = [31 21 36 11] | R: 164 | R + N: 48 |
| h = [31 22 25 13] | R: 168 | R + N: 56 |
| h = [31 22 26 12] | R: 164 | R + N: 48 |
| h = [31 22 26 13] | R: 164 | R + N: 56 |
| h = [31 22 27 12] | R: 168 | R + N: 48 |
| h = [31 22 34 12] | R: 164 | R + N: 48 |
| h = [31 22 35 12] | R: 168 | R + N: 48 |
| h = [31 22 35 13] | R: 164 | R + N: 56 |
| h = [31 22 36 13] | R: 168 | R + N: 56 |
| h = [31 32 21 7] | R: 164 | R + N: 56 |
| h = [31 32 22 6] | R: 164 | R + N: 48 |
| h = [31 32 22 7] | R: 168 | R + N: 56 |
| h = [31 32 23 6] | R: 168 | R + N: 48 |
| h = [31 32 24 6] | R: 164 | R + N: 48 |
| h = [31 32 25 6] | R: 164 | R + N: 48 |
| h = [31 32 25 7] | R: 168 | R + N: 56 |
| h = [31 32 25 13] | R: 164 | R + N: 56 |
| h = [31 32 26 7] | R: 164 | R + N: 56 |
| h = [31 32 26 12] | R: 168 | R + N: 48 |
| h = [31 32 26 13] | R: 168 | R + N: 56 |
| h = [31 32 27 12] | R: 164 | R + N: 48 |
| h = [31 32 34 12] | R: 164 | R + N: 48 |
| h = [31 32 35 12] | R: 164 | R + N: 48 |
| h = [31 32 35 13] | R: 168 | R + N: 56 |
| h = [31 32 36 13] | R: 164 | R + N: 56 |
| h = [31 33 21 5] | R: 164 | R + N: 44 |
| h = [31 33 22 4] | R: 164 | R + N: 44 |
| h = [31 33 24 5] | R: 164 | R + N: 44 |
| h = [31 33 24 10] | R: 164 | R + N: 44 |
| h = [31 33 26 4] | R: 164 | R + N: 44 |
| h = [31 33 26 11] | R: 164 | R + N: 44 |
| h = [31 33 34 10] | R: 164 | R + N: 44 |
| h = [31 33 37 11] | R: 164 | R + N: 44 |
| h = [31 34 20 4] | R: 164 | R + N: 48 |
| h = [31 34 22 5] | R: 164 | R + N: 44 |
| h = [31 34 24 4] | R: 164 | R + N: 48 |
| h = [31 34 27 5] | R: 164 | R + N: 44 |
| h = [31 35 21 4] | R: 164 | R + N: 44 |
| h = [31 35 23 5] | R: 164 | R + N: 48 |
| h = [31 35 25 4] | R: 164 | R + N: 44 |
| h = [31 35 26 5] | R: 164 | R + N: 48 |
| h = [31 36 20 6] | R: 168 | R + N: 48 |
| h = [31 36 21 6] | R: 164 | R + N: 48 |
| h = [31 36 21 7] | R: 164 | R + N: 56 |
| h = [31 36 22 7] | R: 168 | R + N: 56 |
| h = [31 36 25 7] | R: 168 | R + N: 56 |

TABLE 1-continued

| h | R | R + N |
|---|---|---|
| h = [31 36 26 6] | R: 168 | R + N: 48 |
| h = [31 36 26 7] | R: 164 | R + N: 56 |
| h = [31 36 27 6] | R: 164 | R + N: 48 |
| h = [32 2 21 14] | R: 164 | R + N: 44 |
| h = [32 2 22 15] | R: 164 | R + N: 44 |
| h = [32 2 24 11] | R: 164 | R + N: 44 |
| h = [32 2 27 10] | R: 164 | R + N: 44 |
| h = [32 2 35 11] | R: 164 | R + N: 44 |
| h = [32 2 35 14] | R: 164 | R + N: 44 |
| h = [32 2 37 10] | R: 164 | R + N: 44 |
| h = [32 2 37 15] | R: 164 | R + N: 44 |
| h = [32 3 20 16] | R: 168 | R + N: 48 |
| h = [32 3 21 16] | R: 164 | R + N: 48 |
| h = [32 3 21 17] | R: 168 | R + N: 56 |
| h = [32 3 22 17] | R: 164 | R + N: 56 |
| h = [32 3 25 13] | R: 164 | R + N: 56 |
| h = [32 3 26 12] | R: 164 | R + N: 48 |
| h = [32 3 26 13] | R: 168 | R + N: 56 |
| h = [32 3 27 12] | R: 168 | R + N: 48 |
| h = [32 3 34 12] | R: 164 | R + N: 48 |
| h = [32 3 35 12] | R: 168 | R + N: 48 |
| h = [32 3 35 13] | R: 168 | R + N: 56 |
| h = [32 3 35 17] | R: 164 | R + N: 56 |
| h = [32 3 36 13] | R: 164 | R + N: 56 |
| h = [32 3 36 16] | R: 168 | R + N: 48 |
| h = [32 3 36 17] | R: 168 | R + N: 56 |
| h = [32 3 37 16] | R: 164 | R + N: 48 |
| h = [32 10 25 11] | R: 164 | R + N: 48 |
| h = [32 10 26 10] | R: 164 | R + N: 44 |
| h = [32 10 34 11] | R: 164 | R + N: 48 |
| h = [32 10 36 10] | R: 164 | R + N: 44 |
| h = [32 11 25 11] | R: 164 | R + N: 44 |
| h = [32 11 26 10] | R: 164 | R + N: 48 |
| h = [32 11 34 11] | R: 164 | R + N: 44 |
| h = [32 11 36 10] | R: 164 | R + N: 48 |
| h = [32 13 25 13] | R: 168 | R + N: 56 |
| h = [32 13 26 12] | R: 168 | R + N: 48 |
| h = [32 13 26 13] | R: 164 | R + N: 56 |
| h = [32 13 27 12] | R: 164 | R + N: 48 |
| h = [32 13 34 12] | R: 168 | R + N: 48 |
| h = [32 13 35 12] | R: 164 | R + N: 48 |
| h = [32 13 35 13] | R: 164 | R + N: 56 |
| h = [32 13 36 13] | R: 168 | R + N: 56 |
| h = [32 14 20 15] | R: 164 | R + N: 48 |
| h = [32 14 22 14] | R: 164 | R + N: 44 |
| h = [32 14 35 15] | R: 164 | R + N: 48 |
| h = [32 14 36 14] | R: 164 | R + N: 44 |
| h = [32 15 21 15] | R: 164 | R + N: 44 |
| h = [32 15 23 14] | R: 164 | R + N: 48 |
| h = [32 15 34 15] | R: 164 | R + N: 44 |
| h = [32 15 37 14] | R: 164 | R + N: 48 |
| h = [32 17 21 17] | R: 168 | R + N: 56 |
| h = [32 17 22 16] | R: 164 | R + N: 48 |
| h = [32 17 22 17] | R: 164 | R + N: 56 |
| h = [32 17 23 16] | R: 168 | R + N: 48 |
| h = [32 17 34 16] | R: 164 | R + N: 48 |
| h = [32 17 35 16] | R: 168 | R + N: 48 |
| h = [32 17 35 17] | R: 164 | R + N: 56 |
| h = [32 17 36 17] | R: 168 | R + N: 56 |
| h = [32 21 24 12] | R: 168 | R + N: 48 |
| h = [32 21 25 12] | R: 164 | R + N: 48 |
| h = [32 21 25 13] | R: 164 | R + N: 56 |
| h = [32 21 26 13] | R: 168 | R + N: 56 |
| h = [32 21 35 13] | R: 168 | R + N: 56 |
| h = [32 21 36 12] | R: 168 | R + N: 48 |
| h = [32 21 36 13] | R: 164 | R + N: 56 |
| h = [32 21 37 12] | R: 164 | R + N: 48 |
| h = [32 22 24 11] | R: 164 | R + N: 48 |
| h = [32 22 26 10] | R: 164 | R + N: 44 |
| h = [32 22 35 11] | R: 164 | R + N: 48 |
| h = [32 22 36 10] | R: 164 | R + N: 44 |
| h = [32 23 24 11] | R: 164 | R + N: 44 |
| h = [32 23 26 10] | R: 164 | R + N: 48 |
| h = [32 23 35 11] | R: 164 | R + N: 44 |
| h = [32 23 36 10] | R: 164 | R + N: 48 |
| h = [32 30 21 4] | R: 164 | R + N: 44 |
| h = [32 30 22 5] | R: 164 | R + N: 44 |
| h = [32 30 25 4] | R: 164 | R + N: 44 |
| h = [32 30 25 11] | R: 164 | R + N: 44 |
| h = [32 30 27 5] | R: 164 | R + N: 44 |
| h = [32 30 27 10] | R: 164 | R + N: 44 |
| h = [32 30 34 11] | R: 164 | R + N: 44 |
| h = [32 30 37 10] | R: 164 | R + N: 44 |
| h = [32 31 20 6] | R: 168 | R + N: 48 |
| h = [32 31 21 6] | R: 164 | R + N: 48 |
| h = [32 31 21 7] | R: 168 | R + N: 56 |
| h = [32 31 22 7] | R: 164 | R + N: 56 |
| h = [32 31 24 12] | R: 164 | R + N: 48 |
| h = [32 31 25 7] | R: 164 | R + N: 56 |
| h = [32 31 25 12] | R: 168 | R + N: 48 |
| h = [32 31 25 13] | R: 168 | R + N: 56 |
| h = [32 31 26 6] | R: 168 | R + N: 48 |
| h = [32 31 26 7] | R: 168 | R + N: 56 |
| h = [32 31 26 13] | R: 164 | R + N: 56 |
| h = [32 31 27 6] | R: 164 | R + N: 48 |
| h = [32 31 35 13] | R: 164 | R + N: 56 |
| h = [32 31 36 12] | R: 164 | R + N: 48 |
| h = [32 31 36 13] | R: 168 | R + N: 56 |
| h = [32 31 37 12] | R: 168 | R + N: 48 |
| h = [32 35 21 7] | R: 168 | R + N: 56 |
| h = [32 35 22 6] | R: 164 | R + N: 48 |
| h = [32 35 22 7] | R: 164 | R + N: 56 |
| h = [32 35 23 6] | R: 168 | R + N: 48 |
| h = [32 35 24 6] | R: 164 | R + N: 48 |
| h = [32 35 25 7] | R: 164 | R + N: 56 |
| h = [32 35 26 7] | R: 168 | R + N: 56 |
| h = [32 36 20 5] | R: 164 | R + N: 48 |
| h = [32 36 22 4] | R: 164 | R + N: 44 |
| h = [32 36 25 5] | R: 164 | R + N: 48 |
| h = [32 36 26 4] | R: 164 | R + N: 44 |
| h = [32 37 21 5] | R: 164 | R + N: 44 |
| h = [32 37 23 4] | R: 164 | R + N: 48 |
| h = [32 37 24 5] | R: 164 | R + N: 44 |
| h = [32 37 27 4] | R: 164 | R + N: 48 |
| h = [33 2 20 14] | R: 164 | R + N: 44 |
| h = [33 2 23 15] | R: 164 | R + N: 44 |
| h = [33 2 25 11] | R: 164 | R + N: 44 |
| h = [33 2 26 10] | R: 164 | R + N: 44 |
| h = [33 2 34 11] | R: 164 | R + N: 44 |
| h = [33 2 34 14] | R: 164 | R + N: 44 |
| h = [33 2 36 10] | R: 164 | R + N: 44 |
| h = [33 2 36 15] | R: 164 | R + N: 44 |
| h = [33 3 20 16] | R: 164 | R + N: 48 |
| h = [33 3 20 17] | R: 168 | R + N: 56 |
| h = [33 3 21 16] | R: 168 | R + N: 48 |
| h = [33 3 23 17] | R: 164 | R + N: 56 |
| h = [33 3 24 13] | R: 164 | R + N: 56 |
| h = [33 3 26 12] | R: 168 | R + N: 48 |
| h = [33 3 27 12] | R: 164 | R + N: 48 |
| h = [33 3 27 13] | R: 168 | R + N: 56 |
| h = [33 3 34 12] | R: 168 | R + N: 48 |
| h = [33 3 34 17] | R: 164 | R + N: 56 |
| h = [33 3 35 12] | R: 164 | R + N: 48 |
| h = [33 3 36 16] | R: 164 | R + N: 48 |
| h = [33 3 37 13] | R: 164 | R + N: 56 |
| h = [33 3 37 16] | R: 164 | R + N: 48 |
| h = [33 3 37 17] | R: 168 | R + N: 56 |
| h = [33 10 24 11] | R: 164 | R + N: 48 |
| h = [33 10 27 10] | R: 164 | R + N: 44 |
| h = [33 10 35 11] | R: 164 | R + N: 48 |
| h = [33 10 37 10] | R: 164 | R + N: 44 |
| h = [33 11 24 11] | R: 164 | R + N: 44 |
| h = [33 11 27 10] | R: 164 | R + N: 48 |
| h = [33 11 35 11] | R: 164 | R + N: 44 |
| h = [33 11 37 10] | R: 164 | R + N: 48 |
| h = [33 13 24 13] | R: 168 | R + N: 56 |
| h = [33 13 26 12] | R: 164 | R + N: 48 |
| h = [33 13 27 12] | R: 168 | R + N: 48 |
| h = [33 13 27 13] | R: 164 | R + N: 56 |
| h = [33 13 34 12] | R: 164 | R + N: 48 |
| h = [33 13 34 13] | R: 164 | R + N: 56 |
| h = [33 13 35 12] | R: 168 | R + N: 48 |
| h = [33 13 37 13] | R: 168 | R + N: 56 |
| h = [33 14 21 15] | R: 164 | R + N: 48 |
| h = [33 14 23 14] | R: 164 | R + N: 48 |
| h = [33 14 34 15] | R: 164 | R + N: 48 |
| h = [33 14 37 14] | R: 164 | R + N: 44 |
| h = [33 15 20 15] | R: 164 | R + N: 44 |
| h = [33 15 22 14] | R: 164 | R + N: 48 |
| h = [33 15 35 15] | R: 164 | R + N: 44 |

TABLE 1-continued

| h | R | R + N |
|---|---|---|
| h = [33 15 36 14] | R: 164 | R + N: 48 |
| h = [33 17 20 17] | R: 168 | R + N: 56 |
| h = [33 17 22 16] | R: 168 | R + N: 48 |
| h = [33 17 23 16] | R: 164 | R + N: 48 |
| h = [33 17 23 17] | R: 164 | R + N: 56 |
| h = [33 17 34 16] | R: 168 | R + N: 48 |
| h = [33 17 34 17] | R: 164 | R + N: 56 |
| h = [33 17 35 16] | R: 164 | R + N: 48 |
| h = [33 17 37 17] | R: 168 | R + N: 56 |
| h = [33 20 24 12] | R: 164 | R + N: 48 |
| h = [33 20 24 13] | R: 164 | R + N: 56 |
| h = [33 20 25 12] | R: 168 | R + N: 48 |
| h = [33 20 27 13] | R: 168 | R + N: 56 |
| h = [33 20 34 13] | R: 168 | R + N: 56 |
| h = [33 20 36 12] | R: 164 | R + N: 48 |
| h = [33 20 37 12] | R: 168 | R + N: 48 |
| h = [33 20 37 13] | R: 164 | R + N: 56 |
| h = [33 22 25 11] | R: 164 | R + N: 44 |
| h = [33 22 27 10] | R: 164 | R + N: 48 |
| h = [33 22 34 11] | R: 164 | R + N: 44 |
| h = [33 22 37 10] | R: 164 | R + N: 48 |
| h = [33 23 25 11] | R: 164 | R + N: 48 |
| h = [33 23 27 10] | R: 164 | R + N: 44 |
| h = [33 23 34 11] | R: 164 | R + N: 48 |
| h = [33 23 37 10] | R: 164 | R + N: 44 |
| h = [33 30 20 6] | R: 164 | R + N: 48 |
| h = [33 30 20 7] | R: 168 | R + N: 56 |
| h = [33 30 21 6] | R: 168 | R + N: 48 |
| h = [33 30 23 7] | R: 164 | R + N: 56 |
| h = [33 30 24 7] | R: 164 | R + N: 56 |
| h = [33 30 24 12] | R: 168 | R + N: 48 |
| h = [33 30 24 13] | R: 168 | R + N: 56 |
| h = [33 30 25 12] | R: 164 | R + N: 48 |
| h = [33 30 26 6] | R: 164 | R + N: 48 |
| h = [33 30 27 6] | R: 168 | R + N: 48 |
| h = [33 30 27 7] | R: 168 | R + N: 56 |
| h = [33 30 27 13] | R: 164 | R + N: 56 |
| h = [33 30 34 13] | R: 164 | R + N: 56 |
| h = [33 30 36 12] | R: 168 | R + N: 48 |
| h = [33 30 37 12] | R: 164 | R + N: 48 |
| h = [33 30 37 13] | R: 168 | R + N: 56 |
| h = [33 31 20 4] | R: 164 | R + N: 44 |
| h = [33 31 23 5] | R: 164 | R + N: 44 |
| h = [33 31 24 4] | R: 164 | R + N: 44 |
| h = [33 31 24 11] | R: 164 | R + N: 44 |
| h = [33 31 26 5] | R: 164 | R + N: 44 |
| h = [33 31 26 10] | R: 164 | R + N: 44 |
| h = [33 31 35 11] | R: 164 | R + N: 44 |
| h = [33 31 36 10] | R: 164 | R + N: 44 |
| h = [33 34 20 7] | R: 168 | R + N: 56 |
| h = [33 34 22 6] | R: 168 | R + N: 48 |
| h = [33 34 23 6] | R: 164 | R + N: 48 |
| h = [33 34 23 7] | R: 164 | R + N: 56 |
| h = [33 34 24 6] | R: 168 | R + N: 48 |
| h = [33 34 24 7] | R: 164 | R + N: 56 |
| h = [33 34 25 6] | R: 164 | R + N: 48 |
| h = [33 34 27 7] | R: 168 | R + N: 56 |
| h = [33 36 20 5] | R: 164 | R + N: 44 |
| h = [33 36 22 4] | R: 164 | R + N: 48 |
| h = [33 36 25 5] | R: 164 | R + N: 44 |
| h = [33 36 26 4] | R: 164 | R + N: 48 |
| h = [33 37 21 5] | R: 164 | R + N: 48 |
| h = [33 37 23 4] | R: 164 | R + N: 44 |
| h = [33 37 24 5] | R: 164 | R + N: 48 |
| h = [33 37 27 4] | R: 164 | R + N: 44 |
| h = [34 2 21 10] | R: 164 | R + N: 44 |
| h = [34 2 22 11] | R: 164 | R + N: 44 |
| h = [34 2 24 15] | R: 164 | R + N: 44 |
| h = [34 2 27 14] | R: 164 | R + N: 44 |
| h = [34 2 31 10] | R: 164 | R + N: 44 |
| h = [34 2 31 15] | R: 164 | R + N: 44 |
| h = [34 2 33 11] | R: 164 | R + N: 44 |
| h = [34 2 33 14] | R: 164 | R + N: 44 |
| h = [34 3 20 12] | R: 164 | R + N: 48 |
| h = [34 3 20 13] | R: 168 | R + N: 56 |
| h = [34 3 21 12] | R: 168 | R + N: 48 |
| h = [34 3 23 13] | R: 164 | R + N: 56 |
| h = [34 3 24 17] | R: 164 | R + N: 56 |
| h = [34 3 26 16] | R: 168 | R + N: 48 |
| h = [34 3 27 16] | R: 164 | R + N: 48 |
| h = [34 3 27 17] | R: 168 | R + N: 56 |
| h = [34 3 30 13] | R: 164 | R + N: 56 |
| h = [34 3 30 16] | R: 168 | R + N: 48 |
| h = [34 3 30 17] | R: 168 | R + N: 56 |
| h = [34 3 31 16] | R: 164 | R + N: 48 |
| h = [34 3 32 12] | R: 164 | R + N: 48 |
| h = [34 3 33 12] | R: 168 | R + N: 48 |
| h = [34 3 33 13] | R: 168 | R + N: 56 |
| h = [34 3 33 17] | R: 164 | R + N: 56 |
| h = [34 10 20 10] | R: 164 | R + N: 44 |
| h = [34 10 23 11] | R: 164 | R + N: 48 |
| h = [34 10 30 10] | R: 164 | R + N: 44 |
| h = [34 10 32 11] | R: 164 | R + N: 48 |
| h = [34 11 20 10] | R: 164 | R + N: 48 |
| h = [34 11 23 11] | R: 164 | R + N: 44 |
| h = [34 11 30 10] | R: 164 | R + N: 48 |
| h = [34 11 32 11] | R: 164 | R + N: 44 |
| h = [34 13 20 12] | R: 168 | R + N: 48 |
| h = [34 13 20 13] | R: 164 | R + N: 56 |
| h = [34 13 21 12] | R: 164 | R + N: 48 |
| h = [34 13 23 13] | R: 168 | R + N: 56 |
| h = [34 13 30 13] | R: 168 | R + N: 56 |
| h = [34 13 32 12] | R: 168 | R + N: 48 |
| h = [34 13 33 12] | R: 164 | R + N: 48 |
| h = [34 13 33 13] | R: 164 | R + N: 56 |
| h = [34 14 24 14] | R: 164 | R + N: 48 |
| h = [34 14 26 15] | R: 164 | R + N: 48 |
| h = [34 14 30 14] | R: 164 | R + N: 44 |
| h = [34 14 33 15] | R: 164 | R + N: 48 |
| h = [34 15 25 14] | R: 164 | R + N: 48 |
| h = [34 15 27 15] | R: 164 | R + N: 44 |
| h = [34 15 31 14] | R: 164 | R + N: 48 |
| h = [34 15 32 15] | R: 164 | R + N: 44 |
| h = [34 17 24 16] | R: 164 | R + N: 48 |
| h = [34 17 24 17] | R: 164 | R + N: 56 |
| h = [34 17 25 16] | R: 168 | R + N: 48 |
| h = [34 17 27 17] | R: 168 | R + N: 56 |
| h = [34 17 30 17] | R: 168 | R + N: 56 |
| h = [34 17 32 16] | R: 164 | R + N: 48 |
| h = [34 17 33 16] | R: 168 | R + N: 48 |
| h = [34 17 33 17] | R: 164 | R + N: 56 |
| h = [34 24 20 10] | R: 164 | R + N: 44 |
| h = [34 24 22 11] | R: 164 | R + N: 48 |
| h = [34 24 30 10] | R: 164 | R + N: 44 |
| h = [34 24 33 11] | R: 164 | R + N: 48 |
| h = [34 25 20 10] | R: 164 | R + N: 48 |
| h = [34 25 22 11] | R: 164 | R + N: 44 |
| h = [34 25 30 10] | R: 164 | R + N: 48 |
| h = [34 25 33 11] | R: 164 | R + N: 44 |
| h = [34 27 20 13] | R: 168 | R + N: 56 |
| h = [34 27 22 12] | R: 168 | R + N: 48 |
| h = [34 27 23 12] | R: 164 | R + N: 48 |
| h = [34 27 23 13] | R: 164 | R + N: 56 |
| h = [34 27 30 12] | R: 168 | R + N: 48 |
| h = [34 27 30 13] | R: 168 | R + N: 56 |
| h = [34 27 31 12] | R: 164 | R + N: 48 |
| h = [34 27 33 13] | R: 168 | R + N: 56 |
| h = [34 30 20 4] | R: 164 | R + N: 44 |
| h = [34 30 23 5] | R: 164 | R + N: 48 |
| h = [34 30 24 4] | R: 164 | R + N: 44 |
| h = [34 30 26 5] | R: 164 | R + N: 48 |
| h = [34 31 21 4] | R: 164 | R + N: 48 |
| h = [34 31 22 5] | R: 164 | R + N: 44 |
| h = [34 31 25 4] | R: 164 | R + N: 48 |
| h = [34 31 27 5] | R: 164 | R + N: 44 |
| h = [34 33 20 7] | R: 168 | R + N: 56 |
| h = [34 33 22 6] | R: 164 | R + N: 48 |
| h = [34 33 23 6] | R: 168 | R + N: 48 |
| h = [34 33 23 7] | R: 164 | R + N: 56 |
| h = [34 33 24 6] | R: 164 | R + N: 48 |
| h = [34 33 24 7] | R: 164 | R + N: 56 |
| h = [34 33 25 6] | R: 168 | R + N: 48 |
| h = [34 33 27 7] | R: 168 | R + N: 56 |
| h = [34 36 21 5] | R: 164 | R + N: 44 |
| h = [34 36 21 10] | R: 164 | R + N: 44 |
| h = [34 36 23 4] | R: 164 | R + N: 44 |
| h = [34 36 23 11] | R: 164 | R + N: 44 |
| h = [34 36 24 5] | R: 164 | R + N: 44 |
| h = [34 36 27 4] | R: 164 | R + N: 44 |
| h = [34 36 31 10] | R: 164 | R + N: 44 |

TABLE 1-continued

| | | |
|---|---|---|
| h = [34 36 32 11] | R: 164 | R + N: 44 |
| h = [34 37 20 6] | R: 168 | R + N: 48 |
| h = [34 37 20 7] | R: 168 | R + N: 56 |
| h = [34 37 20 13] | R: 164 | R + N: 56 |
| h = [34 37 21 6] | R: 164 | R + N: 48 |
| h = [34 37 22 12] | R: 164 | R + N: 48 |
| h = [34 37 23 7] | R: 164 | R + N: 56 |
| h = [34 37 23 12] | R: 168 | R + N: 48 |
| h = [34 37 23 13] | R: 168 | R + N: 56 |
| h = [34 37 24 7] | R: 164 | R + N: 56 |
| h = [34 37 26 6] | R: 168 | R + N: 48 |
| h = [34 37 27 6] | R: 164 | R + N: 48 |
| h = [34 37 27 7] | R: 168 | R + N: 56 |
| h = [34 37 30 12] | R: 164 | R + N: 48 |
| h = [34 37 30 13] | R: 168 | R + N: 56 |
| h = [34 37 31 12] | R: 168 | R + N: 48 |
| h = [34 37 33 13] | R: 164 | R + N: 56 |
| h = [35 2 20 10] | R: 164 | R + N: 44 |
| h = [35 2 23 11] | R: 164 | R + N: 44 |
| h = [35 2 25 15] | R: 164 | R + N: 44 |
| h = [35 2 26 14] | R: 164 | R + N: 44 |
| h = [35 2 30 10] | R: 164 | R + N: 44 |
| h = [35 2 30 15] | R: 164 | R + N: 44 |
| h = [35 2 32 11] | R: 164 | R + N: 44 |
| h = [35 2 32 14] | R: 164 | R + N: 44 |
| h = [35 3 20 12] | R: 168 | R + N: 48 |
| h = [35 3 21 12] | R: 164 | R + N: 48 |
| h = [35 3 21 13] | R: 168 | R + N: 56 |
| h = [35 3 22 13] | R: 164 | R + N: 56 |
| h = [35 3 25 17] | R: 164 | R + N: 56 |
| h = [35 3 26 16] | R: 164 | R + N: 48 |
| h = [35 3 26 17] | R: 168 | R + N: 56 |
| h = [35 3 27 16] | R: 168 | R + N: 48 |
| h = [35 3 30 16] | R: 164 | R + N: 48 |
| h = [35 3 31 13] | R: 164 | R + N: 56 |
| h = [35 3 31 16] | R: 168 | R + N: 48 |
| h = [35 3 31 17] | R: 168 | R + N: 56 |
| h = [35 3 32 12] | R: 168 | R + N: 48 |
| h = [35 3 32 13] | R: 168 | R + N: 56 |
| h = [35 3 32 17] | R: 164 | R + N: 56 |
| h = [35 3 33 12] | R: 164 | R + N: 48 |
| h = [35 10 21 10] | R: 164 | R + N: 44 |
| h = [35 10 22 11] | R: 164 | R + N: 48 |
| h = [35 10 31 10] | R: 164 | R + N: 44 |
| h = [35 10 33 11] | R: 164 | R + N: 48 |
| h = [35 11 21 10] | R: 164 | R + N: 48 |
| h = [35 11 22 11] | R: 164 | R + N: 44 |
| h = [35 11 31 10] | R: 164 | R + N: 48 |
| h = [35 11 33 11] | R: 164 | R + N: 44 |
| h = [35 13 20 12] | R: 164 | R + N: 48 |
| h = [35 13 21 12] | R: 168 | R + N: 48 |
| h = [35 13 21 13] | R: 164 | R + N: 56 |
| h = [35 13 22 13] | R: 168 | R + N: 56 |
| h = [35 13 31 13] | R: 168 | R + N: 56 |
| h = [35 13 32 12] | R: 164 | R + N: 48 |
| h = [35 13 32 13] | R: 164 | R + N: 56 |
| h = [35 13 33 12] | R: 168 | R + N: 48 |
| h = [35 14 25 14] | R: 164 | R + N: 44 |
| h = [35 14 27 15] | R: 164 | R + N: 48 |
| h = [35 14 31 14] | R: 164 | R + N: 44 |
| h = [35 14 32 15] | R: 164 | R + N: 48 |
| h = [35 15 24 14] | R: 164 | R + N: 48 |
| h = [35 15 26 15] | R: 164 | R + N: 44 |
| h = [35 15 30 14] | R: 164 | R + N: 48 |
| h = [35 15 33 15] | R: 164 | R + N: 44 |
| h = [35 17 24 16] | R: 168 | R + N: 48 |
| h = [35 17 25 16] | R: 164 | R + N: 48 |
| h = [35 17 25 17] | R: 164 | R + N: 56 |
| h = [35 17 26 17] | R: 168 | R + N: 56 |
| h = [35 17 31 17] | R: 168 | R + N: 56 |
| h = [35 17 32 16] | R: 168 | R + N: 48 |
| h = [35 17 32 17] | R: 164 | R + N: 56 |
| h = [35 17 33 16] | R: 164 | R + N: 48 |
| h = [35 24 21 10] | R: 164 | R + N: 48 |
| h = [35 24 23 11] | R: 164 | R + N: 48 |
| h = [35 24 31 10] | R: 164 | R + N: 48 |
| h = [35 24 32 11] | R: 164 | R + N: 44 |
| h = [35 25 21 10] | R: 164 | R + N: 44 |
| h = [35 25 23 11] | R: 164 | R + N: 48 |
| h = [35 25 31 10] | R: 164 | R + N: 44 |
| h = [35 25 32 11] | R: 164 | R + N: 44 |
| h = [35 26 21 13] | R: 168 | R + N: 56 |
| h = [35 26 22 12] | R: 164 | R + N: 48 |
| h = [35 26 22 13] | R: 168 | R + N: 56 |
| h = [35 26 23 12] | R: 168 | R + N: 48 |
| h = [35 26 30 12] | R: 164 | R + N: 48 |
| h = [35 26 31 12] | R: 168 | R + N: 48 |
| h = [35 26 31 13] | R: 164 | R + N: 56 |
| h = [35 26 32 13] | R: 168 | R + N: 56 |
| h = [35 30 20 4] | R: 164 | R + N: 48 |
| h = [35 30 23 5] | R: 164 | R + N: 44 |
| h = [35 30 24 4] | R: 164 | R + N: 48 |
| h = [35 30 26 5] | R: 164 | R + N: 44 |
| h = [35 31 21 4] | R: 164 | R + N: 44 |
| h = [35 31 22 5] | R: 164 | R + N: 48 |
| h = [35 31 25 4] | R: 164 | R + N: 44 |
| h = [35 31 27 5] | R: 164 | R + N: 48 |
| h = [35 32 21 7] | R: 168 | R + N: 56 |
| h = [35 32 22 6] | R: 168 | R + N: 48 |
| h = [35 32 22 7] | R: 164 | R + N: 56 |
| h = [35 32 23 6] | R: 164 | R + N: 48 |
| h = [35 32 24 6] | R: 168 | R + N: 48 |
| h = [35 32 25 6] | R: 164 | R + N: 48 |
| h = [35 32 25 7] | R: 164 | R + N: 56 |
| h = [35 32 26 7] | R: 168 | R + N: 56 |
| h = [35 36 20 6] | R: 164 | R + N: 48 |
| h = [35 36 21 6] | R: 164 | R + N: 48 |
| h = [35 36 21 7] | R: 168 | R + N: 56 |
| h = [35 36 21 13] | R: 164 | R + N: 56 |
| h = [35 36 22 7] | R: 164 | R + N: 56 |
| h = [35 36 22 12] | R: 164 | R + N: 48 |
| h = [35 36 22 13] | R: 168 | R + N: 56 |
| h = [35 36 23 12] | R: 164 | R + N: 48 |
| h = [35 36 25 7] | R: 164 | R + N: 56 |
| h = [35 36 26 6] | R: 164 | R + N: 48 |
| h = [35 36 26 7] | R: 168 | R + N: 56 |
| h = [35 36 27 6] | R: 168 | R + N: 48 |
| h = [35 36 30 12] | R: 168 | R + N: 48 |
| h = [35 36 31 12] | R: 164 | R + N: 48 |
| h = [35 36 31 13] | R: 168 | R + N: 56 |
| h = [35 36 32 13] | R: 164 | R + N: 56 |
| h = [35 37 20 5] | R: 164 | R + N: 44 |
| h = [35 37 20 10] | R: 164 | R + N: 44 |
| h = [35 37 22 4] | R: 164 | R + N: 44 |
| h = [35 37 22 11] | R: 164 | R + N: 44 |
| h = [35 37 25 5] | R: 164 | R + N: 44 |
| h = [35 37 26 4] | R: 164 | R + N: 44 |
| h = [35 37 30 10] | R: 164 | R + N: 44 |
| h = [35 37 33 11] | R: 164 | R + N: 44 |
| h = [36 2 20 11] | R: 164 | R + N: 44 |
| h = [36 2 23 10] | R: 164 | R + N: 44 |
| h = [36 2 25 14] | R: 164 | R + N: 44 |
| h = [36 2 26 15] | R: 164 | R + N: 44 |
| h = [36 2 31 11] | R: 164 | R + N: 44 |
| h = [36 2 31 14] | R: 164 | R + N: 44 |
| h = [36 2 33 10] | R: 164 | R + N: 44 |
| h = [36 2 33 15] | R: 164 | R + N: 44 |
| h = [36 3 21 13] | R: 164 | R + N: 56 |
| h = [36 3 22 12] | R: 164 | R + N: 48 |
| h = [36 3 22 13] | R: 168 | R + N: 56 |
| h = [36 3 23 12] | R: 168 | R + N: 48 |
| h = [36 3 24 16] | R: 168 | R + N: 48 |
| h = [36 3 25 16] | R: 164 | R + N: 48 |
| h = [36 3 25 17] | R: 168 | R + N: 56 |
| h = [36 3 26 17] | R: 164 | R + N: 56 |
| h = [36 3 30 12] | R: 164 | R + N: 48 |
| h = [36 3 31 12] | R: 168 | R + N: 48 |
| h = [36 3 31 13] | R: 168 | R + N: 56 |
| h = [36 3 31 17] | R: 164 | R + N: 56 |
| h = [36 3 32 13] | R: 164 | R + N: 56 |
| h = [36 3 32 16] | R: 168 | R + N: 48 |
| h = [36 3 32 17] | R: 164 | R + N: 56 |
| h = [36 3 33 16] | R: 164 | R + N: 48 |
| h = [36 10 21 11] | R: 164 | R + N: 48 |
| h = [36 10 22 10] | R: 164 | R + N: 44 |
| h = [36 10 30 11] | R: 164 | R + N: 48 |
| h = [36 10 32 10] | R: 164 | R + N: 44 |
| h = [36 11 21 11] | R: 164 | R + N: 44 |
| h = [36 11 22 10] | R: 164 | R + N: 48 |
| h = [36 11 30 11] | R: 164 | R + N: 44 |

TABLE 1-continued

| h | R | R + N |
|---|---|---|
| h = [36 11 32 10] | R: 164 | R + N: 48 |
| h = [36 13 21 13] | R: 168 | R + N: 56 |
| h = [36 13 22 12] | R: 168 | R + N: 48 |
| h = [36 13 22 13] | R: 164 | R + N: 56 |
| h = [36 13 23 12] | R: 164 | R + N: 48 |
| h = [36 13 30 12] | R: 168 | R + N: 48 |
| h = [36 13 31 12] | R: 164 | R + N: 48 |
| h = [36 13 31 13] | R: 164 | R + N: 56 |
| h = [36 13 32 13] | R: 168 | R + N: 56 |
| h = [36 14 24 15] | R: 164 | R + N: 48 |
| h = [36 14 26 14] | R: 164 | R + N: 44 |
| h = [36 14 31 15] | R: 164 | R + N: 48 |
| h = [36 14 32 14] | R: 164 | R + N: 44 |
| h = [36 15 25 15] | R: 164 | R + N: 44 |
| h = [36 15 27 14] | R: 164 | R + N: 48 |
| h = [36 15 30 15] | R: 164 | R + N: 44 |
| h = [36 15 33 14] | R: 164 | R + N: 48 |
| h = [36 17 25 17] | R: 168 | R + N: 56 |
| h = [36 17 26 16] | R: 164 | R + N: 48 |
| h = [36 17 26 17] | R: 164 | R + N: 56 |
| h = [36 17 27 16] | R: 168 | R + N: 48 |
| h = [36 17 30 16] | R: 164 | R + N: 48 |
| h = [36 17 31 16] | R: 168 | R + N: 48 |
| h = [36 17 31 17] | R: 164 | R + N: 56 |
| h = [36 17 32 17] | R: 168 | R + N: 56 |
| h = [36 25 20 12] | R: 168 | R + N: 48 |
| h = [36 25 21 12] | R: 164 | R + N: 48 |
| h = [36 25 21 13] | R: 164 | R + N: 56 |
| h = [36 25 22 13] | R: 168 | R + N: 56 |
| h = [36 25 31 13] | R: 168 | R + N: 56 |
| h = [36 25 32 12] | R: 168 | R + N: 48 |
| h = [36 25 32 13] | R: 164 | R + N: 56 |
| h = [36 25 33 12] | R: 164 | R + N: 48 |
| h = [36 26 20 11] | R: 164 | R + N: 48 |
| h = [36 26 22 10] | R: 164 | R + N: 44 |
| h = [36 26 31 11] | R: 164 | R + N: 48 |
| h = [36 26 32 10] | R: 164 | R + N: 44 |
| h = [36 27 20 11] | R: 164 | R + N: 44 |
| h = [36 27 22 10] | R: 164 | R + N: 48 |
| h = [36 27 31 11] | R: 164 | R + N: 44 |
| h = [36 27 32 10] | R: 164 | R + N: 48 |
| h = [36 31 20 6] | R: 164 | R + N: 48 |
| h = [36 31 21 6] | R: 168 | R + N: 48 |
| h = [36 31 21 7] | R: 164 | R + N: 56 |
| h = [36 31 22 7] | R: 168 | R + N: 56 |
| h = [36 31 25 7] | R: 168 | R + N: 56 |
| h = [36 31 26 6] | R: 164 | R + N: 48 |
| h = [36 31 26 7] | R: 164 | R + N: 56 |
| h = [36 31 27 6] | R: 168 | R + N: 48 |
| h = [36 32 21 5] | R: 164 | R + N: 48 |
| h = [36 32 22 4] | R: 164 | R + N: 44 |
| h = [36 32 24 5] | R: 164 | R + N: 48 |
| h = [36 32 26 4] | R: 164 | R + N: 44 |
| h = [36 33 20 5] | R: 164 | R + N: 44 |
| h = [36 33 23 4] | R: 164 | R + N: 48 |
| h = [36 33 25 5] | R: 164 | R + N: 44 |
| h = [36 33 27 4] | R: 164 | R + N: 48 |
| h = [36 34 21 4] | R: 164 | R + N: 44 |
| h = [36 34 21 11] | R: 164 | R + N: 44 |
| h = [36 34 23 5] | R: 164 | R + N: 44 |
| h = [36 34 23 10] | R: 164 | R + N: 44 |
| h = [36 34 25 4] | R: 164 | R + N: 44 |
| h = [36 34 26 5] | R: 164 | R + N: 44 |
| h = [36 34 30 11] | R: 164 | R + N: 44 |
| h = [36 34 33 10] | R: 164 | R + N: 44 |
| h = [36 35 20 12] | R: 164 | R + N: 48 |
| h = [36 35 21 7] | R: 164 | R + N: 56 |
| h = [36 35 21 12] | R: 168 | R + N: 48 |
| h = [36 35 21 13] | R: 168 | R + N: 56 |
| h = [36 35 22 6] | R: 168 | R + N: 48 |
| h = [36 35 22 7] | R: 168 | R + N: 56 |
| h = [36 35 22 13] | R: 164 | R + N: 56 |
| h = [36 35 23 6] | R: 164 | R + N: 48 |
| h = [36 35 24 6] | R: 168 | R + N: 48 |
| h = [36 35 25 6] | R: 164 | R + N: 48 |
| h = [36 35 25 7] | R: 168 | R + N: 56 |
| h = [36 35 26 7] | R: 164 | R + N: 56 |
| h = [36 35 31 13] | R: 164 | R + N: 56 |
| h = [36 35 32 12] | R: 164 | R + N: 48 |
| h = [36 35 32 13] | R: 168 | R + N: 56 |
| h = [36 35 33 12] | R: 168 | R + N: 48 |
| h = [37 2 21 11] | R: 164 | R + N: 44 |
| h = [37 2 22 10] | R: 164 | R + N: 44 |
| h = [37 2 24 14] | R: 164 | R + N: 44 |
| h = [37 2 27 15] | R: 164 | R + N: 44 |
| h = [37 2 30 11] | R: 164 | R + N: 44 |
| h = [37 2 30 14] | R: 164 | R + N: 44 |
| h = [37 2 32 10] | R: 164 | R + N: 44 |
| h = [37 2 32 15] | R: 164 | R + N: 44 |
| h = [37 3 20 13] | R: 164 | R + N: 56 |
| h = [37 3 22 12] | R: 168 | R + N: 48 |
| h = [37 3 23 12] | R: 164 | R + N: 48 |
| h = [37 3 23 13] | R: 168 | R + N: 56 |
| h = [37 3 24 16] | R: 164 | R + N: 48 |
| h = [37 3 24 17] | R: 168 | R + N: 56 |
| h = [37 3 25 16] | R: 168 | R + N: 48 |
| h = [37 3 27 17] | R: 164 | R + N: 56 |
| h = [37 3 30 12] | R: 168 | R + N: 48 |
| h = [37 3 30 13] | R: 168 | R + N: 56 |
| h = [37 3 30 17] | R: 164 | R + N: 56 |
| h = [37 3 31 12] | R: 164 | R + N: 48 |
| h = [37 3 32 16] | R: 164 | R + N: 48 |
| h = [37 3 33 13] | R: 168 | R + N: 56 |
| h = [37 3 33 16] | R: 164 | R + N: 48 |
| h = [37 3 33 17] | R: 168 | R + N: 56 |
| h = [37 10 20 11] | R: 164 | R + N: 48 |
| h = [37 10 23 10] | R: 164 | R + N: 44 |
| h = [37 10 31 11] | R: 164 | R + N: 48 |
| h = [37 10 33 10] | R: 164 | R + N: 44 |
| h = [37 11 20 11] | R: 164 | R + N: 44 |
| h = [37 11 23 10] | R: 164 | R + N: 48 |
| h = [37 11 31 11] | R: 164 | R + N: 44 |
| h = [37 11 33 10] | R: 164 | R + N: 48 |
| h = [37 13 20 13] | R: 168 | R + N: 56 |
| h = [37 13 22 13] | R: 164 | R + N: 48 |
| h = [37 13 23 12] | R: 168 | R + N: 48 |
| h = [37 13 23 13] | R: 164 | R + N: 56 |
| h = [37 13 30 12] | R: 164 | R + N: 48 |
| h = [37 13 30 13] | R: 164 | R + N: 56 |
| h = [37 13 31 12] | R: 168 | R + N: 48 |
| h = [37 13 33 13] | R: 168 | R + N: 56 |
| h = [37 14 25 15] | R: 164 | R + N: 48 |
| h = [37 14 27 14] | R: 164 | R + N: 44 |
| h = [37 14 30 15] | R: 164 | R + N: 48 |
| h = [37 14 33 14] | R: 164 | R + N: 44 |
| h = [37 15 24 15] | R: 164 | R + N: 44 |
| h = [37 15 26 14] | R: 164 | R + N: 48 |
| h = [37 15 31 15] | R: 164 | R + N: 44 |
| h = [37 15 32 14] | R: 164 | R + N: 48 |
| h = [37 17 24 17] | R: 168 | R + N: 56 |
| h = [37 17 26 16] | R: 168 | R + N: 48 |
| h = [37 17 27 16] | R: 164 | R + N: 48 |
| h = [37 17 27 17] | R: 164 | R + N: 56 |
| h = [37 17 30 16] | R: 168 | R + N: 48 |
| h = [37 17 30 17] | R: 164 | R + N: 56 |
| h = [37 17 31 16] | R: 164 | R + N: 48 |
| h = [37 17 33 17] | R: 168 | R + N: 56 |
| h = [37 24 20 12] | R: 164 | R + N: 48 |
| h = [37 24 20 13] | R: 164 | R + N: 56 |
| h = [37 24 21 12] | R: 168 | R + N: 48 |
| h = [37 24 23 13] | R: 168 | R + N: 56 |
| h = [37 24 30 13] | R: 168 | R + N: 56 |
| h = [37 24 32 12] | R: 164 | R + N: 48 |
| h = [37 24 33 12] | R: 168 | R + N: 48 |
| h = [37 24 33 13] | R: 164 | R + N: 56 |
| h = [37 26 21 11] | R: 164 | R + N: 44 |
| h = [37 26 23 10] | R: 164 | R + N: 48 |
| h = [37 26 30 11] | R: 164 | R + N: 44 |
| h = [37 26 33 10] | R: 164 | R + N: 48 |
| h = [37 27 21 11] | R: 164 | R + N: 48 |
| h = [37 27 23 10] | R: 164 | R + N: 44 |
| h = [37 27 30 11] | R: 164 | R + N: 48 |
| h = [37 27 33 10] | R: 164 | R + N: 44 |
| h = [37 30 20 6] | R: 168 | R + N: 48 |
| h = [37 30 20 7] | R: 164 | R + N: 56 |
| h = [37 30 21 6] | R: 164 | R + N: 48 |
| h = [37 30 23 7] | R: 164 | R + N: 56 |
| h = [37 30 24 7] | R: 168 | R + N: 56 |
| h = [37 30 26 6] | R: 168 | R + N: 48 |
| h = [37 30 27 6] | R: 164 | R + N: 48 |

TABLE 1-continued

| | | |
|---|---|---|
| h = [37 30 27 7] | R: 164 | R + N: 56 |
| h = [37 32 21 5] | R: 164 | R + N: 44 |
| h = [37 32 22 4] | R: 164 | R + N: 48 |
| h = [37 32 24 5] | R: 164 | R + N: 44 |
| h = [37 32 26 4] | R: 164 | R + N: 48 |
| h = [37 33 20 5] | R: 164 | R + N: 48 |
| h = [37 33 23 4] | R: 164 | R + N: 44 |
| h = [37 33 25 5] | R: 164 | R + N: 48 |
| h = [37 33 27 4] | R: 164 | R + N: 44 |
| h = [37 34 20 7] | R: 164 | R + N: 56 |
| h = [37 34 20 12] | R: 168 | R + N: 48 |
| h = [37 34 20 13] | R: 168 | R + N: 56 |
| h = [37 34 21 12] | R: 164 | R + N: 48 |
| h = [37 34 22 6] | R: 164 | R + N: 48 |
| h = [37 34 23 6] | R: 168 | R + N: 48 |
| h = [37 34 23 7] | R: 168 | R + N: 56 |
| h = [37 34 23 13] | R: 164 | R + N: 56 |
| h = [37 34 24 6] | R: 164 | R + N: 48 |
| h = [37 34 24 7] | R: 168 | R + N: 56 |
| h = [37 34 25 6] | R: 168 | R + N: 48 |
| h = [37 34 27 7] | R: 164 | R + N: 56 |
| h = [37 34 30 13] | R: 164 | R + N: 56 |
| h = [37 34 32 12] | R: 168 | R + N: 48 |
| h = [37 34 33 12] | R: 164 | R + N: 48 |
| h = [37 34 33 13] | R: 168 | R + N: 56 |
| h = [37 35 20 4] | R: 164 | R + N: 44 |
| h = [37 35 20 11] | R: 164 | R + N: 44 |
| h = [37 35 22 5] | R: 164 | R + N: 44 |
| h = [37 35 22 10] | R: 164 | R + N: 44 |
| h = [37 35 24 4] | R: 164 | R + N: 44 |
| h = [37 35 27 5] | R: 164 | R + N: 44 |
| h = [37 35 31 11] | R: 164 | R + N: 44 |
| h = [37 35 32 10] | R: 164 | R + N: 44 |

Table 1 is obtained by calculating combinations that satisfy the values of R and R+N from $h=[h_6, h_5, h_2, h_1]$ through simulations.

After obtaining the optimal ½ rate encoders H that sustain the backward compatibility of the typical encoder, it obtains a relational equation between memories the input/output signals, which satisfy each of the H values at step S140. Finally, an encoder is configured to satisfy the obtained relational equation from step S140. Hereinafter, a method for obtaining the relational equation between the memories and the input/output signals from H values in Table 1, and a method of configuring an encoder from the relational equation will be described.

FIGS. 4 and 5 are views for describing a method for estimating an encoder structure from encoder combinations H in Table 1.

FIG. 4 shows encoder combinations h=[4, 34, 30, 4] among the encoder combinations h in Table 1. Referring to FIG. 4, since $h_j$ is an octal number, $h_6=4$ can be expressed as 00100 in binary number. According to Eq. 1, a relational equation for memories $st_4$ and $st_3$, input in, and outputs $ot_2$ and $ot_1$ are expressed as follows.

<relational equation of memories and input/output signal when h=[4 34 20 4]>

$$st_4 = 0in + 0st_4 + 1st_3 + 0st_2 + 0st_1$$

$$st_3 = 1in + 1st_4 + 1st_3 + 0st_2 + 0st_1$$

$$ot_2 = 1in + 0st_4 + 0st_3 + 0st_2 + 0st_1$$

$$ot_1 = 0in + 0st_4 + 1st_3 + 0st_2 + 0st_1$$

As shown in the relational equations, an encoder structure shown in FIG. 5 can be obtained from the relational connection between the memories and the input/output lines.

Figure 6:
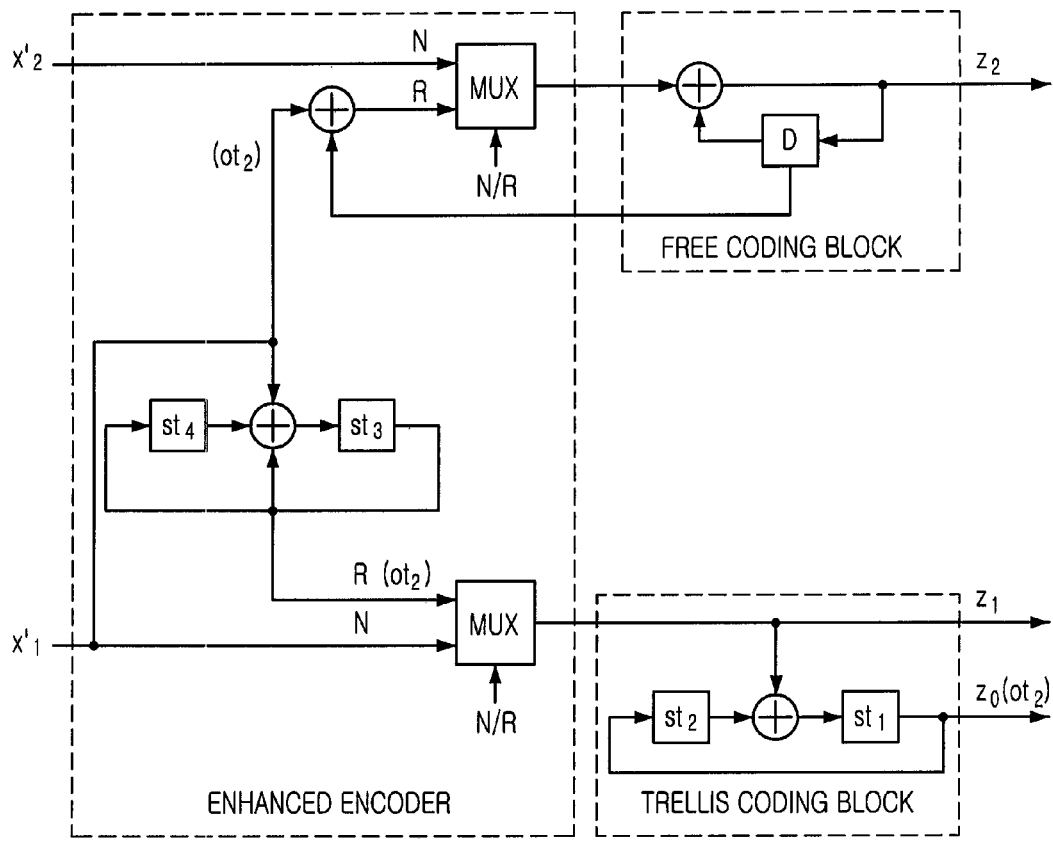
FIG. 6 is a block diagram showing a dual stream transmission encoder with an encoder shown in FIG. 5.

FIG. 6 is a block diagram showing an encoder for a dual stream transmission including the encoder shown in FIG. 5.

Referring to FIG. 6, the input data in is described as $X_1'$. The dual stream encoder that encodes data by discriminating robust data and normal data, which is shown in FIG. 6, is well described in Korea Patent Application No. 2004-64306 entitled "Digital Television Transmitter and Receiver for Using 16 State Trellis Coding" filled at Aug. 16, 2004 by same applicant. In FIG. 5, the output signals $Z_0$, $Z_1$, and $Z_2$ and next states according to inputs are shown in Table 2 and Table 3. Herein, a symbol mapping according to an output signal is identical to FIG. 2.

TABLE 2

| Input | CurrentState | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | −7 | −5 | −7 | −5 | −3 | −1 | −3 | −1 | −7 | −5 | −7 | −5 | −3 | −1 | −3 | −1 |
| 1 | 1 | 3 | 1 | 3 | 5 | 7 | 5 | 7 | 1 | 3 | 1 | 3 | 5 | 7 | 5 | 7 |

TABLE 3

| Input | CurrentState | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | 0 | 2 | 1 | 3 | 13 | 15 | 12 | 14 | 4 | 6 | 5 | 7 | 9 | 11 | 8 | 10 |
| 1 | 4 | 6 | 5 | 7 | 9 | 11 | 0 | 10 | 0 | 2 | 1 | 3 | 13 | 15 | 12 | 14 |

Until now, the ½ rate encoder in which single symbol transmits 1 bit input data is described. However, the present invention can be applied into a ¼ rate encoder in which 2 symbols transmits 1 bit input data. Hereinafter, a method for estimating a ¼ rate encoder and the ¼ rate encoder will be described.

Figure 7:
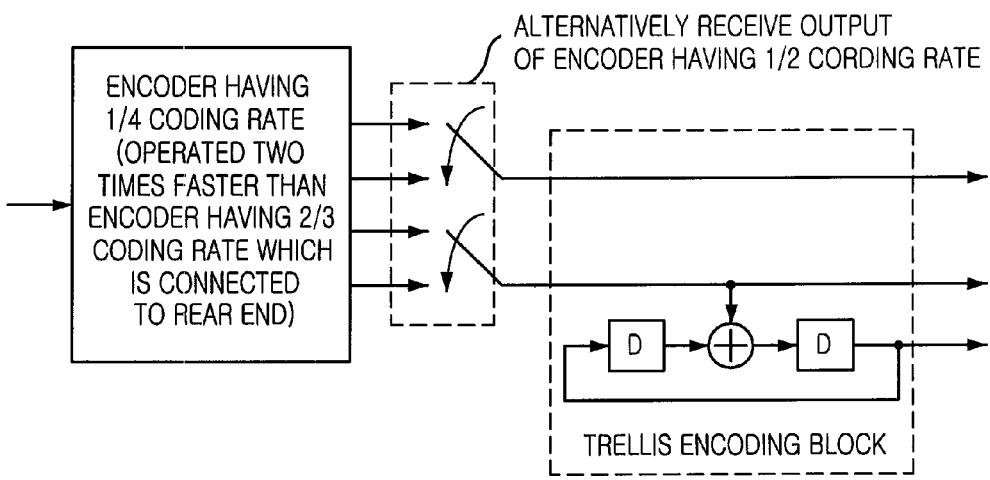
FIG. 7 is a block diagram showing a ¼ rate encoder in accordance with an embodiment of the present invention.

FIG. 7 is a block diagram showing a ¼ rate encoder in accordance with an embodiment of the present invention.

An encoder with a ¼ code rate shown in FIG. 7 is a non-feedback convolution encoder having two memories. Herein, the encoder with the ¼ code rate denotes an encoder having a ⅙ code rate by connecting a trellis encoder with a ⅔ code rate and an encoder with a ¼ code rate, which is used for estimating the ¼ rate encoder.

Figure 8:
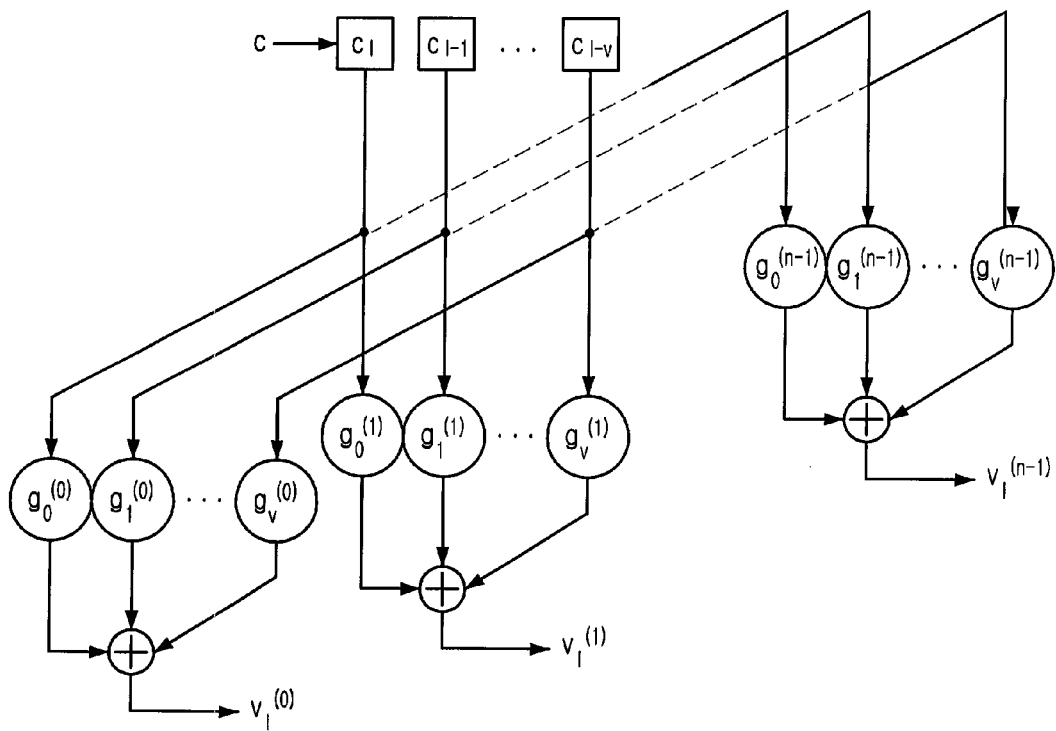
FIG. 8 is a view showing a typical convolution encoder.

The encoder having a ¼ code rate shown in FIG. 7 can be obtained from a typical convolution encoder shown in FIG. 8.

FIG. 8 is a view showing a typical non-feedback convolution encoder having v memories and a 1/n code rate. In FIG. 8, $c_1$ denotes binary information inputted to an encoder at the first iteration, and $v_l^{(i)}$ denotes an $l^{th}$ output bit generated at $i^{th}$ iteration. C denotes an input bit sequence, that is, $c=(\ldots, c_{-1}, c_0, c_1, \ldots, c_l, \ldots)$, and $v^{(i)}$ denotes $i^{th}$ output bit sequence. Then, Eq. 2 can be obtained.

$$v^{(i)} = c * g^{(i)} \quad \text{Eq. 2}$$

In Eq. 2, * denotes a convolution operation, and $g^{(i)}=(g_0^{(i)}, g_1^{(i)}, \ldots, g_v^{(i)})$. Therefore, an non-feedback encoder shown in FIG. 8 is generally expressed as $g=[g^0, g^1, \ldots, g^{n-1}]$. Herein, $$g^i = \sum_{k=0}^{v} g_k^{(i)},$$

and $g^i$ is expressed as an octal number.

The encoders with n=4 and v=2 in FIG. 8 are the encoder with a ¼ code rate in FIG. 6. Therefore, an encoder combination G that satisfies a free distance condition of robust data and a free distance condition of a mixed stream is obtained from the encoders with n=4 and v=2. In the present embodiment, the free distance condition for the robust data is 108 to 692, and the free distance condition for the mixed data is 44.

In Table 4, R denotes a robust steam only case, and R+N denotes a mixed stream of a robust stream and a normal stream.

TABLE 4

| encoder | R | N + R |
|---|---|---|
| g = [1 1 1 1] | 488 | 44 |
| g = [1 1 2 1] | 328 | 44 |
| g = [1 1 2 2] | 496 | 44 |
| g = [1 1 3 1] | 328 | 44 |
| g = [1 1 3 3] | 492 | 44 |
| g = [1 1 4 1] | 336 | 44 |
| g = [1 1 4 2] | 376 | 44 |
| g = [1 1 4 3] | 332 | 44 |
| g = [1 1 4 4] | 504 | 44 |
| g = [1 1 5 1] | 336 | 44 |
| g = [1 1 5 2] | 368 | 44 |
| g = [1 1 5 3] | 396 | 44 |
| g = [1 1 5 5] | 504 | 44 |
| g = [1 1 6 1] | 328 | 44 |
| g = [1 1 6 2] | 376 | 44 |
| g = [1 1 6 3] | 396 | 44 |
| g = [1 1 6 6] | 588 | 44 |
| g = [1 1 7 1] | 328 | 44 |
| g = [1 1 7 2] | 368 | 44 |
| g = [1 1 7 3] | 332 | 44 |
| g = [1 1 7 7] | 496 | 44 |
| g = [1 2 2 2] | 328 | 44 |
| g = [1 2 3 3] | 396 | 44 |
| g = [1 2 4 1] | 208 | 44 |
| g = [1 2 4 3] | 204 | 44 |
| g = [1 2 4 4] | 376 | 44 |
| g = [1 2 5 1] | 208 | 44 |
| g = [1 2 5 2] | 232 | 44 |
| g = [1 2 5 3] | 236 | 44 |
| g = [1 2 5 5] | 408 | 44 |
| g = [1 2 6 3] | 236 | 44 |
| g = [1 2 6 6] | 332 | 44 |
| g = [1 2 7 2] | 232 | 44 |
| g = [1 2 7 3] | 204 | 44 |
| g = [1 2 7 7] | 368 | 44 |
| g = [1 3 2 2] | 332 | 44 |
| g = [1 3 3 3] | 264 | 44 |
| g = [1 3 4 4] | 304 | 44 |
| g = [1 3 5 5] | 268 | 44 |
| g = [1 3 6 6] | 328 | 44 |
| g = [1 3 7 2] | 204 | 44 |
| g = [1 3 7 7] | 308 | 44 |
| g = [1 4 2 4] | 208 | 44 |
| g = [1 4 3 4] | 232 | 44 |
| g = [1 4 4 2] | 208 | 44 |
| g = [1 4 4 3] | 204 | 44 |
| g = [1 4 4 4] | 336 | 44 |
| g = [1 4 5 2] | 240 | 44 |
| g = [1 4 5 3] | 208 | 44 |
| g = [1 4 5 5] | 376 | 44 |
| g = [1 4 6 1] | 232 | 44 |
| g = [1 4 6 2] | 208 | 44 |
| g = [1 4 6 3] | 208 | 44 |
| g = [1 4 6 4] | 208 | 44 |
| g = [1 4 6 6] | 428 | 44 |
| g = [1 4 7 1] | 232 | 44 |
| g = [1 4 7 2] | 240 | 44 |
| g = [1 4 7 3] | 204 | 44 |
| g = [1 4 7 4] | 232 | 44 |
| g = [1 4 7 7] | 400 | 44 |
| g = [1 5 4 4] | 300 | 44 |
| g = [1 5 5 5] | 272 | 44 |
| g = [1 5 6 6] | 268 | 44 |
| g = [1 5 7 1] | 236 | 44 |
| g = [1 5 7 7] | 276 | 44 |
| g = [1 6 4 1] | 204 | 44 |
| g = [1 6 4 2] | 204 | 44 |
| g = [1 6 4 4] | 332 | 44 |
| g = [1 6 5 1] | 204 | 44 |
| g = [1 6 5 2] | 236 | 44 |
| g = [1 6 5 5] | 364 | 44 |
| g = [1 6 6 2] | 204 | 44 |
| g = [1 6 6 6] | 328 | 44 |
| g = [1 6 7 2] | 236 | 44 |
| g = [1 6 7 7] | 372 | 44 |
| g = [1 7 4 4] | 312 | 44 |
| g = [1 7 5 2] | 208 | 44 |
| g = [1 7 5 5] | 312 | 44 |
| g = [1 7 6 6] | 340 | 44 |
| g = [1 7 7 2] | 208 | 44 |
| g = [1 7 7 7] | 312 | 44 |
| g = [2 1 1 1] | 328 | 44 |
| g = [2 1 2 2] | 360 | 44 |
| g = [2 1 3 3] | 300 | 44 |
| g = [2 1 4 1] | 208 | 44 |
| g = [2 1 4 4] | 376 | 44 |
| g = [2 1 5 1] | 208 | 44 |
| g = [2 1 5 2] | 200 | 44 |
| g = [2 1 5 3] | 204 | 44 |
| g = [2 1 5 5] | 344 | 44 |
| g = [2 1 6 3] | 204 | 44 |
| g = [2 1 6 6] | 364 | 44 |
| g = [2 1 7 2] | 200 | 44 |
| g = [2 1 7 7] | 304 | 44 |
| g = [2 2 1 1] | 488 | 44 |
| g = [2 2 1 2] | 328 | 44 |
| g = [2 2 1 3] | 240 | 44 |
| g = [2 2 2 1] | 328 | 44 |
| g = [2 2 2 2] | 488 | 44 |
| g = [2 2 2 3] | 240 | 44 |
| g = [2 2 3 1] | 328 | 44 |
| g = [2 2 3 2] | 328 | 44 |
| g = [2 2 3 3] | 492 | 44 |
| g = [2 2 4 1] | 336 | 44 |
| g = [2 2 4 2] | 328 | 44 |
| g = [2 2 4 3] | 300 | 44 |
| g = [2 2 4 4] | 496 | 44 |
| g = [2 2 5 1] | 336 | 44 |
| g = [2 2 5 2] | 392 | 44 |
| g = [2 2 5 3] | 304 | 44 |
| g = [2 2 5 5] | 504 | 44 |
| g = [2 2 6 1] | 328 | 44 |
| g = [2 2 6 2] | 328 | 44 |
| g = [2 2 6 3] | 304 | 44 |

TABLE 4-continued

| encoder | R | N + R |
|---|---|---|
| g = [2 2 6 6] | 492 | 44 |
| g = [2 2 7 1] | 328 | 44 |
| g = [2 2 7 2] | 392 | 44 |
| g = [2 2 7 3] | 300 | 44 |
| g = [2 2 7 7] | 496 | 44 |
| g = [2 3 2 2] | 332 | 44 |
| g = [2 3 3 3] | 264 | 44 |
| g = [2 3 4 4] | 304 | 44 |
| g = [2 3 5 5] | 268 | 44 |
| g = [2 3 6 6] | 328 | 44 |
| g = [2 3 7 7] | 308 | 44 |
| g = [2 4 1 4] | 208 | 44 |
| g = [2 4 1 6] | 204 | 44 |
| g = [2 4 3 6] | 236 | 44 |
| g = [2 4 4 1] | 200 | 44 |
| g = [2 4 4 4] | 328 | 44 |
| g = [2 4 5 1] | 200 | 44 |
| g = [2 4 5 2] | 232 | 44 |
| g = [2 4 5 3] | 204 | 44 |
| g = [2 4 5 4] | 208 | 44 |
| g = [2 4 5 5] | 376 | 44 |
| g = [2 4 5 6] | 236 | 44 |
| g = [2 4 6 3] | 204 | 44 |
| g = [2 4 6 6] | 396 | 44 |
| g = [2 4 7 2] | 232 | 44 |
| g = [2 4 7 6] | 204 | 44 |
| g = [2 4 7 7] | 336 | 44 |
| g = [2 5 4 4] | 300 | 44 |
| g = [2 5 5 5] | 304 | 44 |
| g = [2 5 6 6] | 332 | 44 |
| g = [2 5 7 7] | 276 | 44 |
| g = [2 6 4 4] | 332 | 44 |
| g = [2 6 5 5] | 332 | 44 |
| g = [2 6 6 6] | 264 | 44 |
| g = [2 6 7 2] | 204 | 44 |
| g = [2 6 7 7] | 372 | 44 |
| g = [2 7 3 4] | 208 | 44 |
| g = [2 7 4 4] | 312 | 44 |
| g = [2 7 5 5] | 312 | 44 |
| g = [2 7 6 1] | 208 | 44 |
| g = [2 7 6 2] | 208 | 44 |
| g = [2 7 6 6] | 372 | 44 |
| g = [2 7 7 1] | 208 | 44 |
| g = [2 7 7 4] | 208 | 44 |
| g = [2 7 7 7] | 344 | 44 |
| g = [3 1 1 1] | 328 | 44 |
| g = [3 1 2 2] | 360 | 44 |
| g = [3 1 3 3] | 300 | 44 |
| g = [3 1 4 1] | 208 | 44 |
| g = [3 1 4 4] | 376 | 44 |
| g = [3 1 5 1] | 208 | 44 |
| g = [3 1 5 2] | 200 | 44 |
| g = [3 1 5 3] | 204 | 44 |
| g = [3 1 5 5] | 344 | 44 |
| g = [3 1 6 3] | 204 | 44 |
| g = [3 1 6 6] | 364 | 44 |
| g = [3 1 7 7] | 304 | 44 |
| g = [3 2 2 2] | 328 | 44 |
| g = [3 2 3 3] | 396 | 44 |
| g = [3 2 4 1] | 208 | 44 |
| g = [3 2 4 3] | 204 | 44 |
| g = [3 2 4 4] | 376 | 44 |
| g = [3 2 5 1] | 208 | 44 |
| g = [3 2 5 2] | 232 | 44 |
| g = [3 2 5 3] | 236 | 44 |
| g = [3 2 5 5] | 408 | 44 |
| g = [3 2 6 3] | 236 | 44 |
| g = [3 2 6 6] | 332 | 44 |
| g = [3 2 7 2] | 232 | 44 |
| g = [3 2 7 3] | 204 | 44 |
| g = [3 2 7 7] | 368 | 44 |
| g = [3 3 1 1] | 492 | 44 |
| g = [3 3 1 2] | 300 | 44 |
| g = [3 3 1 3] | 264 | 44 |
| g = [3 3 2 1] | 396 | 44 |
| g = [3 3 2 2] | 492 | 44 |
| g = [3 3 2 3] | 264 | 44 |
| g = [3 3 3 1] | 396 | 44 |

TABLE 4-continued

| encoder | R | N + R |
|---|---|---|
| g = [3 3 3 2] | 300 | 44 |
| g = [3 3 4 1] | 428 | 44 |
| g = [3 3 4 2] | 332 | 44 |
| g = [3 3 4 3] | 328 | 44 |
| g = [3 3 4 4] | 588 | 44 |
| g = [3 3 5 1] | 428 | 44 |
| g = [3 3 5 2] | 364 | 44 |
| g = [3 3 6 1] | 396 | 44 |
| g = [3 3 6 2] | 332 | 44 |
| g = [3 3 7 1] | 396 | 44 |
| g = [3 3 7 2] | 364 | 44 |
| g = [3 3 7 3] | 328 | 44 |
| g = [3 3 7 7] | 500 | 44 |
| g = [3 4 1 4] | 232 | 44 |
| g = [3 4 1 6] | 204 | 44 |
| g = [3 4 2 7] | 208 | 44 |
| g = [3 4 3 6] | 236 | 44 |
| g = [3 4 4 1] | 232 | 44 |
| g = [3 4 4 4] | 328 | 44 |
| g = [3 4 5 1] | 232 | 44 |
| g = [3 4 5 2] | 232 | 44 |
| g = [3 4 5 3] | 236 | 44 |
| g = [3 4 5 4] | 232 | 44 |
| g = [3 4 5 5] | 440 | 44 |
| g = [3 4 5 6] | 236 | 44 |
| g = [3 4 5 7] | 208 | 44 |
| g = [3 4 6 1] | 200 | 44 |
| g = [3 4 6 3] | 236 | 44 |
| g = [3 4 6 6] | 396 | 44 |
| g = [3 4 7 6] | 204 | 44 |
| g = [3 4 7 7] | 368 | 44 |
| g = [3 5 4 4] | 300 | 44 |
| g = [3 5 5 1] | 248 | 44 |
| g = [3 5 7 7] | 276 | 44 |
| g = [3 6 1 4] | 208 | 44 |
| g = [3 6 2 4] | 204 | 44 |
| g = [3 6 3 4] | 236 | 44 |
| g = [3 6 3 7] | 180 | 44 |
| g = [3 6 4 1] | 208 | 44 |
| g = [3 6 4 2] | 236 | 44 |
| g = [3 6 4 3] | 168 | 44 |
| g = [3 6 4 4] | 396 | 44 |
| g = [3 6 5 1] | 208 | 44 |
| g = [3 6 5 2] | 240 | 44 |
| g = [3 6 5 4] | 208 | 44 |
| g = [3 6 5 7] | 144 | 44 |
| g = [3 6 6 1] | 236 | 44 |
| g = [3 6 6 2] | 236 | 44 |
| g = [3 6 6 4] | 204 | 44 |
| g = [3 6 6 7] | 180 | 44 |
| g = [3 6 7 1] | 236 | 44 |
| g = [3 6 7 2] | 240 | 44 |
| g = [3 6 7 3] | 168 | 44 |
| g = [3 6 7 4] | 236 | 44 |
| g = [3 6 7 7] | 404 | 44 |
| g = [3 7 4 4] | 312 | 44 |
| g = [3 7 5 2] | 208 | 44 |
| g = [3 7 5 3] | 212 | 44 |
| g = [3 7 5 4] | 176 | 44 |
| g = [3 7 5 5] | 312 | 44 |
| g = [3 7 6 6] | 308 | 44 |
| g = [3 7 6 7] | 120 | 44 |
| g = [3 7 7 1] | 208 | 44 |
| g = [3 7 7 7] | 312 | 44 |
| g = [4 1 1 1] | 336 | 44 |
| g = [4 1 1 2] | 200 | 44 |
| g = [4 1 2 1] | 208 | 44 |
| g = [4 1 2 2] | 336 | 44 |
| g = [4 1 3 1] | 232 | 44 |
| g = [4 1 3 2] | 200 | 44 |
| g = [4 1 3 3] | 364 | 44 |
| g = [4 1 3 4] | 200 | 44 |
| g = [4 1 4 2] | 232 | 44 |
| g = [4 1 4 3] | 204 | 44 |
| g = [4 1 4 4] | 368 | 44 |
| g = [4 1 5 2] | 208 | 44 |
| g = [4 1 5 3] | 208 | 44 |
| g = [4 1 5 4] | 144 | 44 |

TABLE 4-continued

| encoder | R | N + R |
|---|---|---|
| g = [4 1 5 5] | 312 | 44 |
| g = [4 1 5 6] | 144 | 44 |
| g = [4 1 5 7] | 112 | 44 |
| g = [4 1 6 1] | 232 | 44 |
| g = [4 1 6 2] | 232 | 44 |
| g = [4 1 6 3] | 208 | 44 |
| g = [4 1 6 4] | 208 | 44 |
| g = [4 1 6 5] | 172 | 44 |
| g = [4 1 6 6] | 396 | 44 |
| g = [4 1 6 7] | 176 | 44 |
| g = [4 1 7 1] | 232 | 44 |
| g = [4 1 7 2] | 208 | 44 |
| g = [4 1 7 3] | 204 | 44 |
| g = [4 1 7 4] | 200 | 44 |
| g = [4 1 7 5] | 172 | 44 |
| g = [4 1 7 6] | 144 | 44 |
| g = [4 1 7 7] | 336 | 44 |
| g = [4 2 1 1] | 328 | 44 |
| g = [4 2 1 2] | 168 | 44 |
| g = [4 2 1 3] | 172 | 44 |
| g = [4 2 1 4] | 200 | 44 |
| g = [4 2 1 5] | 108 | 44 |
| g = [4 2 2 2] | 328 | 44 |
| g = [4 2 3 3] | 396 | 44 |
| g = [4 2 3 4] | 168 | 44 |
| g = [4 2 3 5] | 108 | 44 |
| g = [4 2 3 6] | 204 | 44 |
| g = [4 2 3 7] | 144 | 44 |
| g = [4 2 4 1] | 208 | 44 |
| g = [4 2 4 2] | 168 | 44 |
| g = [4 2 4 3] | 204 | 44 |
| g = [4 2 4 4] | 360 | 44 |
| g = [4 2 5 1] | 208 | 44 |
| g = [4 2 5 2] | 232 | 44 |
| g = [4 2 5 3] | 236 | 44 |
| g = [4 2 5 4] | 200 | 44 |
| g = [4 2 5 5] | 376 | 44 |
| g = [4 2 5 6] | 204 | 44 |
| g = [4 2 6 3] | 236 | 44 |
| g = [4 2 6 4] | 136 | 44 |
| g = [4 2 6 5] | 108 | 44 |
| g = [4 2 6 6] | 300 | 44 |
| g = [4 2 7 2] | 232 | 44 |
| g = [4 2 7 3] | 204 | 44 |
| g = [4 2 7 7] | 336 | 44 |
| g = [4 3 1 1] | 300 | 44 |
| g = [4 3 2 1] | 204 | 44 |
| g = [4 3 2 2] | 332 | 44 |
| g = [4 3 3 1] | 204 | 44 |
| g = [4 3 3 2] | 140 | 44 |
| g = [4 3 3 3] | 328 | 44 |
| g = [4 3 4 1] | 208 | 44 |
| g = [4 3 4 4] | 336 | 44 |
| g = [4 3 5 1] | 208 | 44 |
| g = [4 3 5 2] | 204 | 44 |
| g = [4 3 5 3] | 168 | 44 |
| g = [4 3 5 4] | 144 | 44 |
| g = [4 3 5 5] | 300 | 44 |
| g = [4 3 6 6] | 304 | 44 |
| g = [4 3 7 7] | 308 | 44 |
| g = [4 4 1 1] | 496 | 44 |
| g = [4 4 1 2] | 328 | 44 |
| g = [4 4 1 3] | 332 | 44 |
| g = [4 4 1 4] | 336 | 44 |
| g = [4 4 1 5] | 252 | 44 |
| g = [4 4 1 6] | 300 | 44 |
| g = [4 4 1 7] | 304 | 44 |
| g = [4 4 2 1] | 360 | 44 |
| g = [4 4 2 2] | 488 | 44 |
| g = [4 4 2 3] | 332 | 44 |
| g = [4 4 2 4] | 328 | 44 |
| g = [4 4 2 5] | 300 | 44 |
| g = [4 4 2 6] | 240 | 44 |
| g = [4 4 2 7] | 304 | 44 |
| g = [4 4 3 1] | 360 | 44 |
| g = [4 4 3 2] | 328 | 44 |
| g = [4 4 3 3] | 492 | 44 |
| g = [4 4 3 4] | 328 | 44 |
| g = [4 4 3 5] | 300 | 44 |
| g = [4 4 3 6] | 304 | 44 |
| g = [4 4 3 7] | 272 | 44 |
| g = [4 4 4 1] | 336 | 44 |
| g = [4 4 4 2] | 328 | 44 |
| g = [4 4 4 3] | 332 | 44 |
| g = [4 4 4 4] | 488 | 44 |
| g = [4 4 4 5] | 252 | 44 |
| g = [4 4 4 6] | 240 | 44 |
| g = [4 4 4 7] | 272 | 44 |
| g = [4 4 5 1] | 336 | 44 |
| g = [4 4 5 2] | 392 | 44 |
| g = [4 4 5 3] | 396 | 44 |
| g = [4 4 5 4] | 336 | 44 |
| g = [4 4 5 5] | 504 | 44 |
| g = [4 4 5 6] | 304 | 44 |
| g = [4 4 5 7] | 304 | 44 |
| g = [4 4 6 1] | 392 | 44 |
| g = [4 4 6 2] | 328 | 44 |
| g = [4 4 6 3] | 396 | 44 |
| g = [4 4 6 4] | 328 | 44 |
| g = [4 4 6 5] | 300 | 44 |
| g = [4 4 6 6] | 492 | 44 |
| g = [4 4 6 7] | 304 | 44 |
| g = [4 4 7 1] | 392 | 44 |
| g = [4 4 7 2] | 392 | 44 |
| g = [4 4 7 3] | 332 | 44 |
| g = [4 4 7 4] | 328 | 44 |
| g = [4 4 7 5] | 300 | 44 |
| g = [4 4 7 6] | 300 | 44 |
| g = [4 4 7 7] | 496 | 44 |
| g = [4 5 4 4] | 300 | 44 |
| g = [4 5 5 5] | 272 | 44 |
| g = [4 5 6 6] | 268 | 44 |
| g = [4 5 7 4] | 204 | 44 |
| g = [4 5 7 7] | 308 | 44 |
| g = [4 6 4 4] | 332 | 44 |
| g = [4 6 5 5] | 332 | 44 |
| g = [4 6 6 6] | 264 | 44 |
| g = [4 6 7 7] | 372 | 44 |
| g = [4 7 4 4] | 312 | 44 |
| g = [4 7 5 5] | 312 | 44 |
| g = [4 7 6 6] | 308 | 44 |
| g = [4 7 7 7] | 312 | 44 |
| g = [5 1 1 1] | 336 | 44 |
| g = [5 1 1 2] | 200 | 44 |
| g = [5 1 2 1] | 208 | 44 |
| g = [5 1 2 2] | 336 | 44 |
| g = [5 1 2 4] | 208 | 44 |
| g = [5 1 3 1] | 232 | 44 |
| g = [5 1 3 2] | 200 | 44 |
| g = [5 1 3 3] | 364 | 44 |
| g = [5 1 3 4] | 200 | 44 |
| g = [5 1 3 5] | 248 | 44 |
| g = [5 1 4 2] | 232 | 44 |
| g = [5 1 4 3] | 204 | 44 |
| g = [5 1 4 4] | 368 | 44 |
| g = [5 1 5 2] | 208 | 44 |
| g = [5 1 5 3] | 240 | 44 |
| g = [5 1 5 4] | 144 | 44 |
| g = [5 1 5 5] | 312 | 44 |
| g = [5 1 6 1] | 232 | 44 |
| g = [5 1 6 2] | 232 | 44 |
| g = [5 1 6 3] | 208 | 44 |
| g = [5 1 6 4] | 208 | 44 |
| g = [5 1 6 5] | 172 | 44 |
| g = [5 1 6 6] | 396 | 44 |
| g = [5 1 6 7] | 176 | 44 |
| g = [5 1 7 1] | 304 | 44 |
| g = [5 1 7 2] | 240 | 44 |
| g = [5 1 7 3] | 204 | 44 |
| g = [5 1 7 4] | 200 | 44 |
| g = [5 1 7 5] | 172 | 44 |
| g = [5 1 7 6] | 172 | 44 |
| g = [5 1 7 7] | 336 | 44 |
| g = [5 2 1 1] | 392 | 44 |
| g = [5 2 1 2] | 232 | 44 |
| g = [5 2 1 3] | 176 | 44 |

TABLE 4-continued

| encoder | R | N + R |
|---|---|---|
| g = [5 2 1 4] | 208 | 44 |
| g = [5 2 1 5] | 172 | 44 |
| g = [5 2 1 6] | 204 | 44 |
| g = [5 2 1 7] | 176 | 44 |
| g = [5 2 2 1] | 232 | 44 |
| g = [5 2 2 2] | 392 | 44 |
| g = [5 2 2 3] | 232 | 44 |
| g = [5 2 3 1] | 232 | 44 |
| g = [5 2 3 2] | 232 | 44 |
| g = [5 2 3 3] | 428 | 44 |
| g = [5 2 3 4] | 232 | 44 |
| g = [5 2 3 5] | 172 | 44 |
| g = [5 2 3 6] | 240 | 44 |
| g = [5 2 3 7] | 208 | 44 |
| g = [5 2 4 1] | 240 | 44 |
| g = [5 2 4 2] | 232 | 44 |
| g = [5 2 4 3] | 236 | 44 |
| g = [5 2 4 4] | 368 | 44 |
| g = [5 2 4 5] | 172 | 44 |
| g = [5 2 4 6] | 176 | 44 |
| g = [5 2 4 7] | 208 | 44 |
| g = [5 2 5 1] | 240 | 44 |
| g = [5 2 5 2] | 296 | 44 |
| g = [5 2 5 3] | 240 | 44 |
| g = [5 2 5 4] | 208 | 44 |
| g = [5 2 5 5] | 408 | 44 |
| g = [5 2 5 6] | 240 | 44 |
| g = [5 2 5 7] | 176 | 44 |
| g = [5 2 6 1] | 232 | 44 |
| g = [5 2 6 2] | 232 | 44 |
| g = [5 2 6 3] | 240 | 44 |
| g = [5 2 6 4] | 200 | 44 |
| g = [5 2 6 5] | 172 | 44 |
| g = [5 2 6 6] | 364 | 44 |
| g = [5 2 6 7] | 208 | 44 |
| g = [5 2 7 1] | 232 | 44 |
| g = [5 2 7 2] | 296 | 44 |
| g = [5 2 7 3] | 236 | 44 |
| g = [5 2 7 4] | 232 | 44 |
| g = [5 2 7 5] | 172 | 44 |
| g = [5 2 7 6] | 204 | 44 |
| g = [5 2 7 7] | 400 | 44 |
| g = [5 3 1 1] | 304 | 44 |
| g = [5 3 1 2] | 204 | 44 |
| g = [5 3 2 1] | 236 | 44 |
| g = [5 3 2 2] | 396 | 44 |
| g = [5 3 3 1] | 236 | 44 |
| g = [5 3 3 2] | 204 | 44 |
| g = [5 3 3 4] | 204 | 44 |
| g = [5 3 3 7] | 180 | 44 |
| g = [5 3 4 1] | 208 | 44 |
| g = [5 3 4 2] | 236 | 44 |
| g = [5 3 4 3] | 168 | 44 |
| g = [5 3 4 4] | 336 | 44 |
| g = [5 3 5 2] | 240 | 44 |
| g = [5 3 5 4] | 144 | 44 |
| g = [5 3 5 7] | 144 | 44 |
| g = [5 3 6 1] | 236 | 44 |
| g = [5 3 6 2] | 236 | 44 |
| g = [5 3 6 4] | 204 | 44 |
| g = [5 3 6 7] | 176 | 44 |
| g = [5 3 7 1] | 236 | 44 |
| g = [5 3 7 2] | 240 | 44 |
| g = [5 3 7 3] | 208 | 44 |
| g = [5 3 7 4] | 204 | 44 |
| g = [5 3 7 5] | 140 | 44 |
| g = [5 3 7 6] | 136 | 44 |
| g = [5 3 7 7] | 340 | 44 |
| g = [5 4 2 4] | 208 | 44 |
| g = [5 4 2 5] | 172 | 44 |
| g = [5 4 3 4] | 232 | 44 |
| g = [5 4 3 5] | 204 | 44 |
| g = [5 4 4 1] | 176 | 44 |
| g = [5 4 4 2] | 208 | 44 |
| g = [5 4 4 3] | 204 | 44 |
| g = [5 4 4 4] | 336 | 44 |
| g = [5 4 5 1] | 176 | 44 |
| g = [5 4 5 2] | 240 | 44 |
| g = [5 4 5 3] | 208 | 44 |
| g = [5 4 5 5] | 376 | 44 |
| g = [5 4 6 1] | 232 | 44 |
| g = [5 4 6 2] | 208 | 44 |
| g = [5 4 6 3] | 208 | 44 |
| g = [5 4 6 4] | 208 | 44 |
| g = [5 4 6 5] | 248 | 44 |
| g = [5 4 6 6] | 428 | 44 |
| g = [5 4 7 1] | 232 | 44 |
| g = [5 4 7 2] | 240 | 44 |
| g = [5 4 7 3] | 204 | 44 |
| g = [5 4 7 4] | 272 | 44 |
| g = [5 4 7 5] | 172 | 44 |
| g = [5 4 7 7] | 432 | 44 |
| g = [5 5 1 1] | 504 | 44 |
| g = [5 5 1 2] | 376 | 44 |
| g = [5 5 1 3] | 332 | 44 |
| g = [5 5 1 4] | 312 | 44 |
| g = [5 5 1 5] | 272 | 44 |
| g = [5 5 1 6] | 300 | 44 |
| g = [5 5 1 7] | 312 | 44 |
| g = [5 5 2 1] | 376 | 44 |
| g = [5 5 2 2] | 504 | 44 |
| g = [5 5 2 3] | 332 | 44 |
| g = [5 5 2 4] | 344 | 44 |
| g = [5 5 2 5] | 304 | 44 |
| g = [5 5 2 6] | 268 | 44 |
| g = [5 5 2 7] | 312 | 44 |
| g = [5 5 3 1] | 376 | 44 |
| g = [5 5 3 2] | 376 | 44 |
| g = [5 5 3 4] | 376 | 44 |
| g = [5 5 3 7] | 312 | 44 |
| g = [5 5 4 1] | 376 | 44 |
| g = [5 5 4 2] | 408 | 44 |
| g = [5 5 4 3] | 364 | 44 |
| g = [5 5 4 4] | 504 | 44 |
| g = [5 5 4 5] | 272 | 44 |
| g = [5 5 4 6] | 268 | 44 |
| g = [5 5 4 7] | 312 | 44 |
| g = [5 5 5 1] | 376 | 44 |
| g = [5 5 5 2] | 408 | 44 |
| g = [5 5 5 4] | 312 | 44 |
| g = [5 5 5 7] | 280 | 44 |
| g = [5 5 6 1] | 440 | 44 |
| g = [5 5 6 2] | 408 | 44 |
| g = [5 5 6 4] | 344 | 44 |
| g = [5 5 6 7] | 312 | 44 |
| g = [5 5 7 1] | 472 | 44 |
| g = [5 5 7 2] | 440 | 44 |
| g = [5 5 7 3] | 364 | 44 |
| g = [5 5 7 4] | 376 | 44 |
| g = [5 5 7 5] | 304 | 44 |
| g = [5 5 7 6] | 300 | 44 |
| g = [5 5 7 7] | 692 | 44 |
| g = [5 6 1 4] | 208 | 44 |
| g = [5 6 3 4] | 236 | 44 |
| g = [5 6 3 7] | 192 | 44 |
| g = [5 6 4 1] | 208 | 44 |
| g = [5 6 4 2] | 236 | 44 |
| g = [5 6 4 3] | 168 | 44 |
| g = [5 6 4 4] | 396 | 44 |
| g = [5 6 4 5] | 140 | 44 |
| g = [5 6 4 6] | 104 | 44 |
| g = [5 6 4 7] | 192 | 44 |
| g = [5 6 5 1] | 208 | 44 |
| g = [5 6 5 2] | 240 | 44 |
| g = [5 6 5 4] | 240 | 44 |
| g = [5 6 5 7] | 144 | 44 |
| g = [5 6 6 1] | 236 | 44 |
| g = [5 6 6 2] | 236 | 44 |
| g = [5 6 6 4] | 204 | 44 |
| g = [5 6 6 7] | 212 | 44 |
| g = [5 6 7 1] | 236 | 44 |
| g = [5 6 7 2] | 240 | 44 |
| g = [5 6 7 3] | 168 | 44 |
| g = [5 6 7 4] | 236 | 44 |
| g = [5 6 7 5] | 172 | 44 |
| g = [5 6 7 6] | 240 | 44 |
| g = [5 6 7 7] | 436 | 44 |

TABLE 4-continued

| encoder | R | N + R |
|---|---|---|
| g = [5 7 4 4] | 312 | 44 |
| g = [5 7 5 5] | 280 | 44 |
| g = [5 7 6 1] | 208 | 44 |
| g = [5 7 6 2] | 208 | 44 |
| g = [5 7 6 5] | 148 | 44 |
| g = [5 7 6 6] | 372 | 44 |
| g = [5 7 7 7] | 408 | 44 |
| g = [6 1 1 1] | 328 | 44 |
| g = [6 1 2 2] | 392 | 44 |
| g = [6 1 3 3] | 332 | 44 |
| g = [6 1 4 1] | 232 | 44 |
| g = [6 1 4 2] | 200 | 44 |
| g = [6 1 4 3] | 172 | 44 |
| g = [6 1 4 4] | 360 | 44 |
| g = [6 1 5 1] | 232 | 44 |
| g = [6 1 5 2] | 232 | 44 |
| g = [6 1 5 3] | 236 | 44 |
| g = [6 1 5 4] | 200 | 44 |
| g = [6 1 5 5] | 376 | 44 |
| g = [6 1 5 6] | 204 | 44 |
| g = [6 1 5 7] | 208 | 44 |
| g = [6 1 6 1] | 168 | 44 |
| g = [6 1 6 2] | 200 | 44 |
| g = [6 1 6 3] | 236 | 44 |
| g = [6 1 6 6] | 364 | 44 |
| g = [6 1 6 7] | 144 | 44 |
| g = [6 1 7 1] | 168 | 44 |
| g = [6 1 7 2] | 232 | 44 |
| g = [6 1 7 7] | 304 | 44 |
| g = [6 2 1 1] | 328 | 44 |
| g = [6 2 2 2] | 328 | 44 |
| g = [6 2 3 3] | 396 | 44 |
| g = [6 2 4 1] | 232 | 44 |
| g = [6 2 4 2] | 168 | 44 |
| g = [6 2 4 3] | 204 | 44 |
| g = [6 2 4 4] | 360 | 44 |
| g = [6 2 5 1] | 232 | 44 |
| g = [6 2 5 2] | 232 | 44 |
| g = [6 2 5 3] | 236 | 44 |
| g = [6 2 5 4] | 200 | 44 |
| g = [6 2 5 5] | 376 | 44 |
| g = [6 2 5 6] | 204 | 44 |
| g = [6 2 5 7] | 176 | 44 |
| g = [6 2 6 1] | 168 | 44 |
| g = [6 2 6 2] | 168 | 44 |
| g = [6 2 6 3] | 236 | 44 |
| g = [6 2 6 6] | 300 | 44 |
| g = [6 2 7 2] | 232 | 44 |
| g = [6 2 7 3] | 204 | 44 |
| g = [6 2 7 7] | 336 | 44 |
| g = [6 3 1 1] | 304 | 44 |
| g = [6 3 1 2] | 204 | 44 |
| g = [6 3 2 1] | 236 | 44 |
| g = [6 3 2 2] | 396 | 44 |
| g = [6 3 3 1] | 236 | 44 |
| g = [6 3 3 2] | 204 | 44 |
| g = [6 3 3 4] | 204 | 44 |
| g = [6 3 3 7] | 180 | 44 |
| g = [6 3 4 1] | 208 | 44 |
| g = [6 3 4 2] | 236 | 44 |
| g = [6 3 4 3] | 168 | 44 |
| g = [6 3 4 4] | 336 | 44 |
| g = [6 3 5 1] | 208 | 44 |
| g = [6 3 5 2] | 240 | 44 |
| g = [6 3 5 4] | 144 | 44 |
| g = [6 3 5 7] | 176 | 44 |
| g = [6 3 6 1] | 236 | 44 |
| g = [6 3 6 2] | 236 | 44 |
| g = [6 3 6 4] | 204 | 44 |
| g = [6 3 6 7] | 148 | 44 |
| g = [6 3 7 1] | 236 | 44 |
| g = [6 3 7 2] | 240 | 44 |
| g = [6 3 7 3] | 168 | 44 |
| g = [6 3 7 4] | 204 | 44 |
| g = [6 3 7 7] | 340 | 44 |
| g = [6 4 1 4] | 232 | 44 |
| g = [6 4 3 6] | 236 | 44 |
| g = [6 4 4 4] | 328 | 44 |

TABLE 4-continued

| encoder | R | N + R |
|---|---|---|
| g = [6 4 4 5] | 108 | 44 |
| g = [6 4 4 6] | 172 | 44 |
| g = [6 4 4 7] | 112 | 44 |
| g = [6 4 5 1] | 200 | 44 |
| g = [6 4 5 2] | 232 | 44 |
| g = [6 4 5 3] | 204 | 44 |
| g = [6 4 5 4] | 232 | 44 |
| g = [6 4 5 5] | 376 | 44 |
| g = [6 4 5 6] | 236 | 44 |
| g = [6 4 6 6] | 396 | 44 |
| g = [6 4 6 7] | 144 | 44 |
| g = [6 4 7 1] | 168 | 44 |
| g = [6 4 7 2] | 232 | 44 |
| g = [6 4 7 7] | 336 | 44 |
| g = [6 5 4 4] | 300 | 44 |
| g = [6 5 7 7] | 308 | 44 |
| g = [6 6 1 1] | 492 | 44 |
| g = [6 6 1 2] | 396 | 44 |
| g = [6 6 1 3] | 264 | 44 |
| g = [6 6 1 4] | 364 | 44 |
| g = [6 6 1 5] | 236 | 44 |
| g = [6 6 1 6] | 328 | 44 |
| g = [6 6 1 7] | 276 | 44 |
| g = [6 6 2 1] | 300 | 44 |
| g = [6 6 2 2] | 492 | 44 |
| g = [6 6 2 3] | 264 | 44 |
| g = [6 6 2 4] | 300 | 44 |
| g = [6 6 2 5] | 240 | 44 |
| g = [6 6 2 6] | 264 | 44 |
| g = [6 6 2 7] | 308 | 44 |
| g = [6 6 3 1] | 300 | 44 |
| g = [6 6 3 2] | 396 | 44 |
| g = [6 6 3 4] | 332 | 44 |
| g = [6 6 3 7] | 276 | 44 |
| g = [6 6 4 1] | 364 | 44 |
| g = [6 6 4 2] | 396 | 44 |
| g = [6 6 4 3] | 328 | 44 |
| g = [6 6 4 4] | 492 | 44 |
| g = [6 6 4 5] | 236 | 44 |
| g = [6 6 4 6] | 264 | 44 |
| g = [6 6 4 7] | 276 | 44 |
| g = [6 6 5 1] | 364 | 44 |
| g = [6 6 5 2] | 428 | 44 |
| g = [6 6 5 4] | 364 | 44 |
| g = [6 6 5 7] | 308 | 44 |
| g = [6 6 6 1] | 332 | 44 |
| g = [6 6 6 2] | 396 | 44 |
| g = [6 6 6 4] | 300 | 44 |
| g = [6 6 6 7] | 276 | 44 |
| g = [6 6 7 1] | 332 | 44 |
| g = [6 6 7 2] | 428 | 44 |
| g = [6 6 7 3] | 328 | 44 |
| g = [6 6 7 4] | 332 | 44 |
| g = [6 6 7 5] | 240 | 44 |
| g = [6 6 7 6] | 328 | 44 |
| g = [6 6 7 7] | 500 | 44 |
| g = [6 7 4 4] | 336 | 44 |
| g = [6 7 5 5] | 312 | 44 |
| g = [6 7 5 6] | 180 | 44 |
| g = [6 7 6 6] | 340 | 44 |
| g = [6 7 7 1] | 144 | 44 |
| g = [6 7 7 2] | 208 | 44 |
| g = [6 7 7 3] | 148 | 44 |
| g = [6 7 7 7] | 312 | 44 |
| g = [7 1 1 1] | 328 | 44 |
| g = [7 1 2 2] | 392 | 44 |
| g = [7 1 3 3] | 332 | 44 |
| g = [7 1 3 4] | 136 | 44 |
| g = [7 1 3 5] | 108 | 44 |
| g = [7 1 3 6] | 204 | 44 |
| g = [7 1 3 7] | 144 | 44 |
| g = [7 1 4 1] | 232 | 44 |
| g = [7 1 4 2] | 200 | 44 |
| g = [7 1 4 3] | 172 | 44 |
| g = [7 1 4 4] | 360 | 44 |
| g = [7 1 4 5] | 108 | 44 |
| g = [7 1 4 6] | 172 | 44 |
| g = [7 1 4 7] | 144 | 44 |

TABLE 4-continued

| encoder | R | N + R |
|---|---|---|
| g = [7 1 5 1] | 272 | 44 |
| g = [7 1 5 2] | 232 | 44 |
| g = [7 1 5 3] | 236 | 44 |
| g = [7 1 5 4] | 200 | 44 |
| g = [7 1 5 5] | 376 | 44 |
| g = [7 1 5 6] | 204 | 44 |
| g = [7 1 5 7] | 208 | 44 |
| g = [7 1 6 1] | 168 | 44 |
| g = [7 1 6 2] | 200 | 44 |
| g = [7 1 6 3] | 236 | 44 |
| g = [7 1 6 4] | 168 | 44 |
| g = [7 1 6 5] | 108 | 44 |
| g = [7 1 6 6] | 364 | 44 |
| g = [7 1 7 7] | 304 | 44 |
| g = [7 2 1 1] | 392 | 44 |
| g = [7 2 1 2] | 232 | 44 |
| g = [7 2 1 3] | 204 | 44 |
| g = [7 2 1 4] | 208 | 44 |
| g = [7 2 1 5] | 172 | 44 |
| g = [7 2 1 6] | 204 | 44 |
| g = [7 2 1 7] | 176 | 44 |
| g = [7 2 2 1] | 232 | 44 |
| g = [7 2 2 2] | 392 | 44 |
| g = [7 2 2 3] | 204 | 44 |
| g = [7 2 2 4] | 200 | 44 |
| g = [7 2 2 5] | 172 | 44 |
| g = [7 2 2 6] | 204 | 44 |
| g = [7 2 2 7] | 176 | 44 |
| g = [7 2 3 1] | 232 | 44 |
| g = [7 2 3 2] | 232 | 44 |
| g = [7 2 3 3] | 428 | 44 |
| g = [7 2 3 4] | 232 | 44 |
| g = [7 2 3 5] | 172 | 44 |
| g = [7 2 3 6] | 240 | 44 |
| g = [7 2 3 7] | 208 | 44 |
| g = [7 2 4 1] | 240 | 44 |
| g = [7 2 4 2] | 232 | 44 |
| g = [7 2 4 3] | 236 | 44 |
| g = [7 2 4 4] | 368 | 44 |
| g = [7 2 4 5] | 172 | 44 |
| g = [7 2 4 6] | 204 | 44 |
| g = [7 2 4 7] | 208 | 44 |
| g = [7 2 5 1] | 240 | 44 |
| g = [7 2 5 2] | 296 | 44 |
| g = [7 2 5 3] | 240 | 44 |
| g = [7 2 5 4] | 240 | 44 |
| g = [7 2 5 5] | 440 | 44 |
| g = [7 2 5 6] | 240 | 44 |
| g = [7 2 5 7] | 176 | 44 |
| g = [7 2 6 1] | 232 | 44 |
| g = [7 2 6 2] | 232 | 44 |
| g = [7 2 6 3] | 240 | 44 |
| g = [7 2 6 4] | 200 | 44 |
| g = [7 2 6 5] | 172 | 44 |
| g = [7 2 6 6] | 364 | 44 |
| g = [7 2 6 7] | 176 | 44 |
| g = [7 2 7 1] | 232 | 44 |
| g = [7 2 7 2] | 296 | 44 |
| g = [7 2 7 3] | 236 | 44 |
| g = [7 2 7 4] | 232 | 44 |
| g = [7 2 7 5] | 172 | 44 |
| g = [7 2 7 6] | 204 | 44 |
| g = [7 2 7 7] | 400 | 44 |
| g = [7 3 1 1] | 300 | 44 |
| g = [7 3 2 2] | 332 | 44 |
| g = [7 3 3 3] | 328 | 44 |
| g = [7 3 4 4] | 336 | 44 |
| g = [7 3 5 5] | 300 | 44 |
| g = [7 3 6 6] | 304 | 44 |
| g = [7 3 7 7] | 308 | 44 |
| g = [7 4 1 4] | 232 | 44 |
| g = [7 4 3 6] | 236 | 44 |
| g = [7 4 4 4] | 328 | 44 |
| g = [7 4 4 5] | 236 | 44 |
| g = [7 4 4 6] | 172 | 44 |
| g = [7 4 4 7] | 144 | 44 |
| g = [7 4 5 1] | 232 | 44 |
| g = [7 4 5 2] | 232 | 44 |

TABLE 4-continued

| encoder | R | N + R |
|---|---|---|
| g = [7 4 5 3] | 236 | 44 |
| g = [7 4 5 4] | 304 | 44 |
| g = [7 4 5 5] | 472 | 44 |
| g = [7 4 5 6] | 236 | 44 |
| g = [7 4 5 7] | 208 | 44 |
| g = [7 4 6 1] | 200 | 44 |
| g = [7 4 6 2] | 168 | 44 |
| g = [7 4 6 3] | 236 | 44 |
| g = [7 4 6 4] | 168 | 44 |
| g = [7 4 6 5] | 140 | 44 |
| g = [7 4 6 6] | 396 | 44 |
| g = [7 4 6 7] | 208 | 44 |
| g = [7 4 7 1] | 200 | 44 |
| g = [7 4 7 2] | 232 | 44 |
| g = [7 4 7 3] | 172 | 44 |
| g = [7 4 7 4] | 168 | 44 |
| g = [7 4 7 5] | 140 | 44 |
| g = [7 4 7 6] | 204 | 44 |
| g = [7 4 7 7] | 368 | 44 |
| g = [7 5 4 4] | 300 | 44 |
| g = [7 5 5 5] | 304 | 44 |
| g = [7 5 6 6] | 332 | 44 |
| g = [7 5 7 7] | 308 | 44 |
| g = [7 6 2 6] | 104 | 44 |
| g = [7 6 2 7] | 180 | 44 |
| g = [7 6 3 6] | 168 | 44 |
| g = [7 6 3 7] | 148 | 44 |
| g = [7 6 4 1] | 204 | 44 |
| g = [7 6 4 2] | 204 | 44 |
| g = [7 6 4 3] | 168 | 44 |
| g = [7 6 4 4] | 332 | 44 |
| g = [7 6 4 6] | 104 | 44 |
| g = [7 6 4 7] | 148 | 44 |
| g = [7 6 5 1] | 204 | 44 |
| g = [7 6 5 2] | 236 | 44 |
| g = [7 6 5 3] | 168 | 44 |
| g = [7 6 5 5] | 364 | 44 |
| g = [7 6 5 6] | 208 | 44 |
| g = [7 6 5 7] | 144 | 44 |
| g = [7 6 6 1] | 172 | 44 |
| g = [7 6 6 2] | 204 | 44 |
| g = [7 6 6 3] | 168 | 44 |
| g = [7 6 6 6] | 328 | 44 |
| g = [7 6 7 1] | 172 | 44 |
| g = [7 6 7 2] | 236 | 44 |
| g = [7 6 7 3] | 168 | 44 |
| g = [7 6 7 7] | 372 | 44 |
| g = [7 7 1 1] | 496 | 44 |
| g = [7 7 1 2] | 336 | 44 |
| g = [7 7 1 3] | 372 | 44 |
| g = [7 7 1 4] | 336 | 44 |
| g = [7 7 1 5] | 308 | 44 |
| g = [7 7 1 6] | 308 | 44 |
| g = [7 7 1 7] | 312 | 44 |
| g = [7 7 2 1] | 336 | 44 |
| g = [7 7 2 2] | 496 | 44 |
| g = [7 7 2 3] | 372 | 44 |
| g = [7 7 2 4] | 304 | 44 |
| g = [7 7 2 5] | 276 | 44 |
| g = [7 7 2 6] | 308 | 44 |
| g = [7 7 2 7] | 344 | 44 |
| g = [7 7 3 1] | 336 | 44 |
| g = [7 7 3 2] | 336 | 44 |
| g = [7 7 3 3] | 500 | 44 |
| g = [7 7 3 4] | 304 | 44 |
| g = [7 7 3 5] | 308 | 44 |
| g = [7 7 3 6] | 340 | 44 |
| g = [7 7 3 7] | 312 | 44 |
| g = [7 7 4 1] | 400 | 44 |
| g = [7 7 4 2] | 368 | 44 |
| g = [7 7 4 3] | 372 | 44 |
| g = [7 7 4 4] | 496 | 44 |
| g = [7 7 4 5] | 276 | 44 |
| g = [7 7 4 6] | 308 | 44 |
| g = [7 7 4 7] | 312 | 44 |
| g = [7 7 5 1] | 432 | 44 |
| g = [7 7 5 2] | 400 | 44 |
| g = [7 7 5 3] | 436 | 44 |

TABLE 4-continued

| encoder | R | N + R |
|---|---|---|
| g = [7 7 5 4] | 336 | 44 |
| g = [7 7 5 5] | 692 | 44 |
| g = [7 7 5 6] | 340 | 44 |
| g = [7 7 5 7] | 408 | 44 |
| g = [7 7 6 1] | 368 | 44 |
| g = [7 7 6 2] | 368 | 44 |
| g = [7 7 6 3] | 404 | 44 |
| g = [7 7 6 4] | 304 | 44 |
| g = [7 7 6 5] | 276 | 44 |
| g = [7 7 6 6] | 500 | 44 |
| g = [7 7 6 7] | 312 | 44 |
| g = [7 7 7 1] | 368 | 44 |
| g = [7 7 7 2] | 400 | 44 |
| g = [7 7 7 3] | 372 | 44 |
| g = [7 7 7 4] | 304 | 44 |
| g = [7 7 7 5] | 308 | 44 |
| g = [7 7 7 6] | 308 | 44 |

Figure 9:
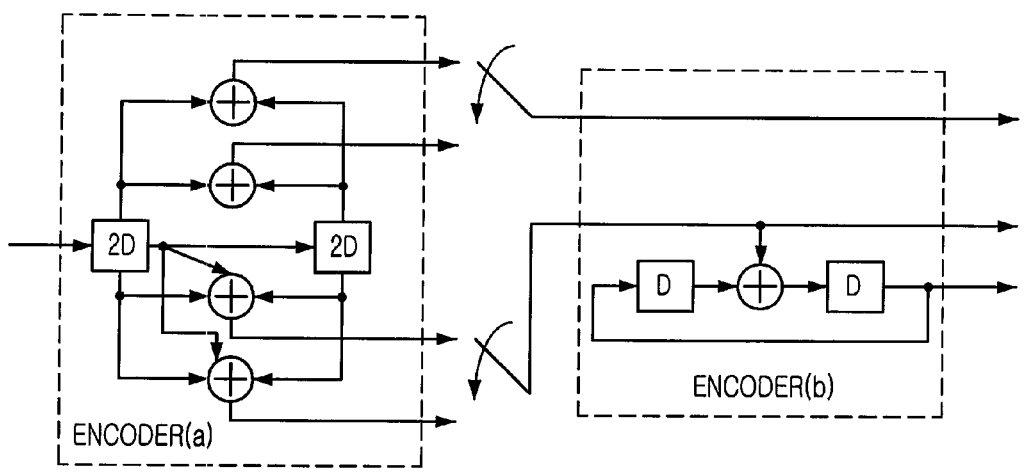
FIG. 9 is a diagram illustrating an encoder having the largest free distance, for example, 692, for a robust stream among encoder combinations described in Table 4.

FIG. 9 is a block diagram illustrating an encoder having the largest free distance for a robust stream among encoder combinations described in Table 4.

In FIG. 9, the encoder (a) is an encoder expressed as g=[5 5 7 7] by the non-feedback encoder expression method of FIG. 6, and the encoder (b) is a typical 8-VSB encoder. The encoder (a) is an example of an input/output connecting relation decided by Eq. 2 when g=[5 5 7 7]. The output of the encoder (a) is inputted to the encoder (b) with being divided into two outputs as shown in FIG. 9. Also, the encoder (b) is operated twice faster than the encoder (a). That is, the memories of the encoder (b) are operated twice faster than the memories of the encoder (a).

The above described method according to the present invention can be embodied as a program and stored on a computer readable recording medium. The computer readable recording medium is any data storage device that can store data which can be thereafter read by the computer system. The computer readable recording medium includes a read-only memory (ROM), a random-access memory (RAM), a CD-ROM, a floppy disk, a hard disk and an optical magnetic disk.

The present application contains subject matter related to Korean patent application Nos. 2005-0065396 and 2006-0052548, filed in the Korean Intellectual Property Office on Sep. 19, 2005, and Jun. 12, 2006, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A method of estimating an encoder for dual stream transmission, comprising the steps of:
   a) setting up the number of memories required for an encoder, a free distance condition for robust data, and a free distance condition for mixed stream of robust data and normal data;
   b) obtaining ½ rate encoder combinations that sustain backward compatibility with a typical trellis encoder;
   c) obtaining encoder combinations H that satisfy the free distance condition for the robust data and the free distance condition for the mixed stream from the ½ rate encoder combinations;
   d) obtaining relations between memories and input/output signals, which satisfy the encoder combinations H; and
   e) configuring an encoder according to the obtained relation between the memories and the input/output signals.

2. The method as recited in claim 1, wherein the number of memories is four.

3. The method as recited in claim 1, wherein the ½ rate encoder that sustains backward compatibility with a typical trellis encoder satisfies an equation:

$$\begin{bmatrix} st_4 \\ st_3 \\ st_2 \\ st_1 \\ ot_2 \\ ot_1 \\ ot_0 \end{bmatrix} = \begin{bmatrix} h_6^{(4)} & h_6^{(3)} & h_6^{(2)} & h_6^{(1)} & h_6^{(0)} \\ h_5^{(4)} & h_5^{(3)} & h_5^{(2)} & h_5^{(1)} & h_5^{(0)} \\ h_4^{(4)} & h_4^{(3)} & h_4^{(2)} & h_4^{(1)} & h_4^{(0)} \\ h_3^{(4)} & h_3^{(3)} & h_3^{(2)} & h_3^{(1)} & h_3^{(0)} \\ h_2^{(4)} & h_2^{(3)} & h_2^{(2)} & h_2^{(1)} & h_2^{(0)} \\ h_1^{(4)} & h_1^{(3)} & h_1^{(2)} & h_1^{(1)} & h_1^{(0)} \\ h_0^{(4)} & h_0^{(3)} & h_0^{(2)} & h_0^{(1)} & h_0^{(0)} \end{bmatrix} \begin{bmatrix} in \\ st_4 \\ st_3 \\ st_2 \\ st_1 \end{bmatrix}$$

where $st_4$, $st_3$, $st_2$, and $st_i$ denote states of memories, $ot_2$, $ot_1$ and $ot_0$ denote outputs of an encoder, in denotes an input of encoder, and $h_j$ is an octal number.

4. The method as recited in claim 3, wherein $h_4$, $h_3$, and $h_0$, are fixed as 1, 6, and 1, respectively.

5. The method as recited in claim 1, wherein the free distance condition for the robust data is larger than 164, and the free distance condition for the mixed stream is 44 to 56.

6. An encoder for dual stream transmission comprising:
   an input terminal;
   three output terminals;
   four memories connected to the input terminal and the output terminals to satisfy an equation:

$$\begin{bmatrix} st_4 \\ st_3 \\ st_2 \\ st_1 \\ ot_2 \\ ot_1 \\ ot_0 \end{bmatrix} = \begin{bmatrix} h_6^{(4)} & h_6^{(3)} & h_6^{(2)} & h_6^{(1)} & h_6^{(0)} \\ h_5^{(4)} & h_5^{(3)} & h_5^{(2)} & h_5^{(1)} & h_5^{(0)} \\ h_4^{(4)} & h_4^{(3)} & h_4^{(2)} & h_4^{(1)} & h_4^{(0)} \\ h_3^{(4)} & h_3^{(3)} & h_3^{(2)} & h_3^{(1)} & h_3^{(0)} \\ h_2^{(4)} & h_2^{(3)} & h_2^{(2)} & h_2^{(1)} & h_2^{(0)} \\ h_1^{(4)} & h_1^{(3)} & h_1^{(2)} & h_1^{(1)} & h_1^{(0)} \\ h_0^{(4)} & h_0^{(3)} & h_0^{(2)} & h_0^{(1)} & h_0^{(0)} \end{bmatrix} \begin{bmatrix} in \\ st_4 \\ st_3 \\ st_2 \\ st_1 \end{bmatrix}$$

where $st_4$, $st_3$, $st_2$, and $st_1$ denote states of memories, $ot_2$, $ot_1$ and $ot_0$ denote outputs of an encoder, in denotes an input of encoder, and $h_j$ is an octal number.

7. The encoder as recited in claim 6, wherein $h_4$, $h_3$, and $h_0$, are fixed as 1, 6, and 1, respectively.

8. The encoder as recited in claim 7, wherein the free distance condition for the robust data is larger than 164, and the free distance condition for the mixed stream is 44 to 56.

9. An encoder for dual stream transmission, comprising:
   a non-feedback convolution encoder having two memories, where a code rate thereof is ¼; and
   a trellis encoder having two memories operated twice faster than the memories of the non-feedback convolution encoder and alternatively receiving outputs of the non-feedback convolution encoder, where a code rate thereof is ⅔.

10. The encoder as recited in claim 9, wherein a free distance condition for robust data is larger than 164, and a free distance condition for mixed stream is 44 to 56.

11. The encoder as recited in claim 10, wherein the non-feedback convolution encoder is an encoder combination G satisfies an equation:

$$v^{(i)} = c * g^{(i)}$$

where * denotes a convolution operation, $g^{(i)} = (g_0^{(i)}, g_1^{(i)}, \ldots, g_v^{(i)})$, $$g^i = \sum_{k=0}^{v} g_k^{(i)},$$

and $g^i$ is expressed as an octal number, and C denotes an input bit sequence.

12. A decoder for dual stream transmission comprising:
a receiving means for converting a receiving signal to a base-band signal;
an equalizing means for deciding a symbol level of the receiving signal; and
a decoding means for decoding the decided symbol level to a data symbol,
wherein the data symbol for a symbol level and the next state are decided by an encoder combination H in which a free distance condition for robust data is larger than 164, and a free distance condition for mixed stream is 44 to 56.

13. A decoder for dual stream transmission, comprising:
a receiving means for converting a receiving signal to a base-band signal;
an equalizing means for deciding a symbol level of the receiving signal; and
a decoding means for decoding the decided symbol level to a data symbol, wherein the data symbol for a symbol level and the next state are decided by an encoder including a non-feedback convolution encoder having two memories, where a code rate thereof is ¼; and a trellis encoder having two memories operated twice faster than the memories of the non-feedback convolution encoder and alternatively receiving outputs of the non-feedback convolution encoder, where a code rate thereof is ⅔.

14. The decoder as recited in claim 13, wherein a free distance condition for robust data of the decoder is 16, and a free distance condition for mixed stream of robust data and normal data is 44.

15. A decoding method for dual stream receiving comprising the steps of:
a) converting a receiving signal to a base-band signal;
b) deciding a symbol level of the receiving signal; and
c) decoding the decided symbol level to a data symbol,
wherein the data symbol for a symbol level and the next state are decided by an encoder combination H in which a free distance condition for robust data is larger than 164, and a free distance condition for mixed stream is 44 to 56.

* * * * *